United States Patent
Matsuoka et al.

(10) Patent No.: US 10,783,933 B2
(45) Date of Patent: Sep. 22, 2020

(54) SEMICONDUCTOR MEMORY DEVICE

(71) Applicant: TOSHIBA MEMORY CORPORATION, Tokyo (JP)

(72) Inventors: Fumiyoshi Matsuoka, Kawsaki Kanagawa (JP); Katsuyuki Fujita, Nishitokyo Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/854,394

(22) Filed: Apr. 21, 2020

(65) Prior Publication Data

US 2020/0251153 A1 Aug. 6, 2020

Related U.S. Application Data

(63) Continuation of application No. 15/909,502, filed on Mar. 1, 2018.

(30) Foreign Application Priority Data

Mar. 24, 2017 (JP) .................................. 2017-060041
Aug. 24, 2017 (JP) .................................. 2017-161382

(51) Int. Cl.
*G11C 5/14* (2006.01)
*G11C 5/02* (2006.01)
(Continued)

(52) U.S. Cl.
CPC ................ *G11C 5/14* (2013.01); *G11C 5/025* (2013.01); *G11C 5/063* (2013.01); *G11C 7/02* (2013.01); *G11C 11/1653* (2013.01); *G11C 11/1673* (2013.01); *G11C 11/1693* (2013.01); *G11C 11/1697* (2013.01); *G11C 11/34* (2013.01); *G11C 27/024* (2013.01); *G11C 2207/105* (2013.01)

(58) Field of Classification Search
CPC .......... G11C 5/14; G11C 5/025; G11C 11/34; G11C 5/063; G11C 7/02; G11C 11/1653; G11C 11/1673; G11C 11/1693; G11C 11/1697
See application file for complete search history.

(56) References Cited

U.S. PATENT DOCUMENTS 5,896,310 A 4/1999 Kawamura et al.
6,459,639 B2 10/2002 Nishimura
(Continued)

FOREIGN PATENT DOCUMENTS

JP 2010033631 A 2/2010
JP 2010123209 A 6/2010
(Continued)

*Primary Examiner* — Tri M Hoang
(74) *Attorney, Agent, or Firm* — Kim & Stewart LLP

(57) ABSTRACT

A semiconductor memory device includes a power source pad, a first bank including a plurality of memory cells, a second bank including a plurality of memory cells, the first bank being sandwiched between the power source pad and the second bank, first power supply lines connected to the power source pad and supplying power to the first bank and not to the second bank, and second power supply lines connected to the power source pad, passing over the first bank, and supplying power to the second bank and not to the first bank.

20 Claims, 40 Drawing Sheets

(51) Int. Cl.
*G11C 11/34* (2006.01)
*G11C 5/06* (2006.01)
*G11C 7/02* (2006.01)
*G11C 11/16* (2006.01)
G11C 27/02 (2006.01)

(56) References Cited

U.S. PATENT DOCUMENTS

| | | |
|---|---|---|
| 6,721,231 B2 | 4/2004 | Tomohiro |
| 7,499,363 B2 | 3/2009 | Kim et al. |
| 7,848,170 B2 | 12/2010 | Sugiura |
| 8,228,745 B2 | 7/2012 | Patil et al. |
| 8,605,494 B2 | 12/2013 | Sato et al. |
| 9,583,209 B1 | 2/2017 | Roy et al. |
| 2003/0123315 A1 | 7/2003 | Tomohiro |
| 2007/0247951 A1 | 10/2007 | Kim et al. |
| 2011/0002177 A1 | 1/2011 | Furuyama et al. |
| 2015/0036416 A1 | 2/2015 | Kim |
| 2016/0064059 A1* | 3/2016 | Takahashi ........... G11C 13/0069 365/158 |
| 2016/0379708 A1* | 12/2016 | Katayama ........... G11C 11/1675 365/148 |
| 2017/0069380 A1* | 3/2017 | Takahashi ........... G11C 11/1675 |

FOREIGN PATENT DOCUMENTS

| | | |
|---|---|---|
| JP | 5363644 B2 | 12/2013 |
| JP | 2014120194 A | 6/2014 |
| WO | 2011101947 A1 | 8/2011 |

\* cited by examiner

SEMICONDUCTOR MEMORY DEVICE

CROSS-REFERENCE TO RELATED APPLICATION

This application is a continuation of U.S. patent application Ser. No. 15/909,502, filed on Mar. 1, 2018, which is based upon and claims the benefit of priority from Japanese Patent Application No. 2017-060041, filed Mar. 24, 2017, and Japanese Patent Application No. 2017-161382, filed Aug. 24, 2017, the entire contents of each of which are incorporated herein by reference.

FIELD

Embodiments described herein relate generally to a semiconductor memory device.

BACKGROUND

A magnetic random access memory (MRAM) is a memory device in which a magnetic element having magnetoresistive effect is used in a memory cell storing information and is gaining attention as a next-generation memory device having characteristics of high-speed operation, a large capacity, and non-volatility. Research and development in terms of replacing a volatile memory such as the DRAM and the SRAM with the MRAM is progressing. In this case, causing the MRAM to be operated by the same specifications as those of the DRAM and the SRAM is desirable for reducing development cost and allowing replacement of the DRAM and the SRAM to be performed smoothly.

DETAILED DESCRIPTION

Figure 1:
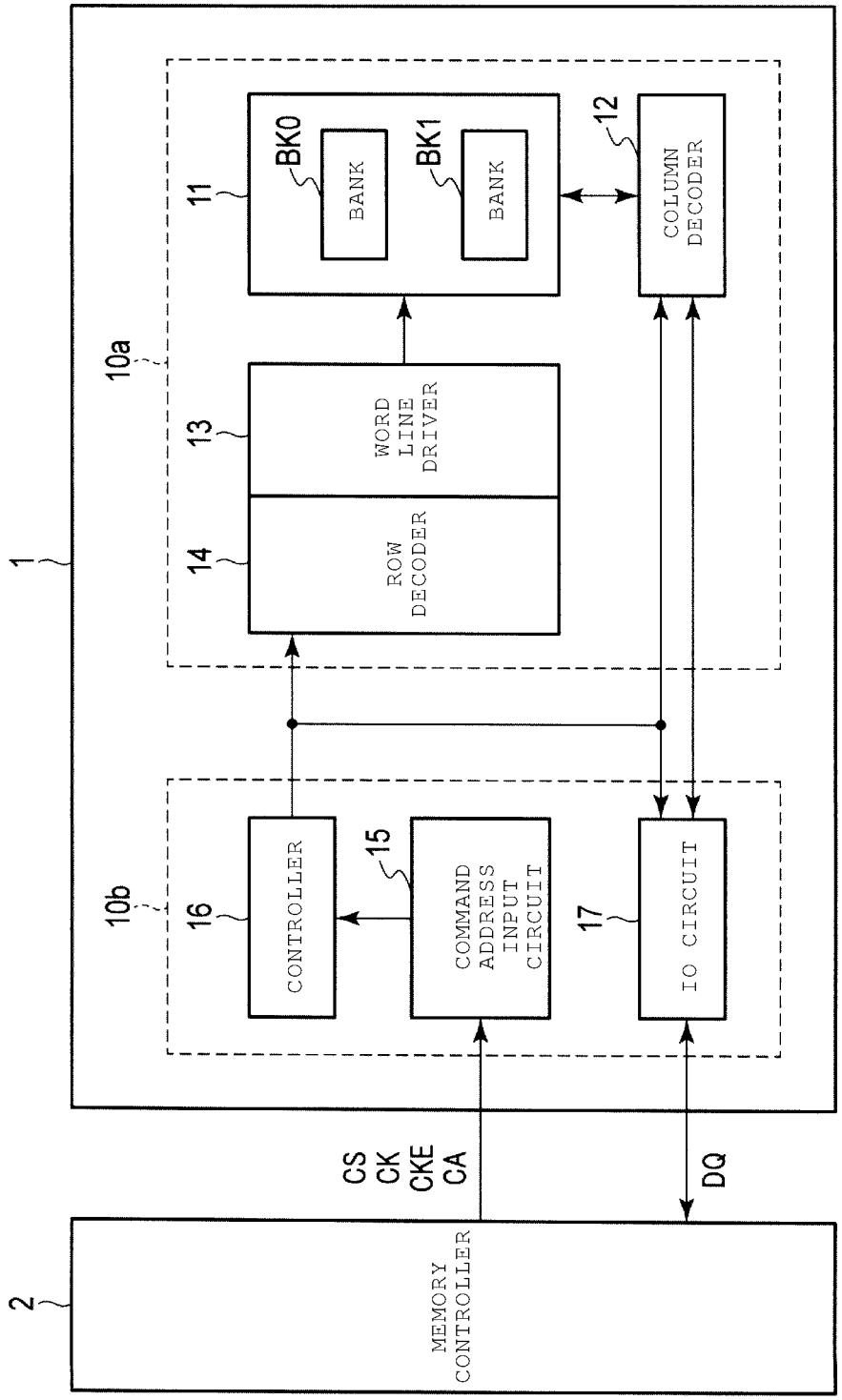
FIG. 1 is a block diagram illustrating a semiconductor memory device according to a first embodiment.

In general, according to one embodiment, a semiconductor memory device includes a power source pad, a first bank that includes a plurality of memory cells, a second bank that includes a plurality of memory cells, wherein the first bank is between the power source pad and the second bank, first power supply lines that are connected to the power source pad and supply power to the first bank and not to the second bank, and second power supply lines that are connected to the power source pad, pass over the first bank, and supply power to the second bank and not to the first bank.

In the following, description will be made of embodiments with reference to the drawings. In the following description, elements having substantially the same function and configuration are assigned the same reference numerals. The "_number" after the reference numeral is used for distinguishing elements having the same function and configuration from each other. In a case where there is no need to distinguish elements, these elements are referenced by the reference numeral without the suffix "_number". For example, in a case where there is no need to distinguish elements 10_1 and 10_2, these elements are collectively referenced as element 10.

The drawings are schematic and it is to be noted that a relationship between a thickness and plane dimension, a ratio of thickness of each layer, and the like are different from actual ones. Accordingly, a specific thickness or dimension should be determined after taking into account the following description. Also, the dimension relationship and ratios in the drawings may be different in different figures.

In the present specification, for convenience of explanation, an XYZ orthogonal coordinate system is introduced. In the coordinate system, two directions parallel to an upper surface of a semiconductor substrate and perpendicular to each other are set as the X-direction (D1) and the Y-direction (D2), and a direction perpendicular to both of the X-direction and the Y-direction, that is, a stacking direction of respective layers is set as the Z-direction (D3).

1 First Embodiment 1-1 Configuration 1-1-1 Semiconductor Memory Device

First, a basic configuration of a semiconductor memory device according to a first embodiment will be schematically described using FIG. 1.

A semiconductor memory device 1 according to the first embodiment includes a core circuit 10a and a peripheral circuit 10b.

The core circuit 10a includes a memory area 11, a column decoder 12, a word line driver 13, and a row decoder 14. The memory area 11 includes a plurality of banks BK (two banks of BK0 and BK1 in the example of FIG. 1). In one example, the banks BK0 and BK1 are capable of being independently activated. Also, in a case where the banks BK0 and BK1 are not distinguished from each other, they are simply referred to as bank BK. Details of the bank BK will be described later.

The column decoder 12 recognizes a command or an address by a command address signal CA and controls selection of a bit line BL and a source line SL based on an external control signal.

The word line driver 13 is disposed on at least one side of the bank BK. The word line driver 13 is configured to apply a voltage to a selected word line WL through a main word line MWL at the time of data read or data write.

The row decoder 14 decodes an address of the command address signal CA supplied from the command address input circuit 15. More specifically, the row decoder 14 supplies the decoded row address to the word line driver 13. With this, the word line driver 13 can apply a voltage to the selected word line WL.

The peripheral circuit 10b includes the command address input circuit 15, a controller 16, and an IO circuit 17.

Various external control signals, for example, a chip select signal CS, the clock signal CK, a clock enable signal CKE, a command address signal CA, and the like are input to the command address input circuit 15 from a memory controller (also referred to herein as a host device) 2. The command address input circuit 15 transfers the command address signal CA to the controller 16.

The controller 16 identifies the command and the address. The controller 16 controls the semiconductor memory device 1.

The IO circuit 17 temporarily stores input data input from a memory controller 2 through a data line DQ or output data read from a selected bank onto the data line DQ. The input data is written into a memory cell of the selected bank.

1-1-2 Bank BK

A basic configuration of a bank BK of the semiconductor memory device according to the first embodiment will be described using FIG. 2.

The bank BK includes a memory array 20a, a sense amplifier/write driver (SA/WD) 20b, and a page buffer 20c.

The memory array 20a is configured in such a way that a plurality of memory cells MC are arranged in a matrix pattern. In the memory array 20a, a plurality of word lines WL0 to WLi−1 (i is an integer of 2 or more), a plurality of bit lines BL0 to BLj−1 (j is an integer of 2 or more), and a plurality of source lines SL0 to SLj−1 are provided. One row of the memory array 20a is connected to a single word line WL and one column of the memory array 20a is connected to a pair of lines that include one bit line BL and one source line SL.

The memory cell MC is configured with a magnetic tunnel junction (MTJ) element 30 and a selection transistor 31. The selection transistor 31 is an N-channel MOSFET.

One end of the MTJ element 30 is connected to the bit line BL and the other end thereof is connected to the drain of the selection transistor 31. The gate of the selection transistor 31 is connected to the word line WL and the source thereof is connected to the source line SL.

The sense amplifier/write driver 20b is disposed in a bit line direction of the memory array 20a. The sense amplifier/write driver 20b includes a sense amplifier and a write driver. The sense amplifier/write driver 20b detects the current flowing in the memory cell MC that is connected to the bit line BL through a global bit line GBL and to a selected word line WL through a main word line MWL, to read data stored in the memory cell. The write driver causes the current to flow in the memory cell MC that is connected to the bit line BL through the global bit line GBL, to the source line SL through the global source line GSL and to the selected word line WL through the main word line MWL, to allow data to be written. The sense amplifier/write driver 20b controls the bit line BL and the source line SL based on a control signal from the controller 16. Data transfer between the sense amplifier/write driver 20b and the data line DQ is performed through the IO circuit 17.

The page buffer 20c temporarily holds data read from the memory array 20a or write data received from memory controller 2. Writing of data into the memory array 20a is performed in units of a plurality of memory cells known as a "page". As such, the unit of writing into the memory array 20a is a page. The page buffer 20c according to the first embodiment is provided for each bank BK and has a storage capacity enough to temporarily store data of all pages of the bank BK.

Also, the configuration of the bank BK described above is an example and the bank BK may adopt other configurations.

1-1-3 Memory Cell MC

Figure 3:
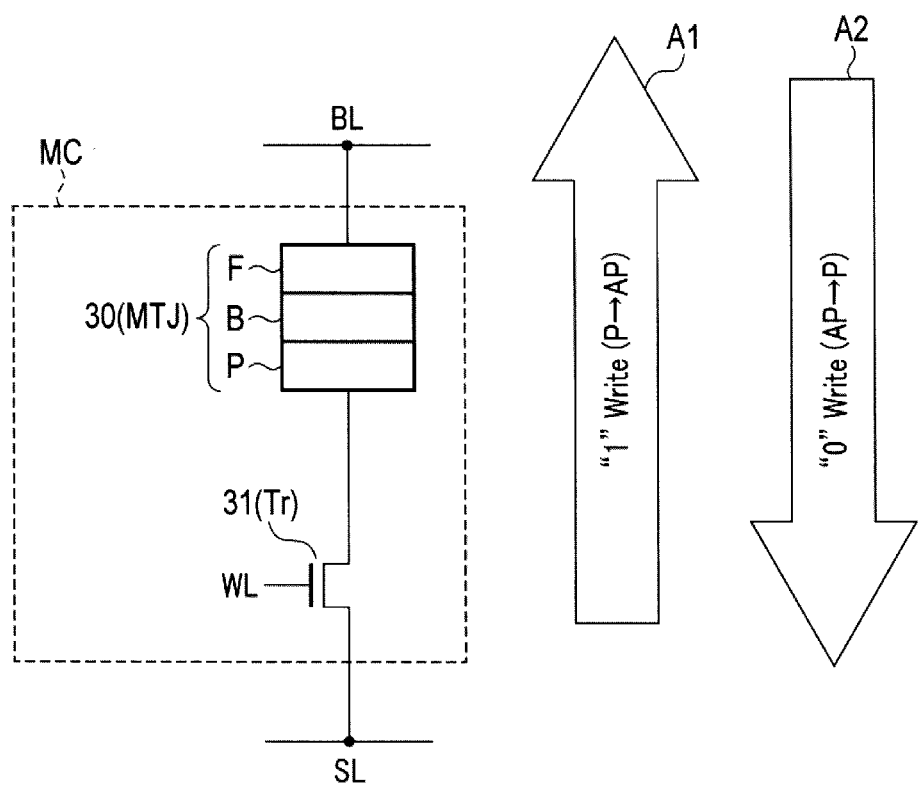
FIG. 3 is a block diagram illustrating a memory cell MC of the semiconductor memory device according to the first embodiment.

Next, a configuration of a memory cell MC of the semiconductor memory device according to the first embodiment will be schematically described using FIG. 3. As illustrated in FIG. 3, one end of the MTJ element 30 of the memory cell MC according to the first embodiment is connected to the bit line BL and the other end thereof is connected to one end of the selection transistor 31. The other end of the selection transistor 31 is connected to the source line SL. The MTJ element 30 that employs the tunneling magnetoresistive (TMR) effect has a stacked structure including two ferromagnetic layers F and P and a nonmagnetic layer (e.g., tunnel insulating film) B sandwiched between the ferromagnetic layers, and stores digital data by magnetoresistance change due to spin-polarized tunneling effects. The MTJ element 30 can take a low resistance state and a high resistance state by magnetization alignment of two ferromagnetic layers F and P. For example, when the low resistance state is defined as data "0" and the high resistance state is defined as data "1", 1-bit data can be recorded in the MTJ element 30. Alternatively, the low resistance state may be defined as data "1" and the high resistance state may be defined as data "0".

For example, the MTJ element 30 is formed by sequentially stacking a fixed layer (also referred to as a pinning layer) P, a tunnel barrier layer B, and a recording layer (also referred to as a free layer) F. The pinning layer P and the free layer F are formed of the ferromagnetic materials and the tunnel barrier layer B is an insulating film (for example, $Al_2O_3$, MgO). The pinning layer P is a layer of which a magnetization alignment direction is fixed, and the magnetization alignment direction of the free layer F is variable and data is stored depending on the direction of magnetization alignment direction of the free layer F.

When the current is made to flow in the direction of the arrow A1 at the time of write, the direction of magnetization of the free layer F becomes anti-parallel with respect to the direction of magnetization of the pinning layer P and MTJ element 30 goes into a high resistance state (data "1"). When the current is made to flow in the direction of the arrow A2 at the time of write, the directions of magnetization of the pinning layer P and the free layer F become parallel, and MTJ element 30 goes into a low resistance state (data "0"). As such, the MTJ element 30 is able to write different pieces of data by the direction in which the current flows.

1-1-4 Sense Amplifier/Write Driver

A sense amplifier/write driver 20b of the semiconductor memory device according to the first embodiment will be described using FIG. 4.

Figure 4:
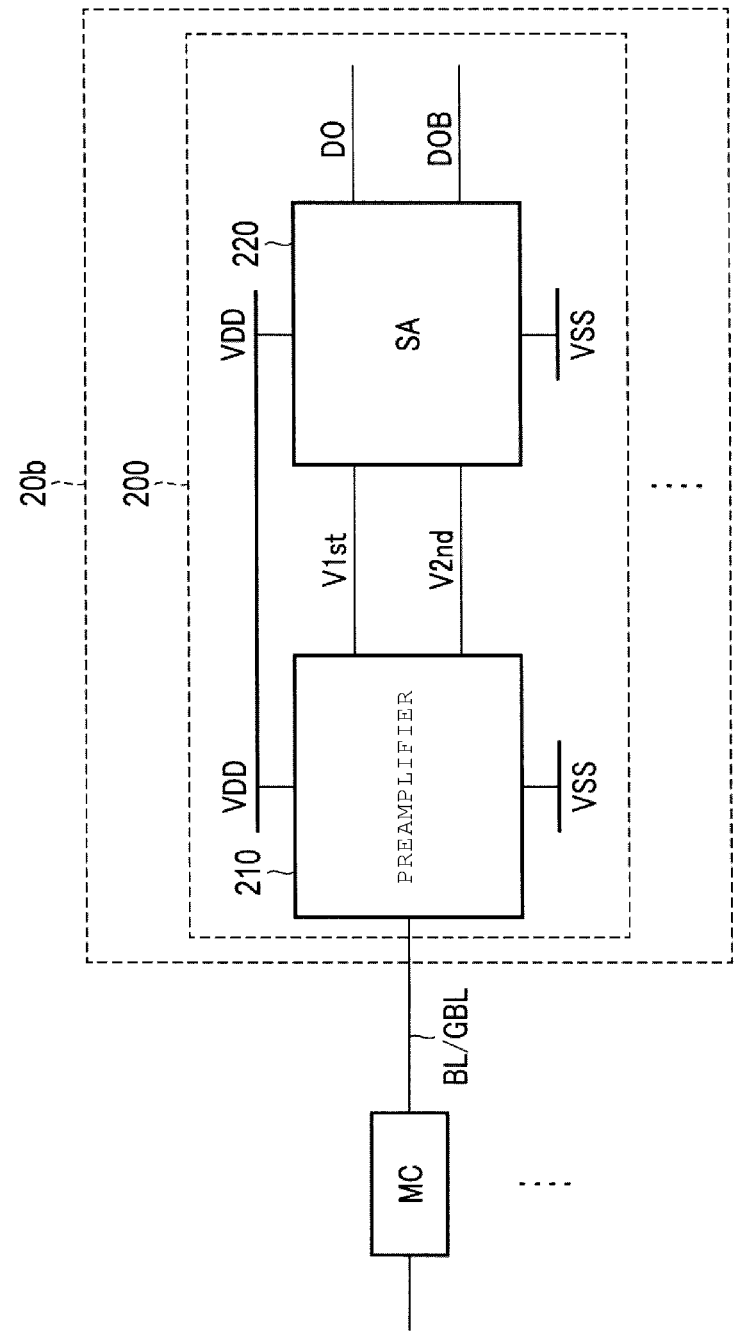
FIG. 4 is a block diagram illustrating a sense circuit of the semiconductor memory device according to the first embodiment.

As illustrated in FIG. 4, the sense amplifier/write driver 20b includes a plurality of sense circuits 200. The plurality of sense circuits 200 are provided for each global bit line. Each of the plurality of sense circuits 200 includes a pre-amplifier 210 and a sense amplifier (SA) 220.

The pre-amplifier 210 supplies the cell current to the memory cell MC through the global bit line and the bit line and generates voltages V1st and V2nd based on the cell current.

The sense amplifier 220 determines data (DO, DOB) based on the voltages V1st and V2nd generated by the pre-amplifier 210.

The pre-amplifier 210 and the sense amplifier 220 operate based on voltages VDD and VSS applied through a pad (not illustrated).

A further specific example of the sense amplifier/write driver 20b of the semiconductor memory device according to the first embodiment will be described using FIG. 5. A configuration of the sense amplifier/write driver 20b is not limited to that of FIG. 5.

Figure 5:
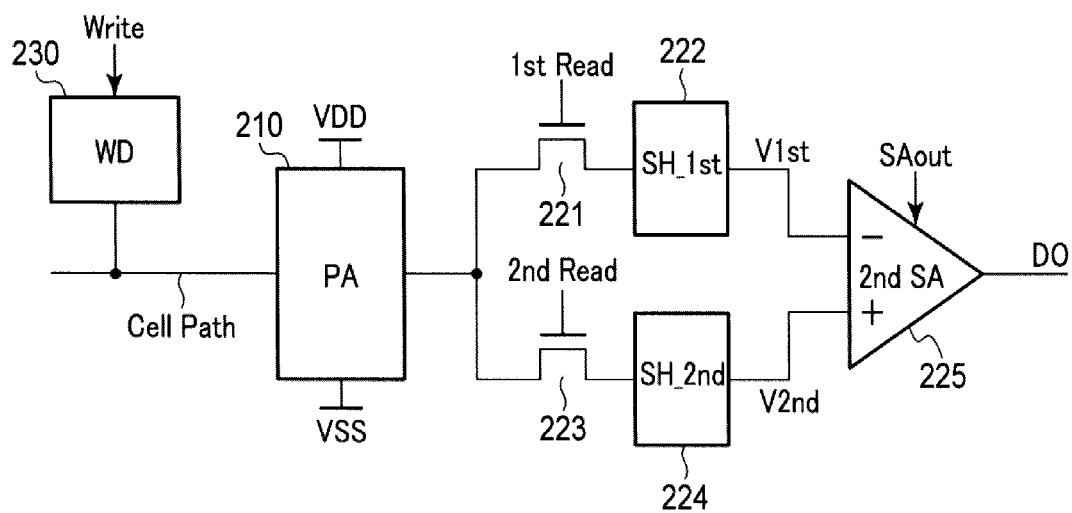
FIG. 5 is another block diagram illustrating the sense circuit of the semiconductor memory device according to the first embodiment.

As illustrated in FIG. 5, in the sense amplifier/write driver 20b, a write driver (WD) 230 is connected to the bit line and the source line (which are denoted as "Cell Path").

The sense circuit 200 includes, for example, transistors 221 and 223, a first sample and hold circuit 222, a second sample and hold circuit 224, and a sense amplifier 225. The sense amplifier 220 of FIG. 4 corresponds to the sense amplifier 225.

The first sample and hold circuit 222 holds the voltage acquired by the pre-amplifier 210 at the time of a first read operation (details will be described later).

The second sample and hold circuit 224 holds the voltage acquired by the pre-amplifier 210 at the time of a second read operation (details will be described later).

The sense amplifier 225 outputs data DO based on an output voltage V1st from the first sample and hold circuit 222 and an output voltage V2nd from the first sample and hold circuit 224. As will be described later, the sense amplifier 225 determines data based on the first read operation and the second read operation. In a case where data of "0" is read at the time of the first read operation and also in a case where data of "0" is read at the time of the second read operation, the sense amplifier 225 performs the determination by providing an offset in determining data so that data of "0" can be correctly determined.

1-1-5 Layout 1-1-5-1 Wiring Layout

A power source wiring layout of the semiconductor memory device according to the first embodiment will be described using FIG. 6. Here, for simplicity, the pad for supplying the voltage VDD, the wiring for supplying the voltage VDD, the memory array 20a, and the sense amplifier/write driver 20b are only illustrated.

Figure 6:
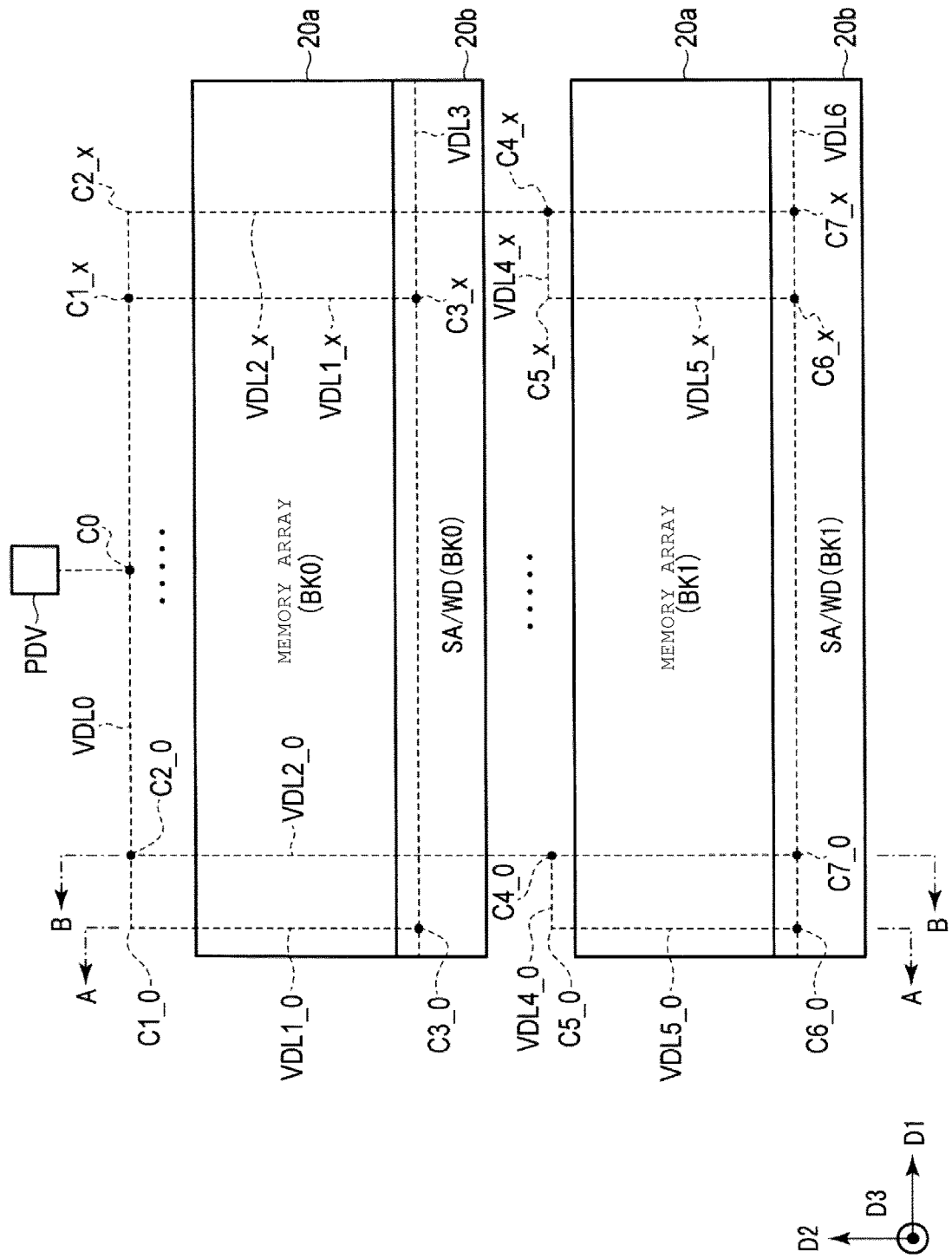
FIG. 6 is a layout diagram illustrating wiring of power source lines of the semiconductor memory device according to the first embodiment.

As illustrated in FIG. 6, a bank BK0 is provided so as to be adjacent in the D2 direction to the power source pad PDV that supplies the voltage VDD. The bank BK0 is sandwiched between the power source pad PDV and the bank BK1 in the D2 direction. That is, the bank BK0 is provided in the vicinity of the power source pad PDV and the bank BK1 is provided far away from the power source pad PDV.

The power source pad PDV supplies the voltage VDD to the sense amplifier/write driver 20b through the power source wiring VDL.

The power source wiring VDL connected to the sense amplifier/write driver 20b of the bank BK0 will be described.

The power source pad PDV is connected to a power source wiring VDL0 through a contact C0.

The power source wiring VDL0 extends in the D1 direction. The power source wiring VDL0 is connected to power source wirings VDL1_0 to VDL1_x through contacts C1_0 to C1_x (x is an integer).

The power source wirings VDL1_0 to VDL1_x extend in the D2 direction. The power source wirings VDL1_0 to VDL1_x are connected to the power source wiring VDL3 through the contacts C3_0 to C3_x.

The power source wiring VDL3 extends in the D1 direction. The power source wiring VDL3 is connected to the sense amplifier/write driver 20b of the bank BK0 through a contact (not illustrated).

The power source wiring VDL connected to the sense amplifier/write driver 20b of the bank BK1 will be described.

The power source wiring VDL0 is connected to respective power source wirings VDL2_0 to VDL2_x through respective contacts C2_0 to C2_x.

The power source wirings VDL2_0 to VDL2_x extend in the D2 direction so as to be connected to the sense amplifier/write driver 20b of the bank BK1 without being connected to the bank BK0. The power source wirings VDL2_0 to VDL2_x are connected to the power source wiring VDL6 through contacts C7_0 to C7_x.

The power source wiring VDL6 extends in the D1 direction. The power source wiring VDL6 is connected to the sense amplifier/write driver 20b of the bank BK1 through a contact (not illustrated).

The power source wirings VDL2_0 to VDL2_x are connected to power source wirings VDL4_0 to VDL4_x through contacts C4_0 to C4_x, respectively.

The power source wirings VDL4_0 to VDL4_x extend in the D1 direction. The power source wirings VDL4_0 to VDL4_x are connected to power source wirings VDL5_0 to VDL5_x through contacts C5_0 to C5_x, respectively.

The power source wirings VDL5_0 to VDL5_x extend in the D2 direction. The power source wirings VDL5_0 to VDL5_x are connected to a power source wiring VDL6 through contacts C6_0 to C6_x, respectively.

1-1-5-2 Cross-Section Taken Along A-A

Cross-section taken along A-A of FIG. 6 will be described using FIG. 7. Here, for simplicity, the insulating layer covering respective wirings is not illustrated. Elements depicted in FIG. 7 that are obscured by objects in the cross-section taken along A-A of FIG. 6, are illustrated by a broken line.

First, the memory array 20a of the block BK0 will be described. As described above, the memory array 20a of the block BK0 includes a plurality of memory cells. Here, for simplicity, only a single memory cell provided in the memory array 20a of the block BK0 is illustrated.

Specifically, impurity regions 101a and 101b are provided in a surface region of the semiconductor substrate 100a. A channel region is provided between a region sandwiched between the surface region of the semiconductor substrate 100a and the impurity regions 101a and 101b. An insulating film 102 is provided above the channel region and a control gate electrode 103 (word line WL) is provided above the insulating film 102. As such, the selection transistor 31 is configured with the impurity regions 101a and 101b, the channel region, the insulating film 102, and the control gate electrode 103.

A layer in which the word line WL is provided is denoted as a first wiring layer (1st ML).

A contact 104 made of a conductor is provided on the impurity region 101a and the MTJ element 30 is provided on the contact 104. A contact 105 made of a conductor is provided on the MTJ element 30 and a wiring layer 106 (bit line BL) made of a conductor and extending in the D2 direction is provided on the contact 105. A contact 107 made of a conductor is provided on the impurity region 101b and a wiring layer (source line SL) made of a conductor and extending in the D2 direction is provided on the contact 107. As such, the memory cell MC is configured with the selection transistor 31, the contact 104, the MTJ element 30, the contact 105, and the contact 107.

A layer in which the bit line BL and the source line SL is provided is denoted by a second wiring layer (2nd ML). The second wiring layer is located at a position higher than the first wiring layer in the D3 direction.

Above the wiring layer 106, the wiring layer 108 (main word line MWL) extending in the direction D1 is provided.

A layer in which the main word line MWL is provided is denoted by a third wiring layer (3rd ML). The third wiring layer is located at a position higher than the second wiring layer in the D3 direction.

Here, for simplicity, description is given for a single memory cell MC. However, the plurality of memory cells MC as described above are provided in the memory array 20a of the block BK0.

Subsequently, the sense amplifier/write driver 20b of the block BK0 will be described. Here, for simplicity, a single transistor provided in the sense amplifier/write driver 20b of the block BK0 is illustrated.

Specifically, impurity regions 101c and 101d are provided in surface region of the semiconductor substrate 100a. A channel region is provided between a region sandwiched between the surface region of the semiconductor substrate 100a and the impurity regions 101c and 101d. An insulating film 109 is provided on the channel region and a control gate electrode 110 is provided on the insulating film 109. As such, the transistor is configured with the impurity regions 101c and 101d, the channel region, the insulating film 109, and the control gate electrode 110.

A contact 111 made of a conductor is provided on the impurity region 101c. A wiring layer 112 made of a conductor is provided on the contact 111. The wiring layer 112 is located at the second wiring layer. A contact 113 made of a conductor is provided on the wiring layer 112 and a wiring layer 114 made of a conductor is provided on the contact 113. The wiring layer 114 is located at the third wiring layer. A contact 115 made of a conductor is provided on a wiring layer 114 and a wiring layer 116 (power source wiring VDL1) made of a conductor and extend in the D2 direction is provided on the contact 115.

A layer in which a power source wiring VDL1 is provided is denoted as a fourth wiring layer (4th ML). The fourth wiring layer is located at a position higher than the third wiring layer in the D3 direction.

In the above-description, description was made on the memory array 20a and the sense amplifier/write driver 20b of the block BK0.

A similar configuration may also be adopted for the memory array 20a and the sense amplifier/write driver 20b of the block BK1.

In the above-description, when the semiconductor substrate 100a is replaced with the semiconductor substrate 100b and the power source wiring VDL1 is replaced with the power source wiring VDL5, the above-description applies to that for the memory array 20a and the sense amplifier/write driver 20b of the block BK1.

Figure 7:
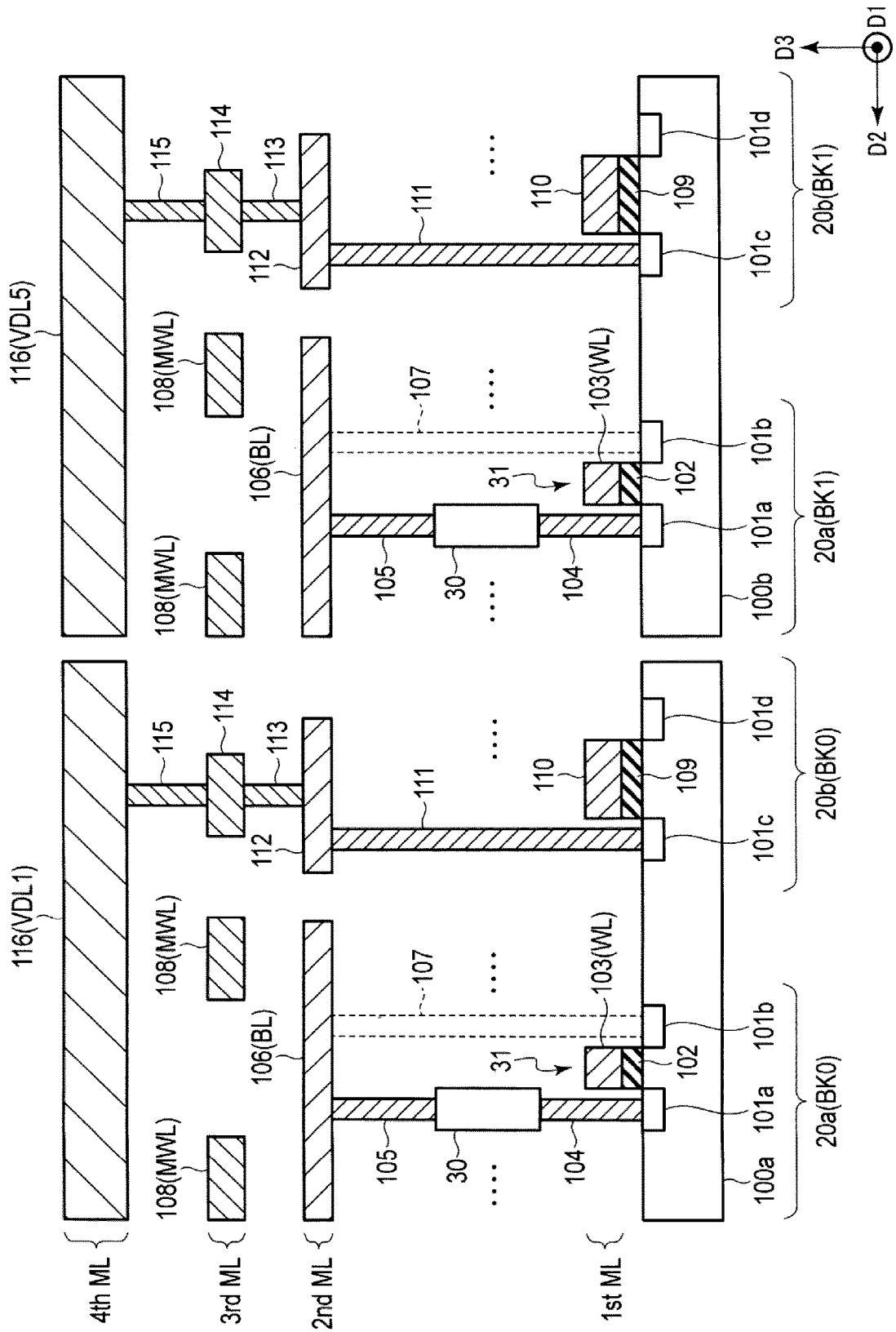
FIG. 7 is a cross-sectional view taken along the A-A line of FIG. 6.

As illustrated in FIG. 6 and FIG. 7, the power source wiring VDL1 and the power source wiring VDL5 are electrically connected to each other in the power source wiring VDL0, but are not directly connected to each other.

1-1-5-3 Cross-Section Taken Along B-B

Cross-section taken along B-B of FIG. 6 will be described using FIG. 8. Here, for simplicity, the insulating layer covering respective wirings is not illustrated. Elements depicted in FIG. 8 that are obscured by objects in the cross-section taken along B-B of FIG. 6, are illustrated by a broken line.

Basic description of the block BK0 and the block BK1 is similar to that described in conjunction with FIG. 7. A difference between FIG. 7 and FIG. 8 is that the power source wiring VDL2 passes over the block BK0, but is not directly connected to the block BK0.

Figure 8:
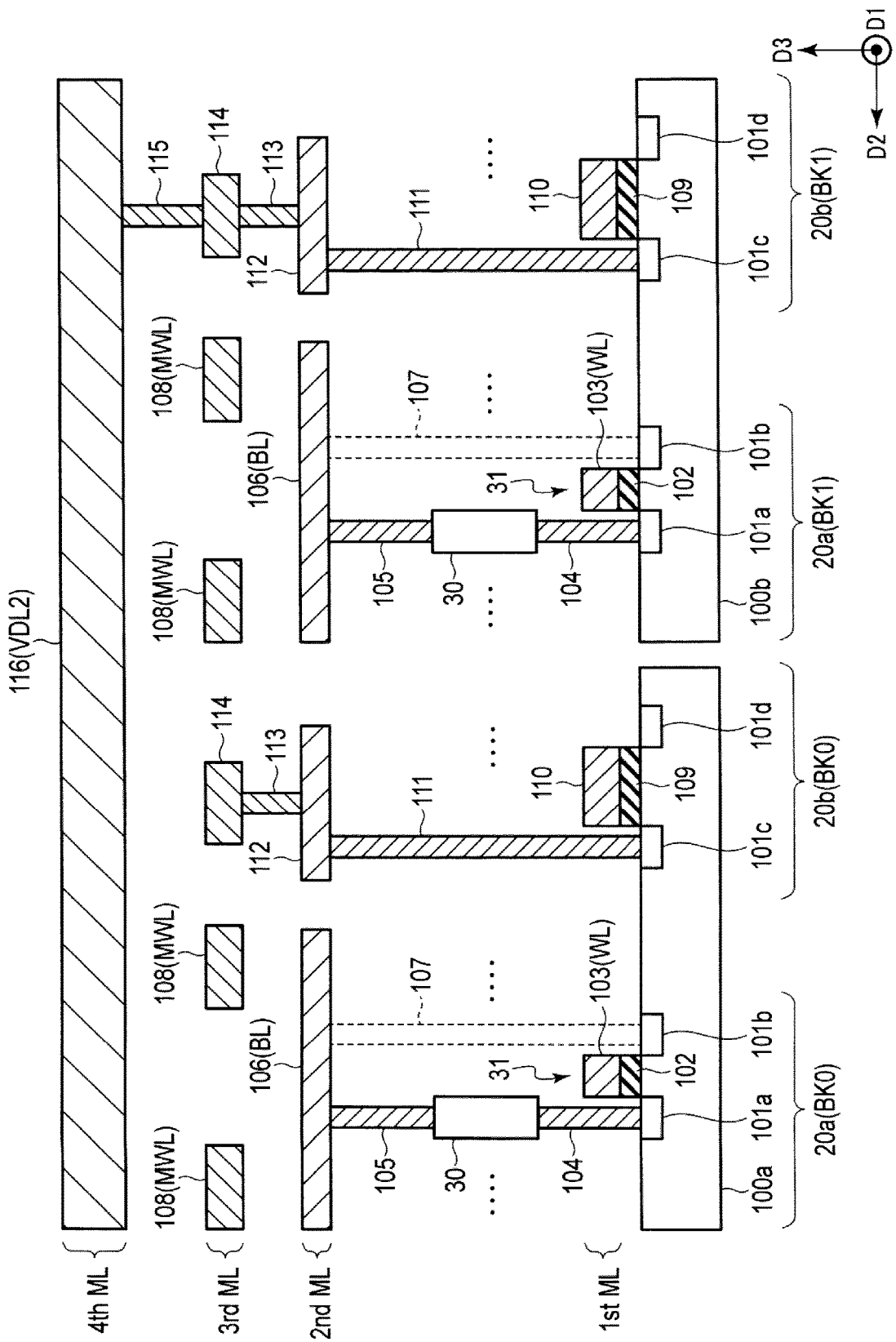
FIG. 8 is a cross-sectional view taken along the B-B line of FIG. 6.

As illustrated in FIG. 6 to FIG. 8, the power source wiring connected to the bank BK0 and the power source wiring connected to the bank BK1 are connected in the vicinity of the power source pad PDV. For that reason, the noise generated in the sense amplifier/write driver 20b of the bank BK0 is absorbed by the power source pad PDV and does not influence on the sense amplifier/write driver 20b of the bank BK1. Similarly, the noise generated in the sense amplifier/write driver 20b of the bank BK1 is absorbed by the power source pad PDV and does not influence on the sense amplifier/write driver 20b of the bank BK0.

A distance from the bank BK1 to the power source pad PDV is longer compared to that from the bank BK0 thereto. For that reason, the number of the power source wirings connected to the bank BK1 is twice the number of the power source wirings connected to the bank BK0 so that the voltage supplied to the bank BK1 is not lower than the voltage supplied to the bank BK0. In the first embodiment, for simplicity, the number of the power source wirings connected to the bank BK1 is set to twice the number of the power source wirings connected to the bank BK0. However, a configuration in which the number of power source wirings connected to the bank BK1 is greater by any amount than the number of power source wirings connected to the bank BK0 may be employed.

1-2 Operation

As described above, the MTJ element of the semiconductor memory device according to the first embodiment stores data using change in a resistance value. In a case where information stored in such a MTJ element is read, the semiconductor memory device causes a read current (also denoted by a cell current) to flow to the MTJ element. The semiconductor memory device converts a resistance value of the MTJ element into a current value or a voltage value and compares the converted voltage or current value with a reference value so as to make it possible to determine a resistance state.

However, when variation in resistance of the MTJ element is increased, there is a possibility that intervals of resistance value distributions of "0" state and "1" state are made narrower. For that reason, in a read method in which a reference value is set between the resistance value distributions and a state of the MTJ element is determined based on magnitude with respect to the reference value, a read margin is remarkably reduced.

Here, with respect to such an event, as a read method, there is a self-reference read method in which its own data is rewritten to generate a reference signal and data read is performed based on the generated signal.

In the following embodiment, in a case where the self-reference read method is used as a read method, a read operation of the semiconductor memory device will be described.

1-2-1 Outline of Read Operation

Figure 9:
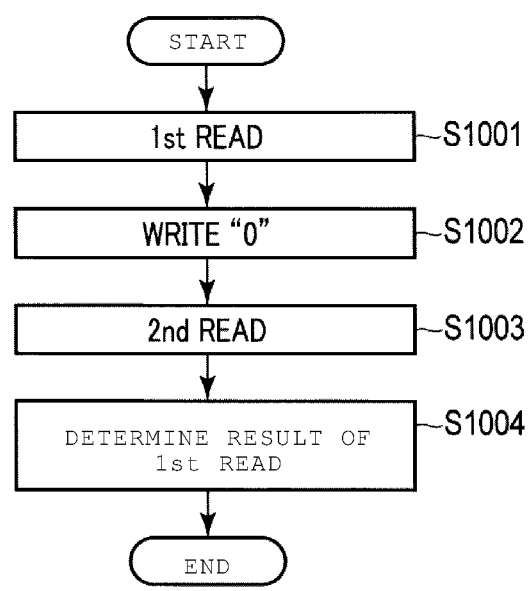
FIG. 9 is a flowchart illustrating a read operation of the semiconductor memory device according to the first embodiment.

An outline of a read operation of a memory system according to the first embodiment will be described using FIG. 9. In the present description, FIG. 4 and FIG. 5 will be referenced.

[Step S1001]

The memory controller 2 issues an activate command and a read command to the semiconductor memory device 1.

When the activate command and the read command are received from the memory controller 2, the semiconductor memory device 1 performs a first read operation (1st READ) on a read target memory cell. The sense circuit 200 stores a resistance state of the read target memory cell, by the first read operation, as voltage information (signal voltage) V1st.

[Step S1002]

The semiconductor memory device 1 performs a write operation of "0" (WRITE "0") on the memory cell which is a target of the first read operation. With this, the memory cell which is the target of the first read operation is overwritten by data of "0". This operation generates V2nd, which will be described later, and thus the memory cell is set to a reference state (here, "0"). That is, the write operation may be described as a referencing operation.

[Step S1003]

The semiconductor memory device 1 performs a second read operation (2nd READ) on the memory cell which is the target of the first read operation. The sense circuit 200 generates signal voltage V2nd by the second read operation.

[Step S1004]

The sense circuit 200 determines a result of the V1st generated by Step S1001 based on the V2nd generated by Step S1003. Specifically, the sense circuit 200 compares the V1st and the V2nd to determine data stored in the memory cell.

After data stored in the memory cell is determined, the controller 16 writes back data to the memory cell. With this, it is possible to restore data stored in the memory cell from the beginning in the memory cell.

1-2-2 Waveform of Voltage

Waveforms of the voltage at the time of the read operation will be described using FIG. 10.

Figure 10:
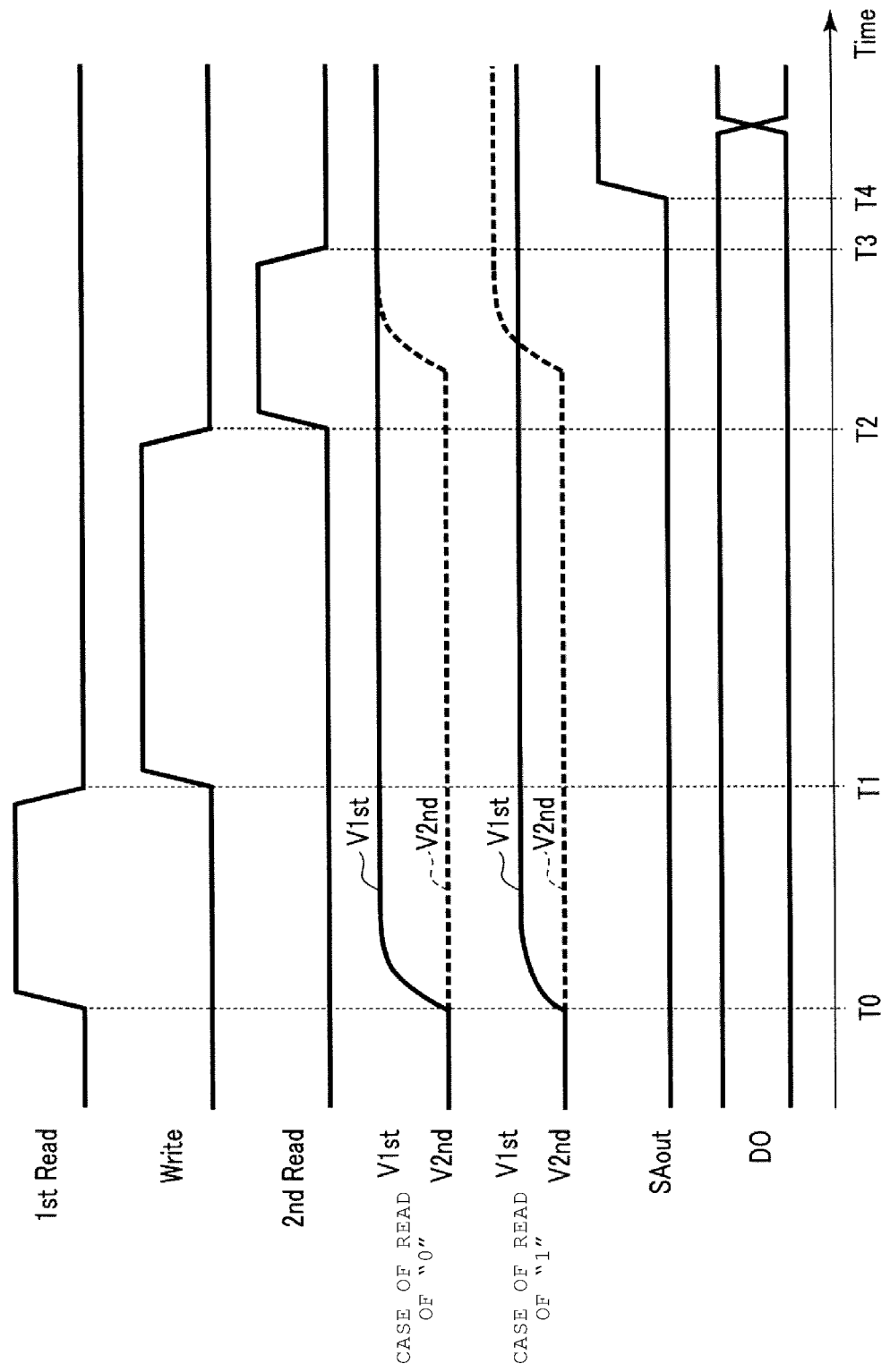
FIG. 10 is a waveform diagram illustrating a voltage waveform at the time of the read operation of the semiconductor memory device according to the first embodiment.

As illustrated in FIG. 10, in the semiconductor memory device 1, when the first read operation is performed, the first read result is stored in the first sample and hold circuit 222 and the voltage of V1st is raised (time T0 to time T1).

The semiconductor memory device 1 performs the write operation of "0" after the first read operation (time T1 to time T2).

In the semiconductor memory device 1, a second read result is stored in the second sample and hold circuit 224 and the voltage of V2nd is raised (time T2 to time T3).

The sense amplifier 225 performs determination of data based on the voltages V1st and V2nd (time T4).

As described above, data is determined by performing the read operation twice in the read operation of the memory system according to the first embodiment.

1-3 Effect

According to the embodiment described above, the power source wiring connected to the bank BK0 and the power source wiring connected to the bank BK1 are connected in the vicinity of the power source pad PDV. For that reason, the noise generated in the sense amplifier/write driver 20b of the bank BK0 or the bank BK1 is absorbed by the power source pad PDV and does not influence on the sense amplifier/write driver 20b of another bank BK.

Here, the comparative example will be described in order to make it easy to understand the effect of the first embodiment.

A power source wiring layout of a semiconductor memory device according to a comparative example will be described using FIG. 11. Here, for simplicity, the pad for supplying the voltage VDD, the wiring for supplying the voltage VDD, the memory array, and the sense amplifier/write driver 20b are only illustrated.

Figure 11:
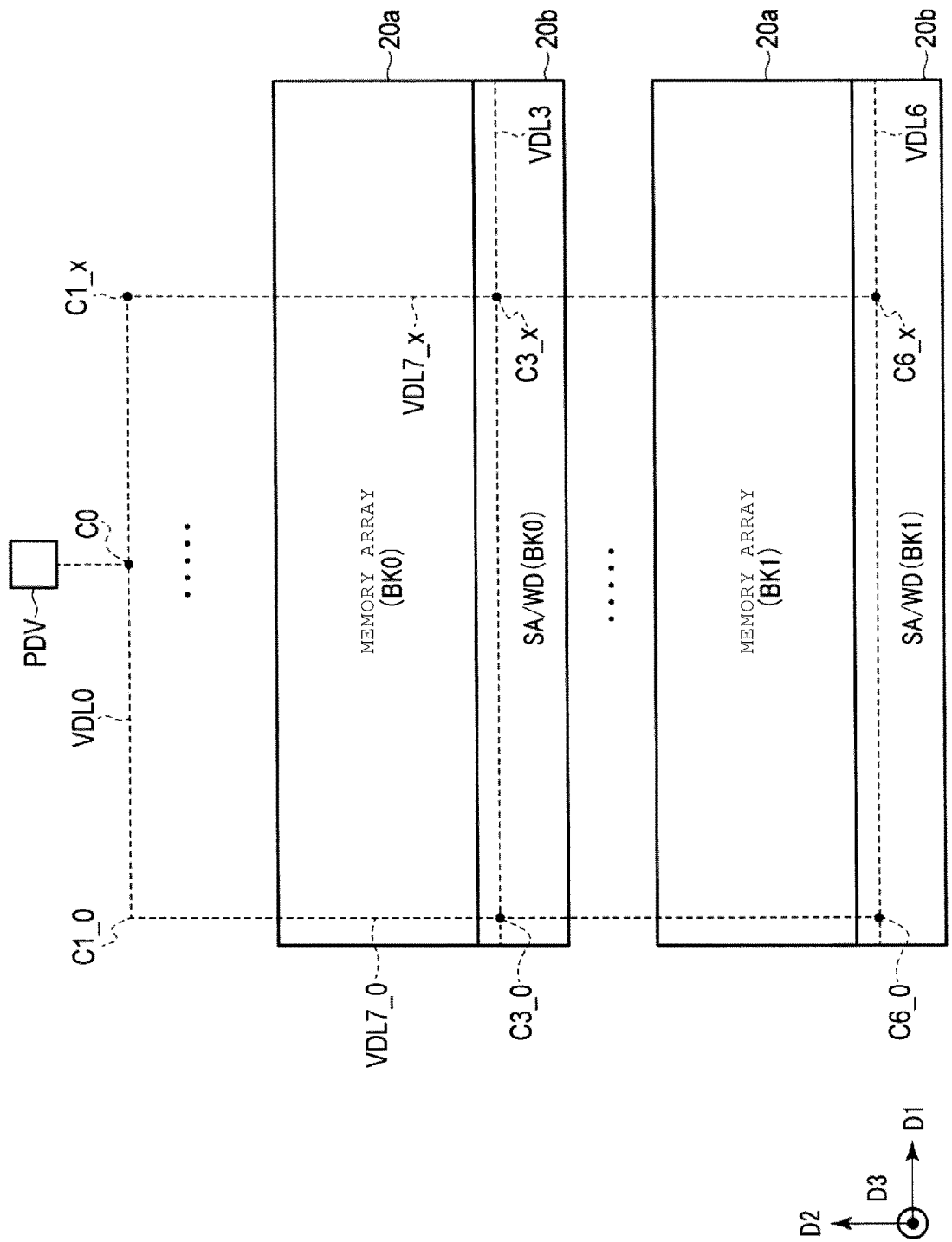
FIG. 11 is a layout diagram illustrating wiring of power source lines of a semiconductor memory device according to a comparative example of the first embodiment.

As illustrated in FIG. 11, the power source wiring VDL7_0 to VDL7_x extend in the D2 direction. The power source wirings VDL7_0 to VDL7_x are connected to the power source wiring VDL3 through the contacts C3_0 to C3_x. The power source wirings VDL7_0 to VDL7_x are connected to the power source wiring VDL6 through the contacts C6_0 to C6_x.

As such, the power source wiring connected to the bank BK0 and the power source wiring connected to the bank BK1 are used in common in the semiconductor memory device according to the comparative example.

In the meantime, different banks BK may be operated simultaneously in the semiconductor memory device.

Figure 12:
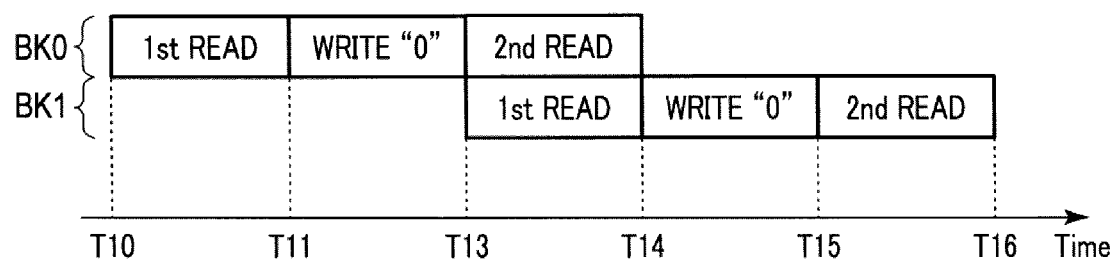
FIG. 12 is a timing diagram illustrating a read operation carried out in two blocks of a semiconductor memory device.

For example, as illustrated in FIG. 12, timing of the second read operation for the bank BK0 and timing of the first second read operation for the bank BK1 overlap each other.

In this case, there is a possibility that the noise occurs in the bank BK1 during the operation of the bank BK0. Similarly, there is a possibility that the noise occurs in the bank BK0 during the operation of the bank BK1.

Here, waveforms in a case where noise is received from an adjacent bank during a read operation will be described.

Figure 13:
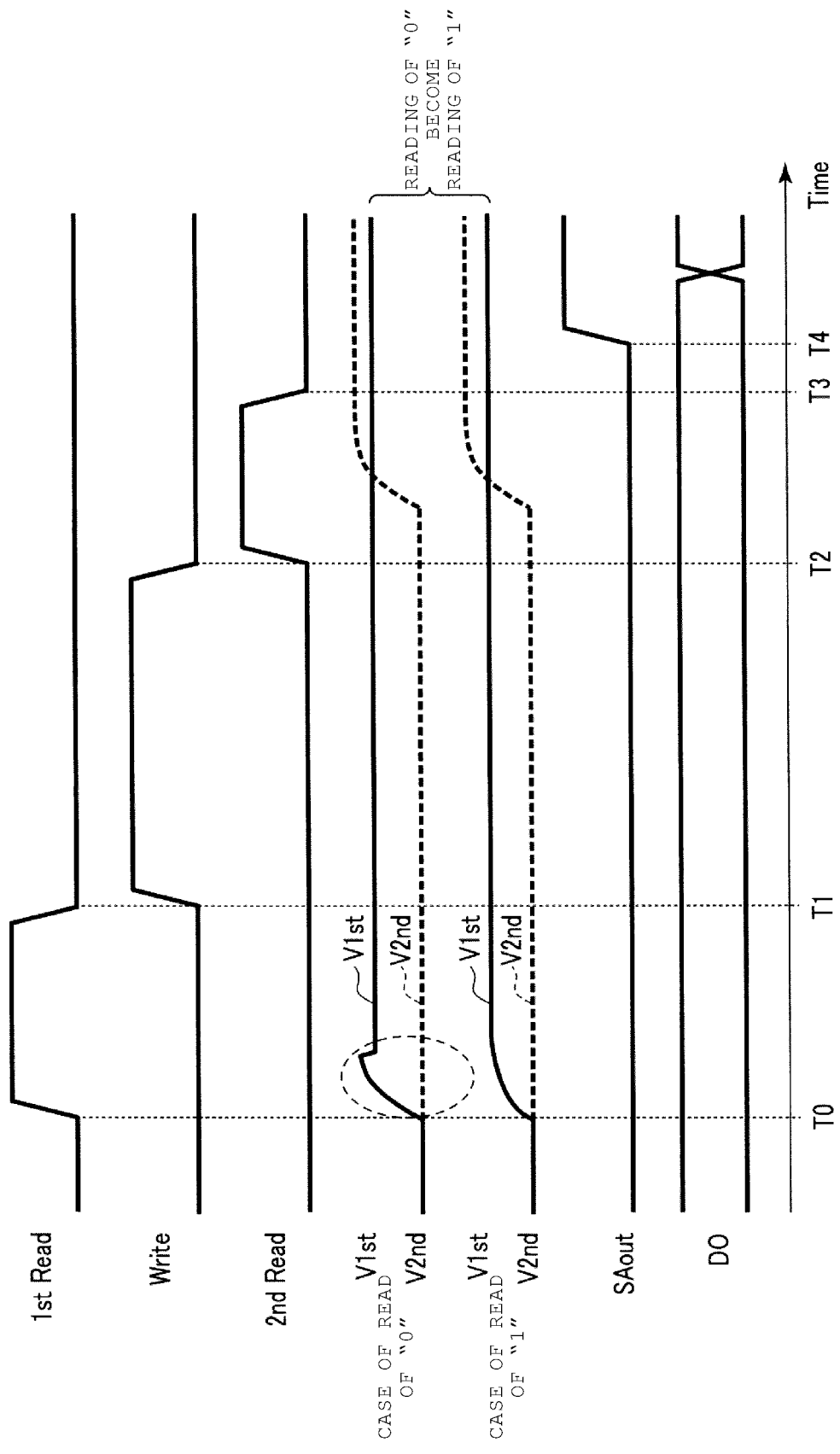
FIG. 13 is a waveform diagram illustrating a voltage waveform at the time of the read operation of the semiconductor memory device according to the comparative example of the first embodiment.

In FIG. 13, waveforms in a case where the adjacent bank is activated during the first read operation are illustrated.

As illustrated in FIG. 13, in a case where the adjacent bank is activated during the first read operation, as shown by the broken line in FIG. 13, a voltage value is stored in the sample and hold circuit 222 while the V1st is lowered. In this case, there is a possibility that the sense amplifier 225 is not able to properly determine data.

Figure 14:
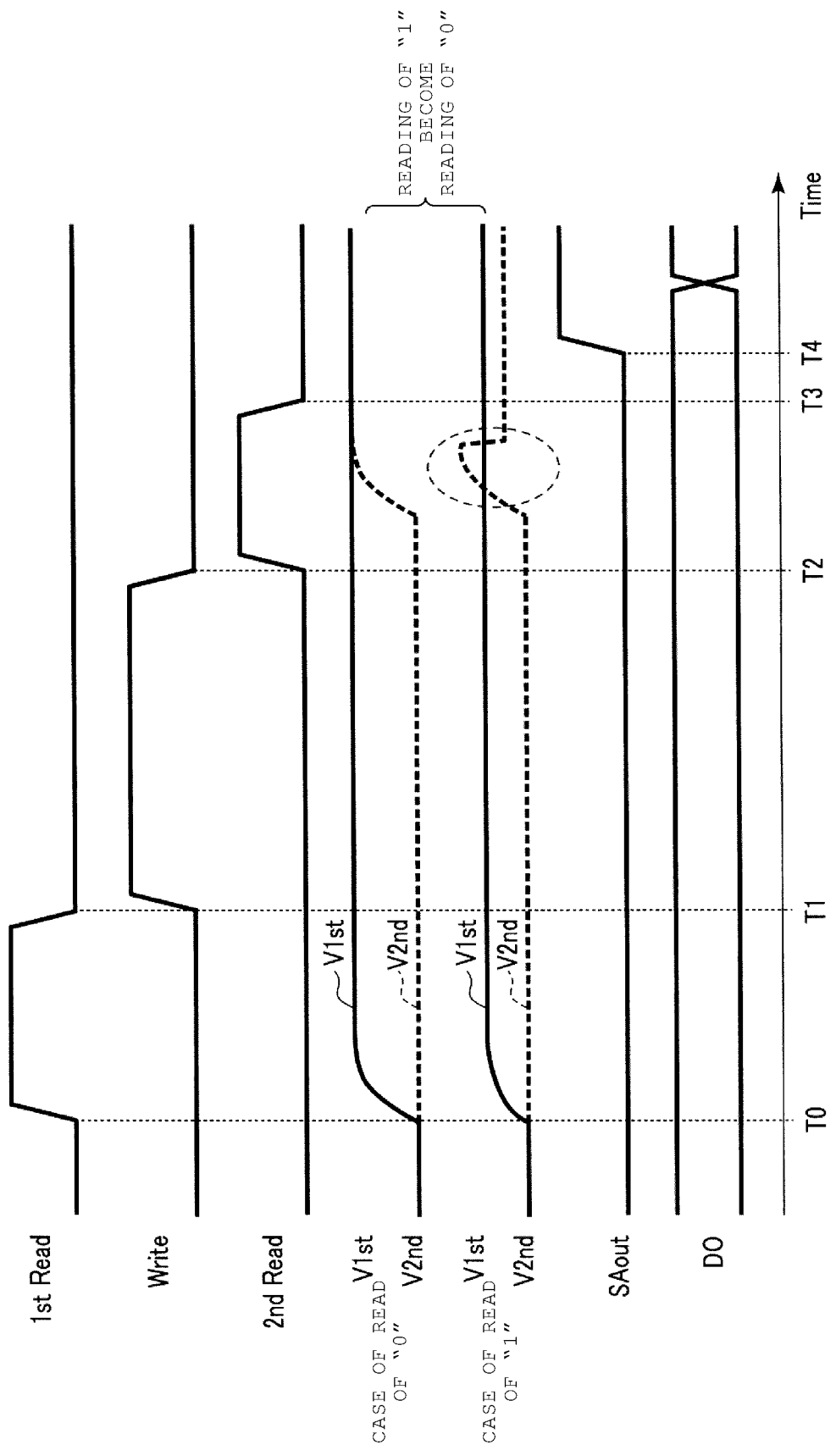
FIG. 14 is another waveform diagram illustrating the voltage waveform at the time of the read operation of the semiconductor memory device according to the comparative example of the first embodiment.

In FIG. 14, waveforms in a case where the adjacent bank is activated during the second read operation are illustrated.

As illustrated in FIG. 14, in a case where the adjacent bank is activated during the second read operation, as shown by the broken line in FIG. 14, a voltage value is stored in the sample and hold circuit 224 while the V2nd is lowered. In this case, there is a possibility that the sense amplifier 225 is not able to properly determine data.

As such, in the semiconductor memory device according to the comparative example, there is a possibility that data is not able to be correctly determined, due to the influence by the adjacent bank.

As described above, in the semiconductor memory device, the read operation is performed twice in order to read data from the memory cell. For that reason, the first read operation and the second read operation preferably operate in the same operation environment.

However, when only the operation of either of the first read operation and the second read operation is influenced by the noise generated by another adjacent bank, there is a possibility that data is not able to be properly read.

In the semiconductor memory device according to the embodiment described above, the power source wiring connected to the bank BK0 and the power source wiring connected to the bank BK1 are connected in the vicinity of the power source pad PDV. The power source pad PDV is able to absorb the noise and thus, power source noise generated by the bank BK does not influence on another adjacent bank BK. For that reason, even when the operation illustrated in FIG. 12 is performed, the read operation can be favorably performed.

1-4 Modification Example

1-4-1 Modification Example 1

A power source wiring layout of the semiconductor memory device according to the modification example 1 of the first embodiment will be described using FIG. 15 of the modification example 1.

The difference between the power source wiring layout of the semiconductor memory device according to the modification example 1 of the first embodiment and the power source wiring layout of the semiconductor memory device according to the first embodiment is that a power supply circuit 300 is further added.

Figure 15:
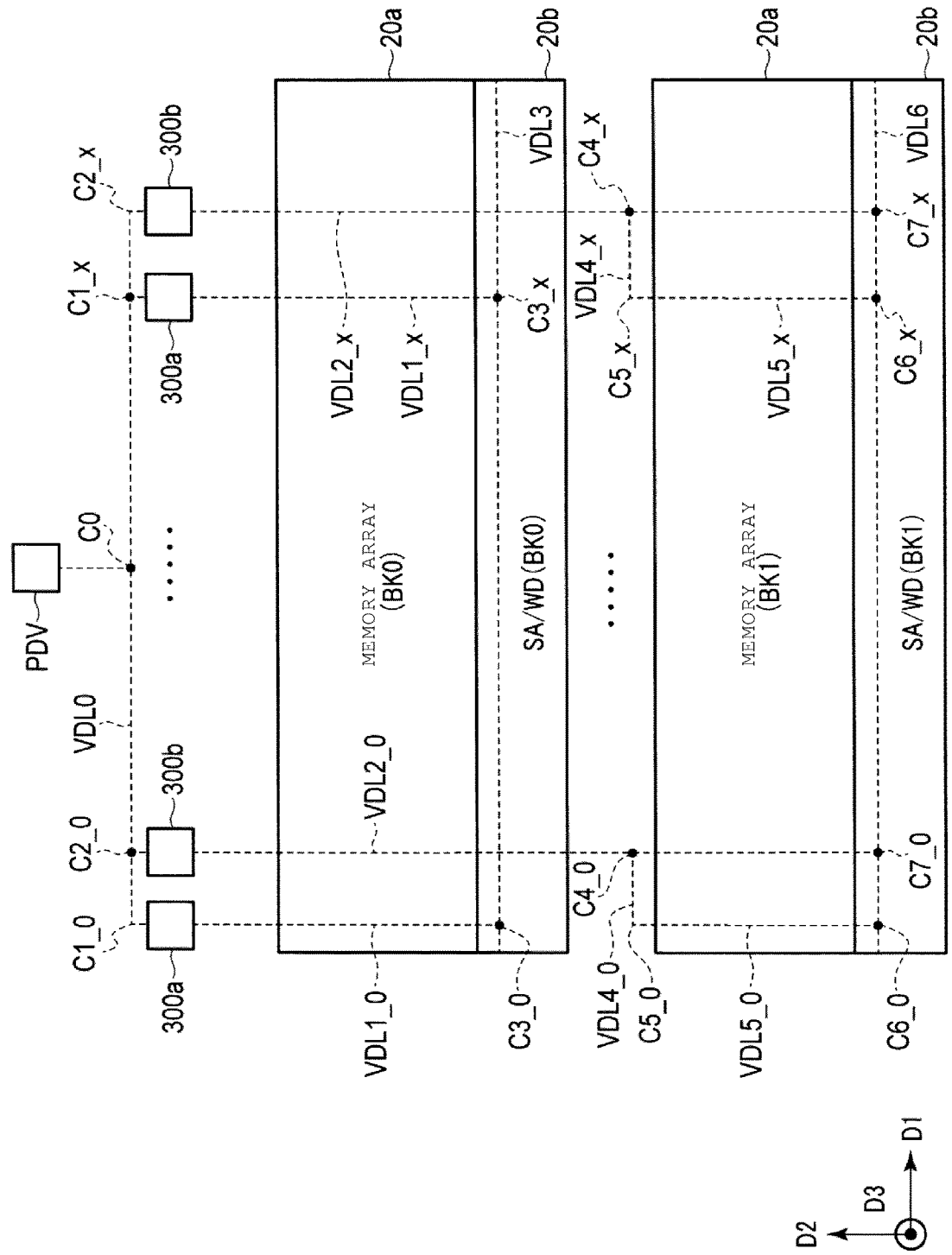
FIG. 15 is a layout diagram illustrating wiring of power source lines of a semiconductor memory device according to a modification example 1 of the first embodiment.

Specifically, as illustrated in FIG. 15, a power supply circuit 300a is provided between the power source wiring VDL0 and the power source wiring VDL1. A power supply circuit 300b is provided between the power source wiring VDL0 and the power source wiring VDL2.

Any configuration of the power supply circuit 300a may be employed as long as it allows the power source voltage to be transferred from the power source wiring VDL0 to the power source wiring VDL1. Similarly, any configuration of the power supply circuit 300b may be employed as long as it allows the power source voltage to be transferred from the power source wiring VDL0 to the power source wiring VDL2.

1-4-2 Modification Example 2

A power source wiring layout of a semiconductor memory device according to the modification example 2 of the first embodiment will be described using FIG. 16.

Figure 16:
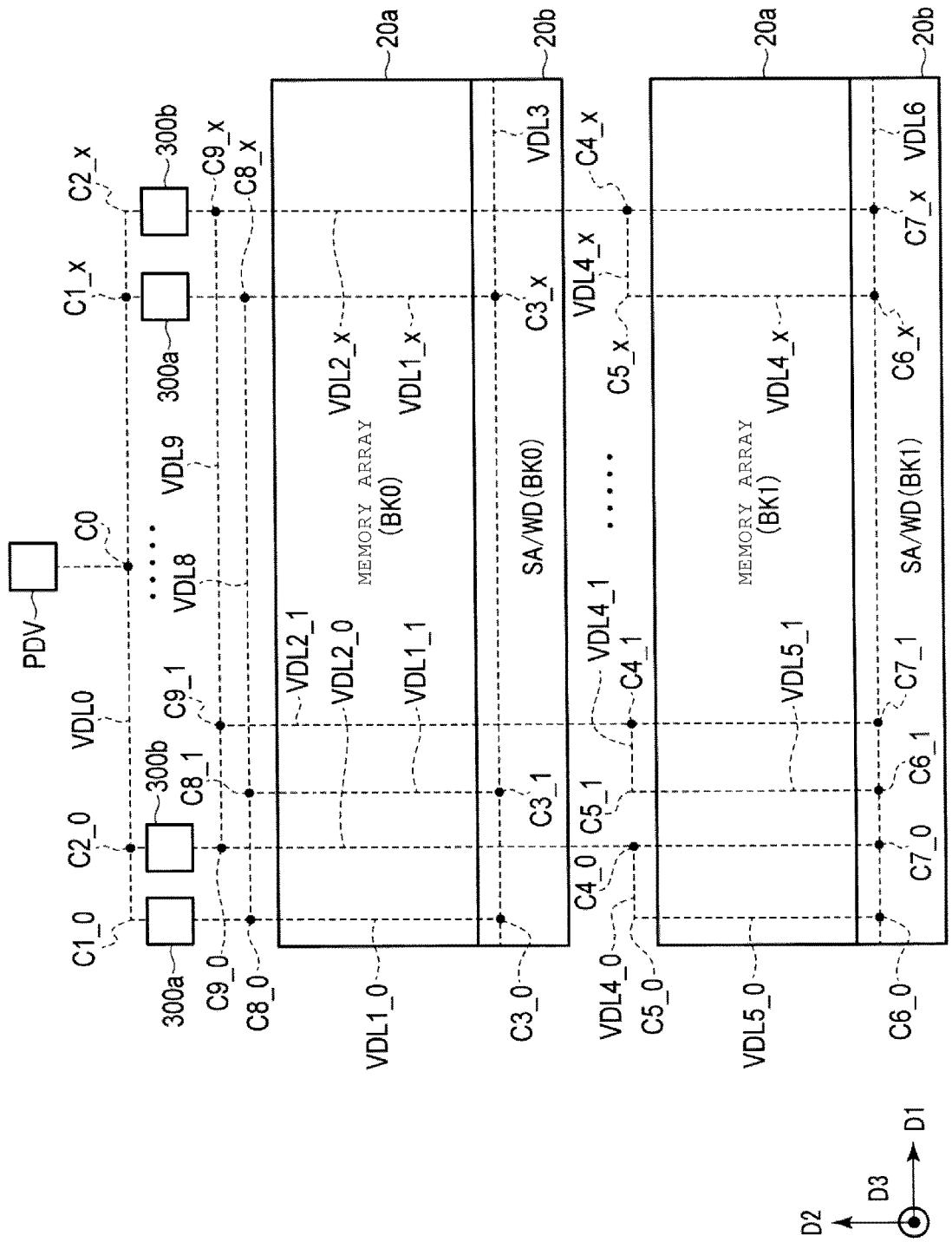
FIG. 16 is a layout diagram illustrating wiring of power source lines of a semiconductor memory device according to a modification example 2 of the first embodiment.

A layout illustrated in FIG. 16 may be employed. In FIG. 15, a single power source wiring VDL1 is connected to a single power supply circuit 300a. However, as illustrated in FIG. 16, a plurality of power source wirings VDL1 may be connected to a single power supply circuit 300a. Similarly, as illustrated in FIG. 16, a plurality of power source wirings VDL2 may be connected to a single power supply circuit 300b.

1-4-3 Modification Example 3

A power source wiring layout of a semiconductor memory device according to the modification example 3 of the first embodiment will be described using FIG. 17.

The difference between the power source wiring layout of the semiconductor memory device according to the modification example 3 of the first embodiment and the power source wiring layout of the semiconductor memory device according to the first embodiment is that the power source pad for the bank BK0 and the power source pad for the bank BK1 are electrically separated from each other.

Figure 17:
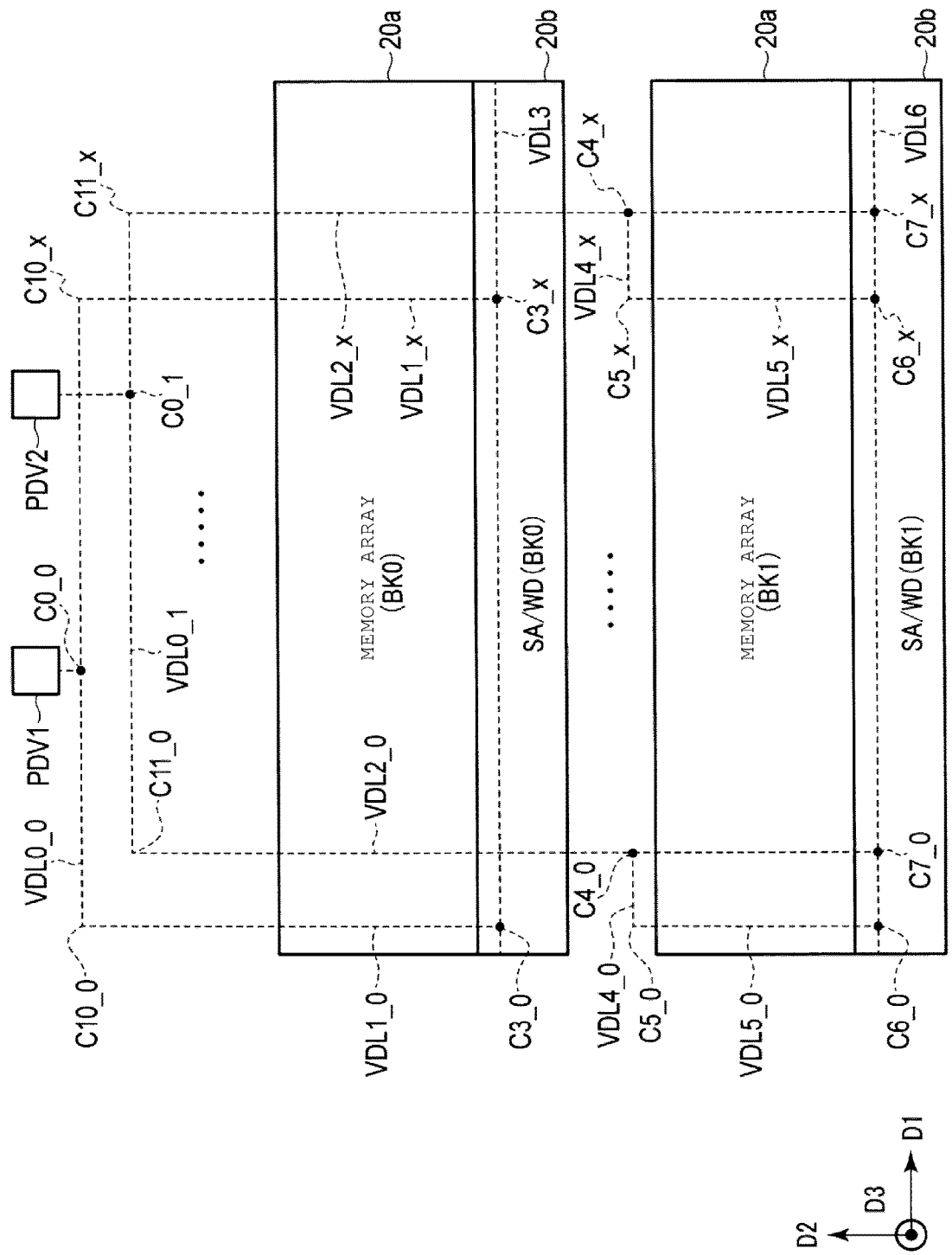
FIG. 17 is a layout diagram illustrating wiring of power source lines of a semiconductor memory device according to a modification example 3 of the first embodiment.

As illustrated in FIG. 17, the first power source pad PDV1 supplies the voltage VDD to the sense amplifier/write driver 20b of the bank BK0 through the power source wiring VDL.

The first power source pad PDV1 is connected to the power source wiring VDL0_0 through the contact C0_0.

The power source wiring VDL0_0 extends in the D1 direction. The power source wiring VDL0_0 is connected to respective power source wirings VDL1_0 to VDL1_x through respective contacts C10_0 to C10_x.

As illustrated in FIG. 17, the second power source pad PDV2 supplies the voltage VDD to the sense amplifier/write driver 20b of the bank BK1 through the power source wiring VDL.

The second power source pad PDV2 is connected to the power source wiring VDL0_1 through the contact C0_1.

The power source wiring VDL0_1 extends in the D1 direction. The power source wiring VDL0_1 is connected to respective power source wirings VDL2_0 to VDL2_x through respective contacts C11_0 to C11_x.

1-4-4 Modification Example 4

A power source wiring layout of a semiconductor memory device according to the modification example 4 of the first embodiment will be described using FIG. 18.

The difference between the power source wiring layout of the semiconductor memory device according to the modification example 4 of the first embodiment and the power source wiring layout of the semiconductor memory device according to the modification example 3 of the first embodiment is that the power supply circuit 300 is further added.

Figure 18:
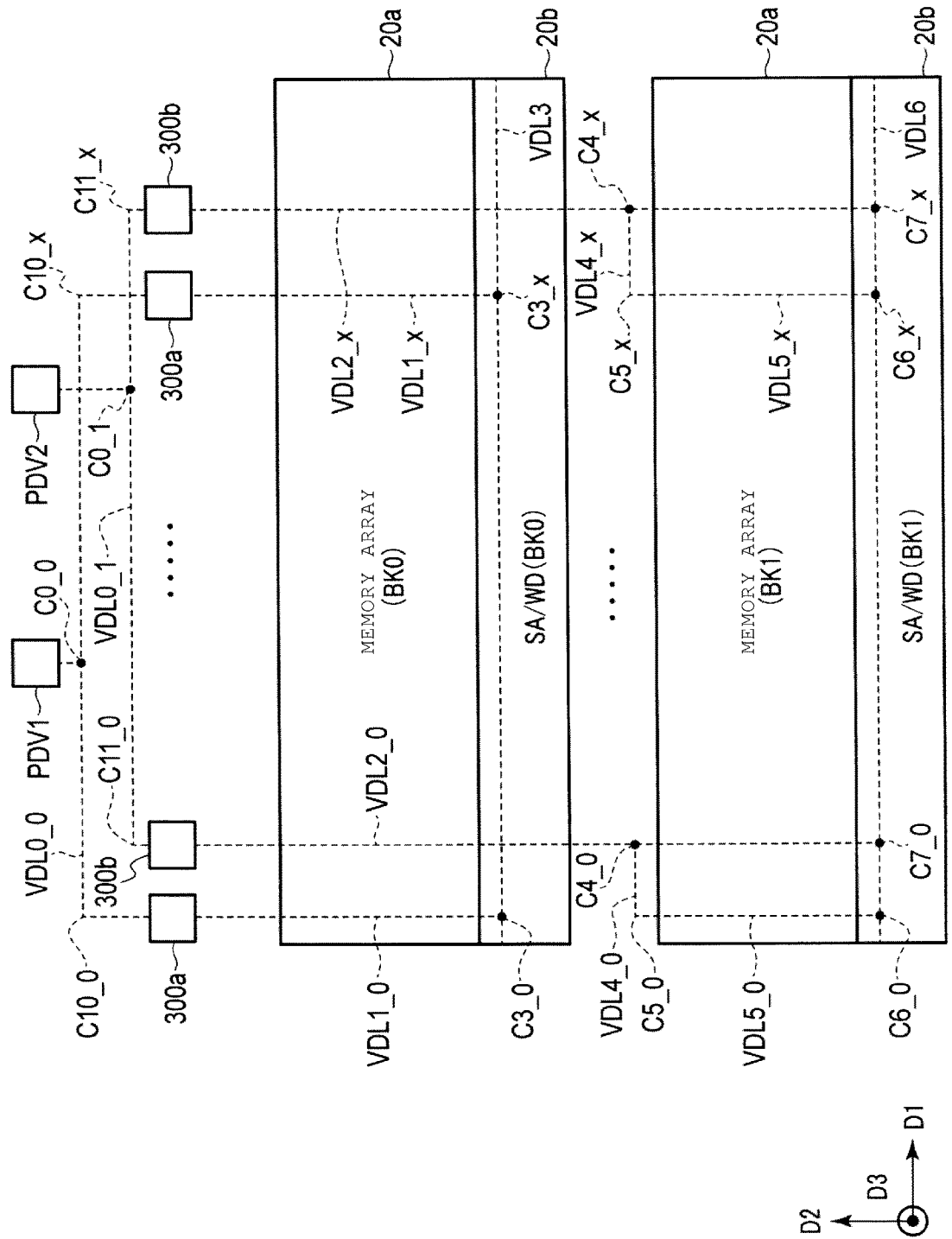
FIG. 18 is a layout diagram illustrating wiring of power source lines of a semiconductor memory device according to a modification example 4 of the first embodiment.

Specifically, as illustrated in FIG. 18, the power supply circuit 300a is provided between the power source wiring VDL0_0 and the power source wiring VDL1. The power supply circuit 300b is provided between the power source wiring VDL0_1 and the power source wiring VDL2.

Any configuration of the power supply circuit 300a may be employed as long as it allows the power source voltage to be transferred from the power source wiring VDL0_0 to the power source wiring VDL1. Similarly, any configuration of the power supply circuit 300b may be employed as long as it allows the power source voltage to be transferred from the power source wiring VDL0_1 to the power source wiring VDL2.

1-4-5 Modification Example 5

A power source wiring layout of a semiconductor memory device according to the modification example 5 of the first embodiment will be described using FIG. 19.

Figure 19:
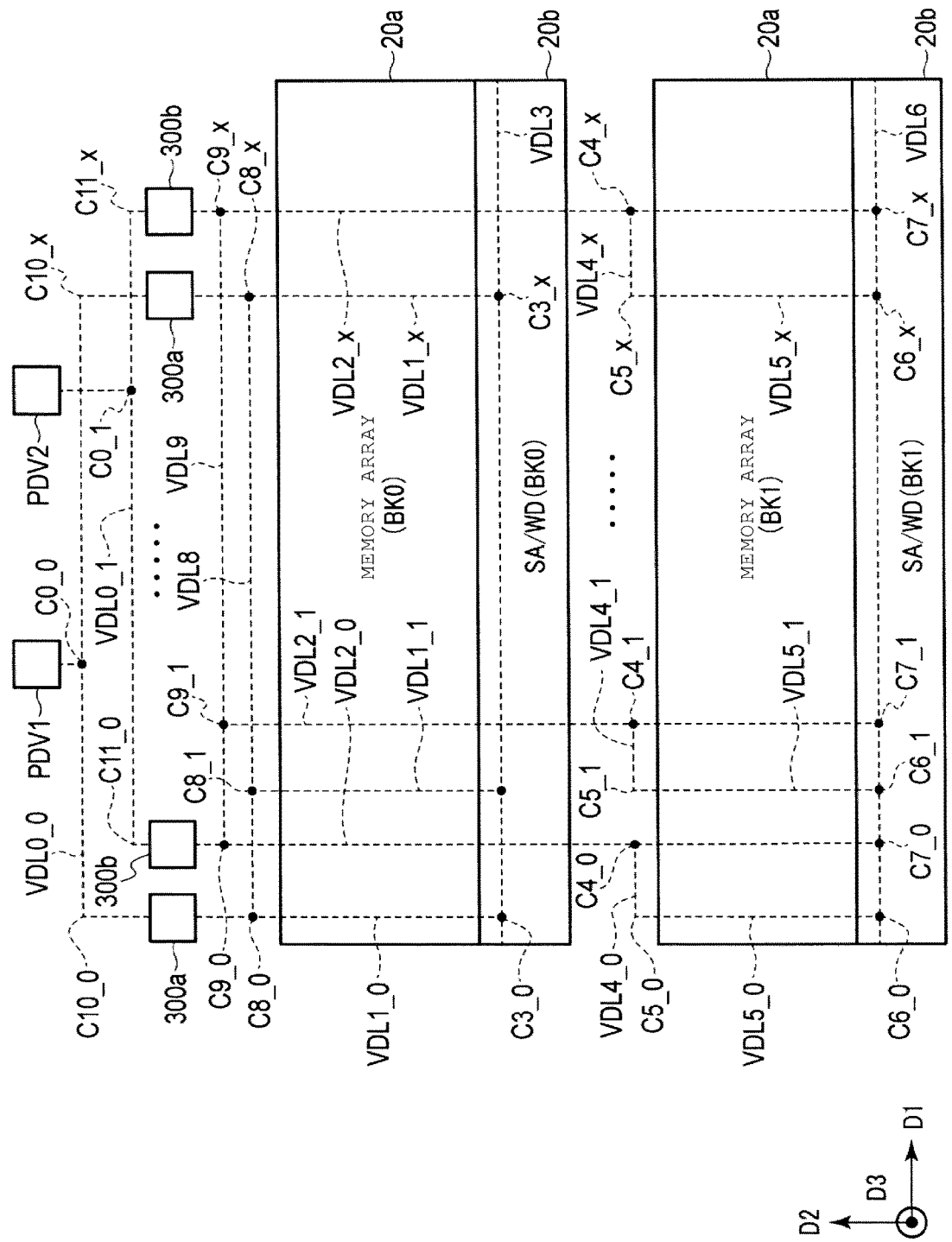
FIG. 19 is a layout diagram illustrating wiring of power source lines of a semiconductor memory device according to a modification example 5 of the first embodiment.

A layout illustrated in FIG. 19 may be employed. In FIG. 18, a single power source wiring VDL1 is connected to a single power supply circuit 300a. However, as illustrated in FIG. 19, a plurality of power source wirings VDL1 may be connected to a single power supply circuit 300a. Similarly, as illustrated in FIG. 19, a plurality of power source wirings VDL2 may be connected to a single power supply circuit 300b.

2 Second Embodiment

Description will be made on a second embodiment. In the second embodiment, another example of the power source wiring layout of the semiconductor memory device will be described. The basic operations of the semiconductor memory device according to the second embodiment are the same as those of the semiconductor memory device according to the first embodiment described above. Accordingly, description of the first embodiment that also applies to the second embodiment and matters that are capable of being analogized from the description of the first embodiment above will be omitted.

2-1 Layout

2-1-1 Wiring Layout

A power source wiring layout of the semiconductor memory device according to the second embodiment will be described using FIG. 20. Here, for simplicity, the pad for supplying the voltage VDD, the wiring for supplying the voltage VDD, the memory array 20a, and the sense amplifier/write driver 20b are only illustrated.

Figure 20:
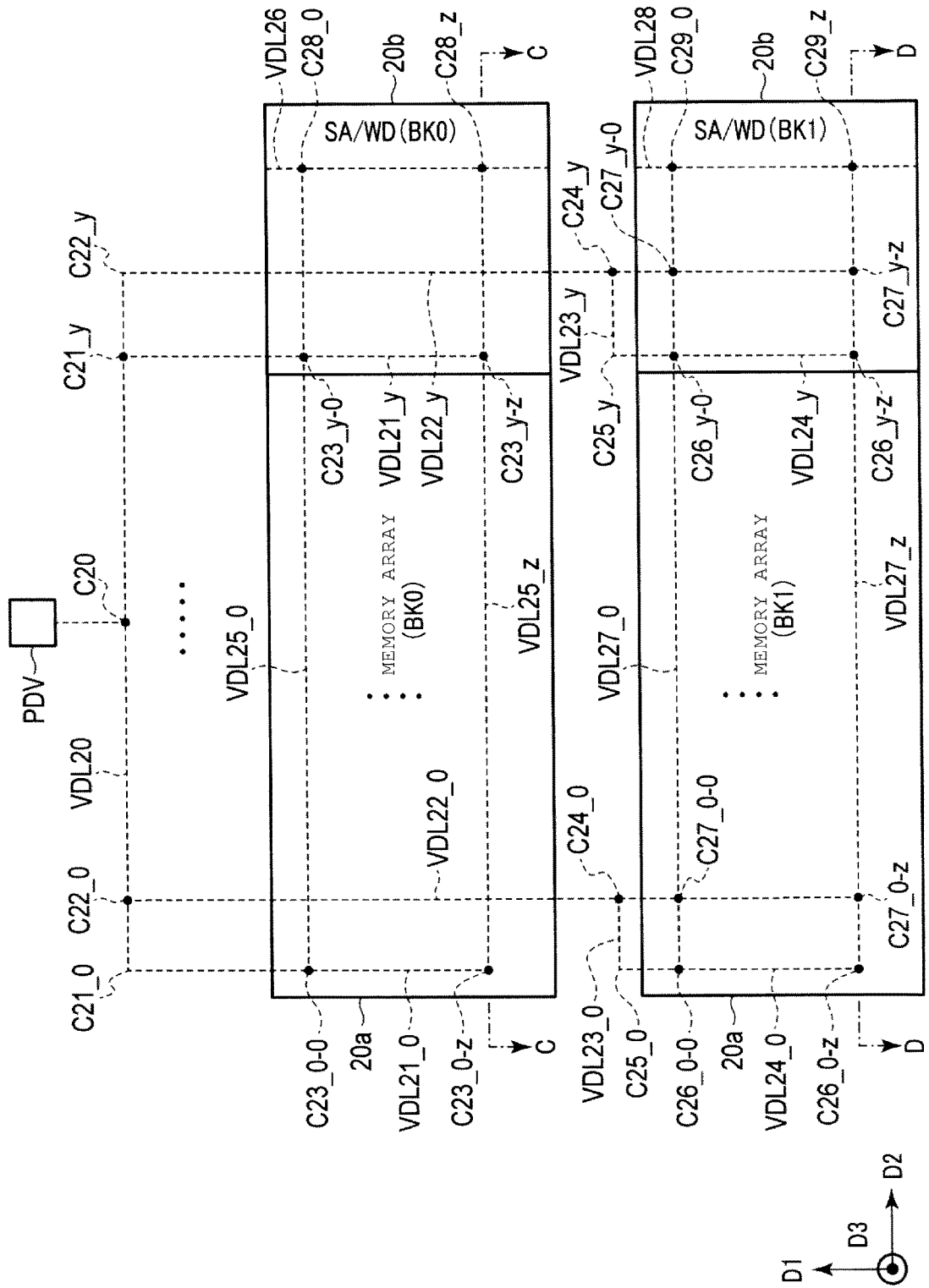
FIG. 20 is a layout diagram illustrating wiring of power source lines of a semiconductor memory device according to a second embodiment.

As illustrated in FIG. 20, the bank BK0 is provided so as to be adjacent in the D2 direction to the power source pad PDV that supplies the voltage VDD. The bank BK0 is sandwiched between the power source pad PDV and the bank BK1 in the D1 direction. That is, the bank BK0 is provided in the vicinity of the power source pad PDV and the bank BK1 is provided far away from the power source pad PDV.

The power source pad PDV supplies the voltage VDD to the sense amplifier/write driver 20b through the power source wiring VDL.

The power source wiring VDL connected to the sense amplifier/write driver 20b of the bank BK0 will be described.

The power source pad PDV is connected to a power source wiring VDL20 through a contact C20.

The power source wiring VDL20 extends in the D2 direction. The power source wiring VDL20 is connected to power source wirings VDL21_0 to VDL21_y through contacts C21_0 to C21_y (y is an integer).

The power source wirings VDL21_0 to VDL21_y extend in the D1 direction. The power source wiring VDL21_0 is connected to the power source wirings VDL25_0 to VDL25_z through the contacts C23_0-0 to C23_0-z (z is an integer). Similarly, the power source wiring VDL21_y is connected to the power source wirings VDL25_0 to VDL25_z through the contacts C23_y-0 to C23_y-z. At least one of the power source wirings VDL21_0 to VDL21_y is preferably provided above the sense amplifier/write driver 20b. In the present example, the power source wiring VDL21_y is provided above the sense amplifier/write driver 20b.

The power source wirings VDL25_0 to VDL25_z extend in the D2 direction. The power source wirings VDL25_0 to VDL25_z are connected to the power source wiring VDL26 through the contacts C28_0 to C28_z.

The power source wiring VDL26 extends in the D1 direction. The power source wiring VDL26 is connected to the sense amplifier/write driver 20b of the bank BK0 through a contact (not illustrated).

The power source wiring VDL connected to the sense amplifier/write driver 20b of the bank BK1 will be described.

The power source wiring VDL20 is connected to respective power source wirings VDL22_0 to VDL22_y through respective contacts C22_0 to C22_y.

The power source wirings VDL22_0 to VDL22_y extend in the D1 direction so as to be connected to the bank BK1 without being connected to the bank BK0. The power source wiring VDL22_0 is connected to the power source wirings VDL27_0 to VDL27_z through contacts C27_0-0 to C27_0-z. Similarly, the power source wiring VDL22_y is connected to the power source wirings VDL27_0 to VDL27_z through contacts C27_y-0 to C27_y-z. At least one of the power source wirings VDL22_0 to VDL22_y is preferably provided above the sense amplifier/write driver 20b. In the present example, the power source wiring VDL22_y is provided above the sense amplifier/write driver 20b.

The power source wirings VDL27_0 to VDL27_z extend in the D2 direction. The power source wirings VDL27_0 to VDL27_z are connected to the power source wiring VDL28 through the contacts C29_0 to C29_z.

The power source wiring VDL28 extends in the D1 direction. The power source wiring VDL28 is connected to the sense amplifier/write driver 20b of the bank BK1 through a contact (not illustrated).

The power source wirings VDL22_0 to VDL22_y are connected to respective power source wirings VDL23_0 to VDL23_y through respective contacts C24_0 to C24_y The power source wirings VDL23_0 to VDL23_y extend in the D2 direction. The power source wiring VDL23_0 is connected to the power source wirings VDL24_0 to VDL24_y through contacts C25_0 to C25_0.

The power source wirings VDL24_0 to VDL24_y extend in the D1 direction. The power source wiring VDL24_0 is connected to the power source wirings VDL27_0 to VDL27_z through contacts C26_0-0 to C26_0-z. Similarly, the power source wiring VDL24_y is connected to the power source wirings VDL27_0 to VDL27_z through contacts C26_y-0 to C26_y-z. At least one of the power source wirings VDL24_0 to VDL24_y is preferably provided above the sense amplifier/write driver 20b. In the present example, the power source wiring VDL24_y is provided above the sense amplifier/write driver 20b.

2-1-2 Cross-Section Taken Along C-C

Cross-section taken along C-C of FIG. 20 will be described using FIG. 21. Here, for simplicity, the insulating layer covering respective wirings is not illustrated. Elements depicted in FIG. 21 that are obscured by objects in the cross-section taken along C-C of FIG. 20, are illustrated by a broken line.

Basic description on the block BK0 is substantially similar to that described in FIG. 6. FIG. 21 differs from FIG. 7 in that the power source wiring and the main word line MWL are alternately provided in the third wiring layer.

2-1-3 Cross-Section Taken Along D-D

Cross-section taken along D-D of FIG. 20 will be described using FIG. 22. Here, for simplicity, the insulating layer covering respective wirings is not illustrated. Elements depicted in FIG. 22 that are obscured by objects in the cross-section taken along D-D of FIG. 20, are illustrated by a broken line.

Figure 21:
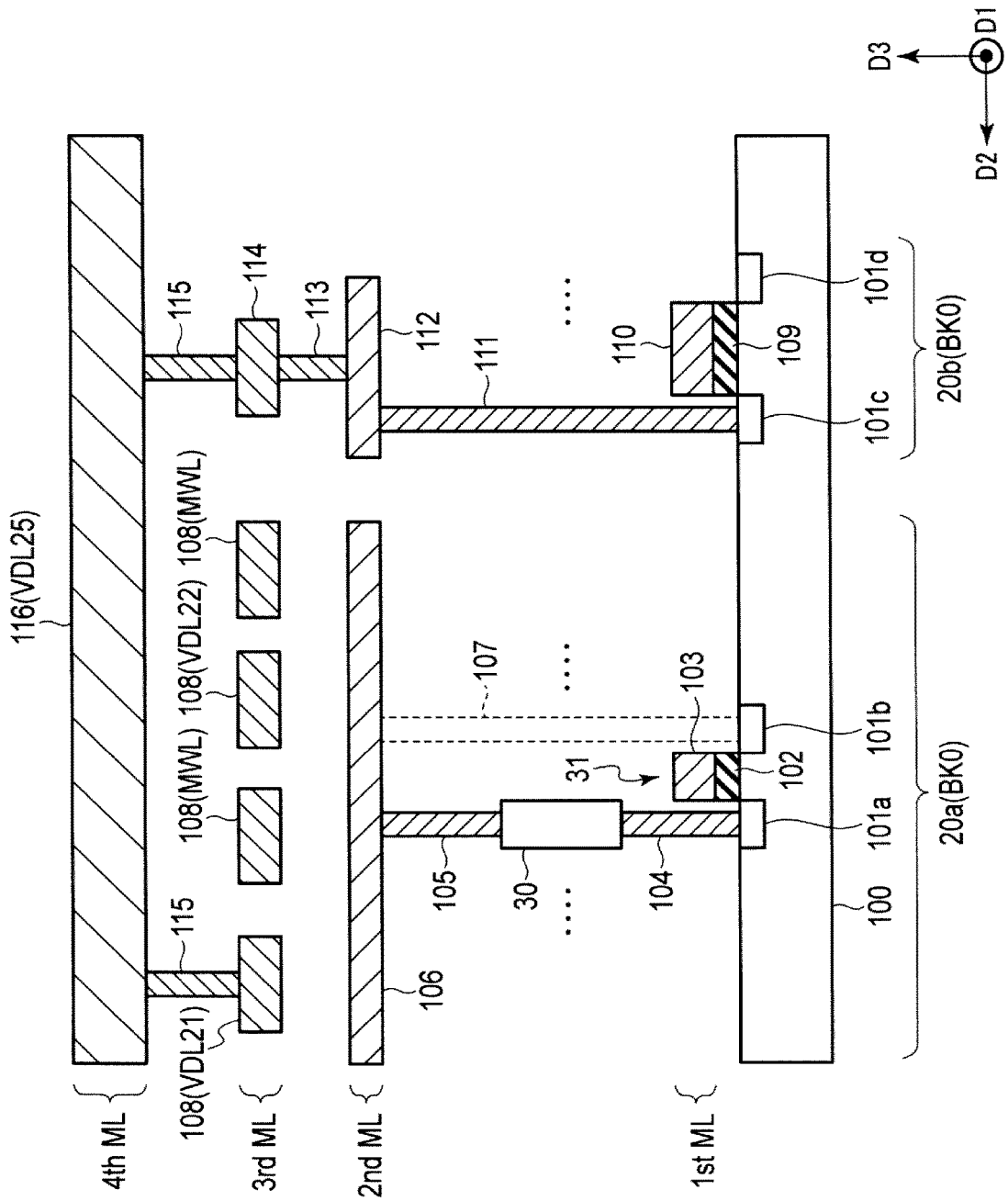
FIG. 21 is a cross-sectional view taken along the C-C line of FIG. 20.

In FIG. 21, only the power source wiring VDL21 is connected to the power source wiring VDL25. However, in FIG. 22, two groups of wirings of the power source wirings VDL22 and VDL24 are connected to the power source wiring VDL27.

2-2 Effect

Figure 22:
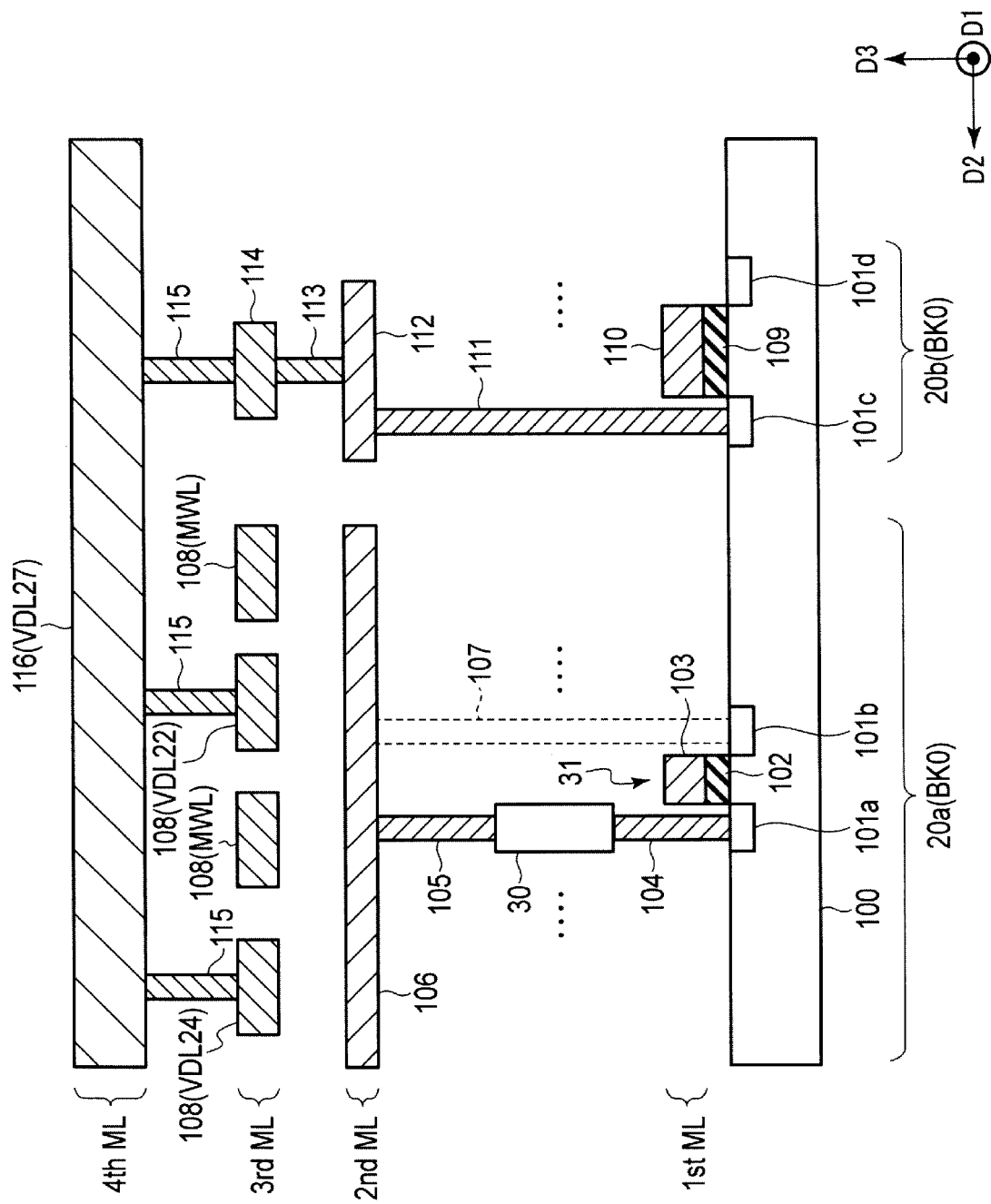
FIG. 22 is a cross-sectional view taken along the D-D line of FIG. 20.

As illustrated in FIG. 20 to FIG. 22, the power source wiring connected to the bank BK0 and the power source wiring connected to the bank BK1 are connected in the vicinity of the power source pad PDV. The number of the power source wirings connected to the bank BK1 is twice the number of the power source wirings connected to the bank BK0 so that the voltage supplied to the bank BK1 is not lower than the voltage supplied to the bank BK0. In the first embodiment, for simplicity, the number of the power source wirings connected to the bank BK1 is set to twice the number of the power source wirings connected to the bank BK0. However, a configuration in which the number of power source wirings connected to the bank BK1 is greater by amount than the number of power source wirings connected to the bank BK0 may be employed.

For that reason, the same effect as that of the first embodiment described above can be obtained.

2-3 Modification Example 2-3-1 Modification Example 1

A power source wiring layout of the semiconductor memory device according to the modification example 1 of the second embodiment will be described using FIG. 23.

The difference between the power source wiring layout of the semiconductor memory device according to the modification example 1 of the second embodiment and the power source wiring layout of the semiconductor memory device according to the second embodiment is that the power supply circuit 300 is further added.

Figure 23:
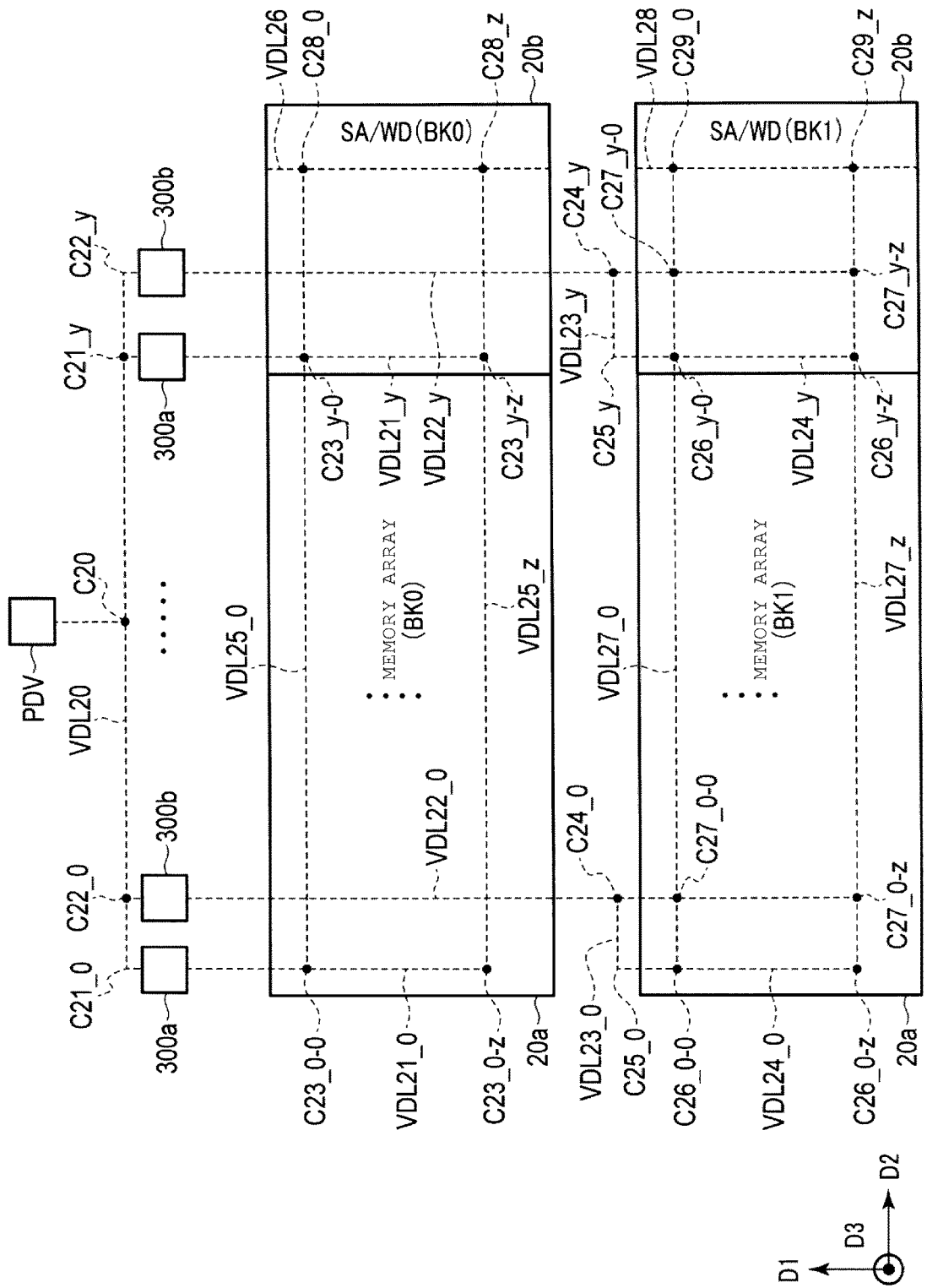
FIG. 23 is a layout diagram illustrating wiring of power source lines of a semiconductor memory device according to a modification example 1 of the second embodiment.

Specifically, as illustrated in FIG. 23, the power supply circuit 300a is provided between the power source wiring VDL20 and the power source wiring VDL21. The power supply circuit 300b is provided between the power source wiring VDL20 and the power source wiring VDL22.

Any configuration of the power supply circuit 300a may be employed as long as it allows the power source voltage to be transferred from the power source wiring VDL20 to the power source wiring VDL21. Similarly, any configuration of the power supply circuit 300b may be employed as long as it allows the power source voltage to be transferred from the power source wiring VDL20 to the power source wiring VDL22.

2-3-2 Modification Example 2

A power source wiring layout of the semiconductor memory device according to the modification example 2 of the second embodiment will be described using FIG. 24.

Figure 24:
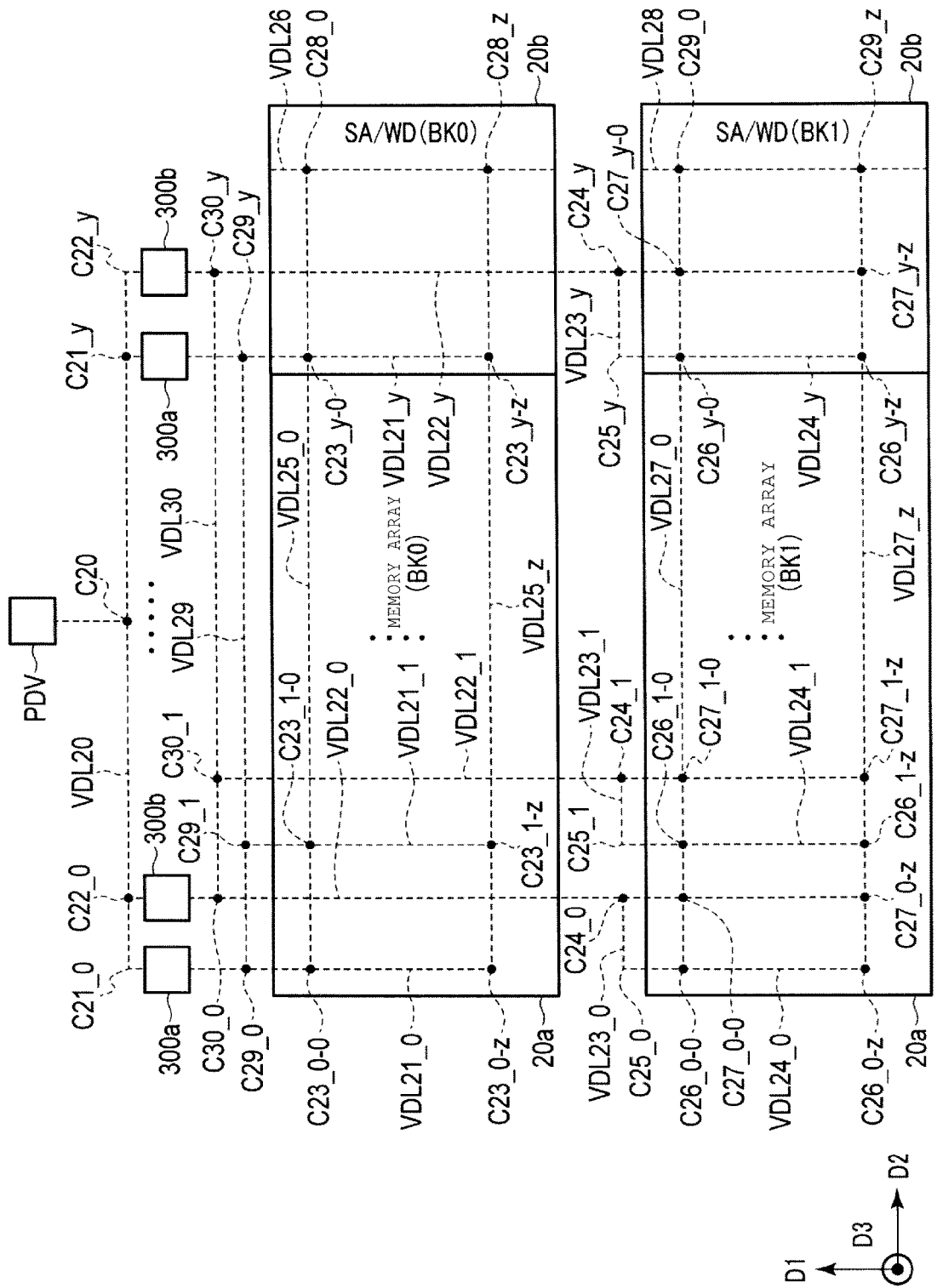
FIG. 24 is a layout diagram illustrating wiring of power source lines of a semiconductor memory device according to a modification example 2 of the second embodiment.

A layout illustrated in FIG. 24 may be employed. In FIG. 23, a single power source wiring VDL21 is connected to a single power supply circuit 300a. However, as illustrated in FIG. 24, a plurality of power source wirings VDL21 may be connected to a single power supply circuit 300a. Similarly, as illustrated in FIG. 24, a plurality of power source wirings VDL22 may be connected to a single power supply circuit 300b.

2-3-3 Modification Example 3

A power source wiring layout of a semiconductor memory device according to the modification example 3 of the second embodiment will be described using FIG. 25.

The difference between the power source wiring layout of the semiconductor memory device according to the modification example 3 of the second embodiment and the power source wiring layout of the semiconductor memory device according to the second embodiment is that the power source pad for the bank BK0 and the power source pad for the bank BK1 are electrically separated from each other.

Figure 25:
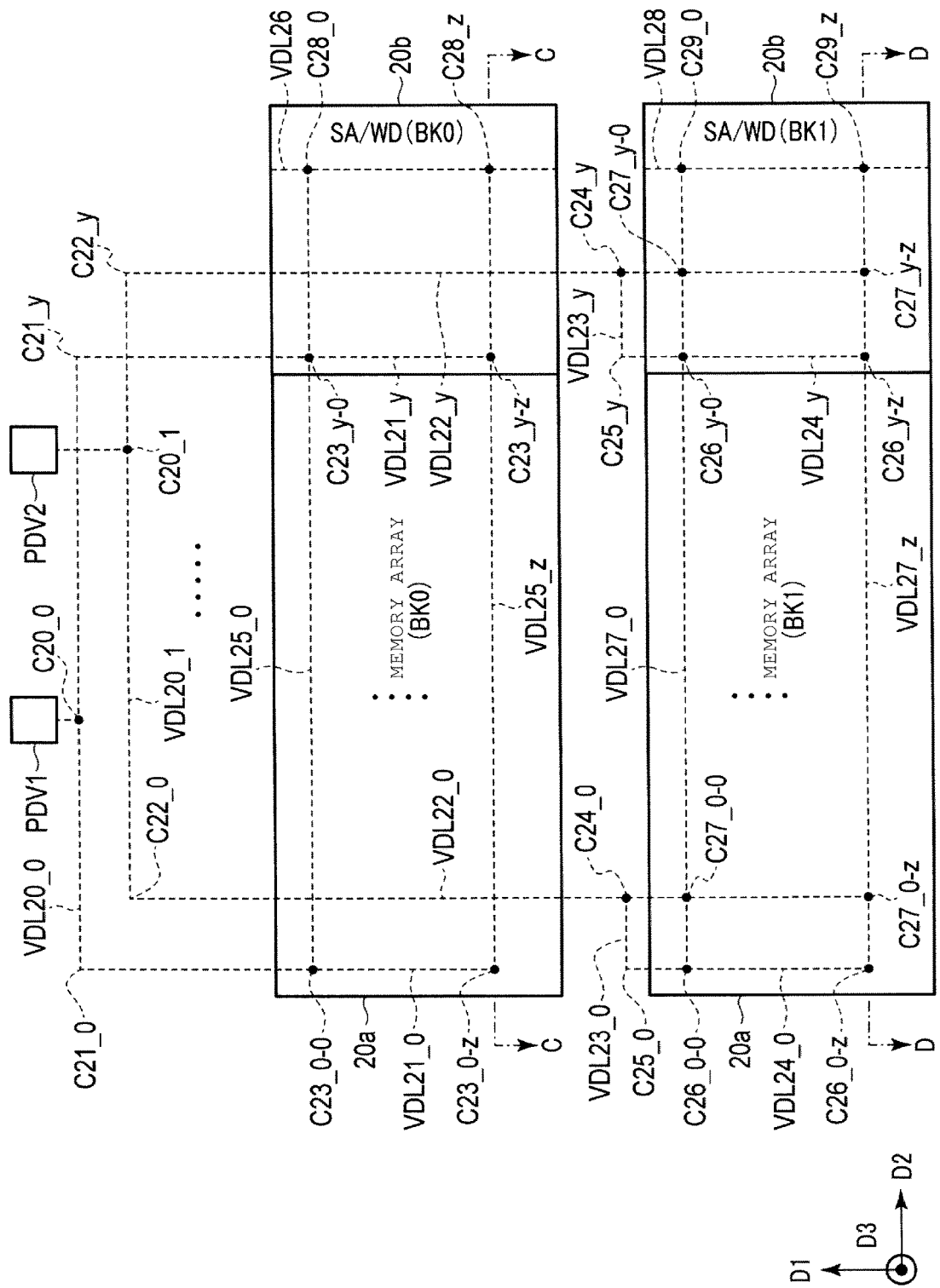
FIG. 25 is a layout diagram illustrating wiring of power source lines of a semiconductor memory device according to a modification example 3 of the second embodiment.

As illustrated in FIG. 25, the first power source pad PDV1 supplies the voltage VDD to the sense amplifier/write driver 20b of the bank BK0 through the power source wiring VDL.

The first power source pad PDV1 is connected to the power source wiring VDL20_0 through the contact C20_0.

The power source wiring VDL20_0 extends in the D2 direction. The power source wiring VDL20_0 is connected to respective power source wirings VDL21_0 to VDL21_$y$ through respective contacts C21_0 to C21_$y$.

The second power source pad PDV2 is connected to the power source wiring VDL20_1 through the contact C20_1.

The power source wiring VDL20_1 extends in the D2 direction. The power source wiring VDL20_1 is connected to respective power source wirings VDL22_0 to VDL22_$y$ through respective contacts C22_0 to C22_$y$.

2-3-4 Modification Example 4

A power source wiring layout of a semiconductor memory device according to the modification example 4 of the second embodiment will be described using FIG. 26.

The difference between the power source wiring layout of the semiconductor memory device according to the modification example 4 of the second embodiment and the power source wiring layout of the semiconductor memory device according to the modification example 3 of the second embodiment is that the power supply circuit 300 is further added.

Figure 26:
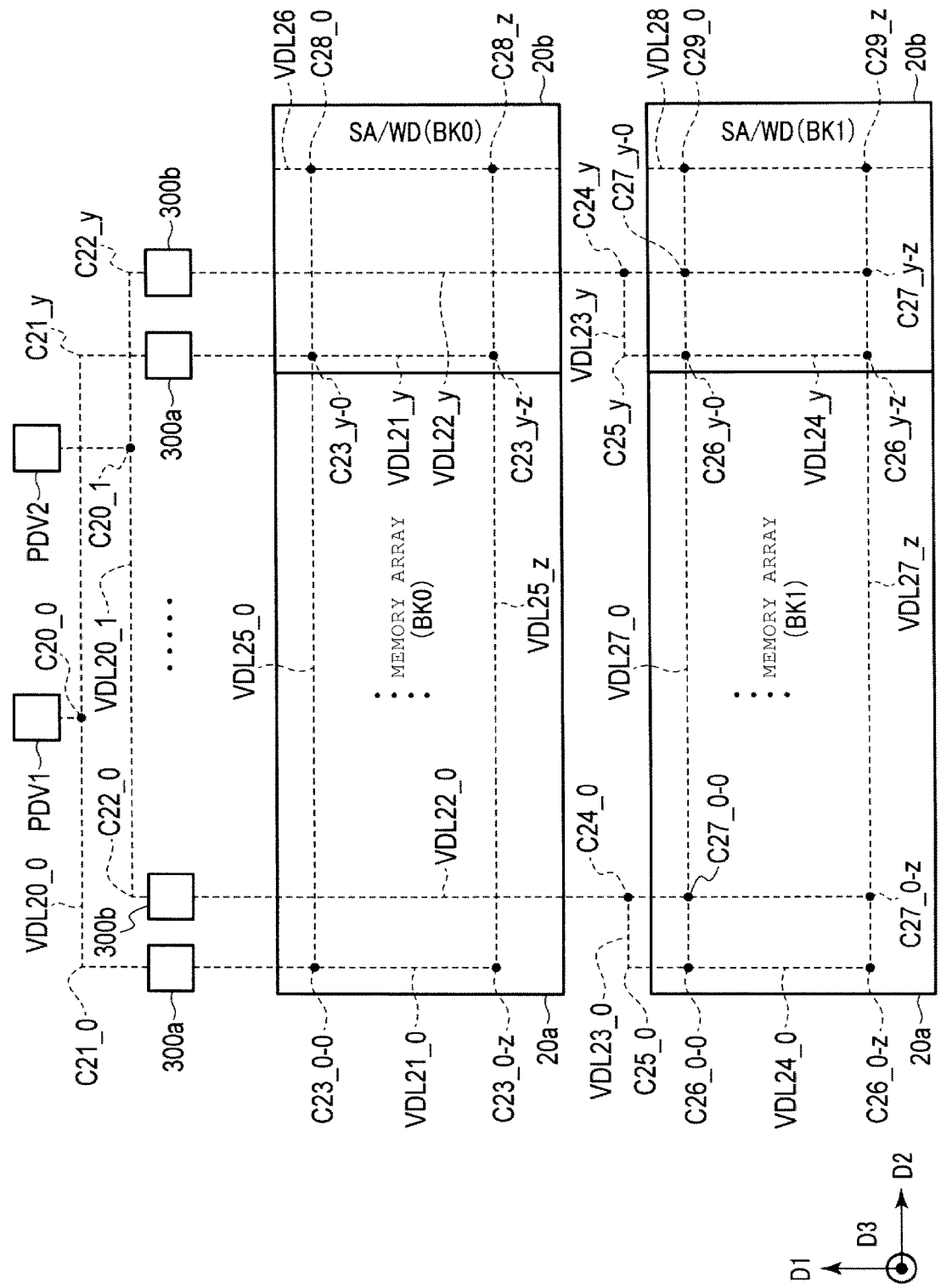
FIG. 26 is a layout diagram illustrating wiring of power source lines of a semiconductor memory device according to a modification example 4 of the second embodiment.

Specifically, as illustrated in FIG. 26, the power supply circuit 300a is provided between the power source wiring VDL20_0 and the power source wiring VDL21. The power supply circuit 300b is provided between the power source wiring VDL20_1 and the power source wiring VDL22.

Any configuration of the power supply circuit 300a may be employed as long as it allows the power source voltage to be transferred from the power source wiring VDL20_0 to the power source wiring VDL21. Similarly, any configuration of the power supply circuit 300b may be employed as long as it allows the power source voltage to be transferred from the power source wiring VDL20_1 to the power source wiring VDL22.

2-3-5 Modification Example 5

A power source wiring layout of a semiconductor memory device according to the modification example 5 of the second embodiment will be described using FIG. 27.

Figure 27:
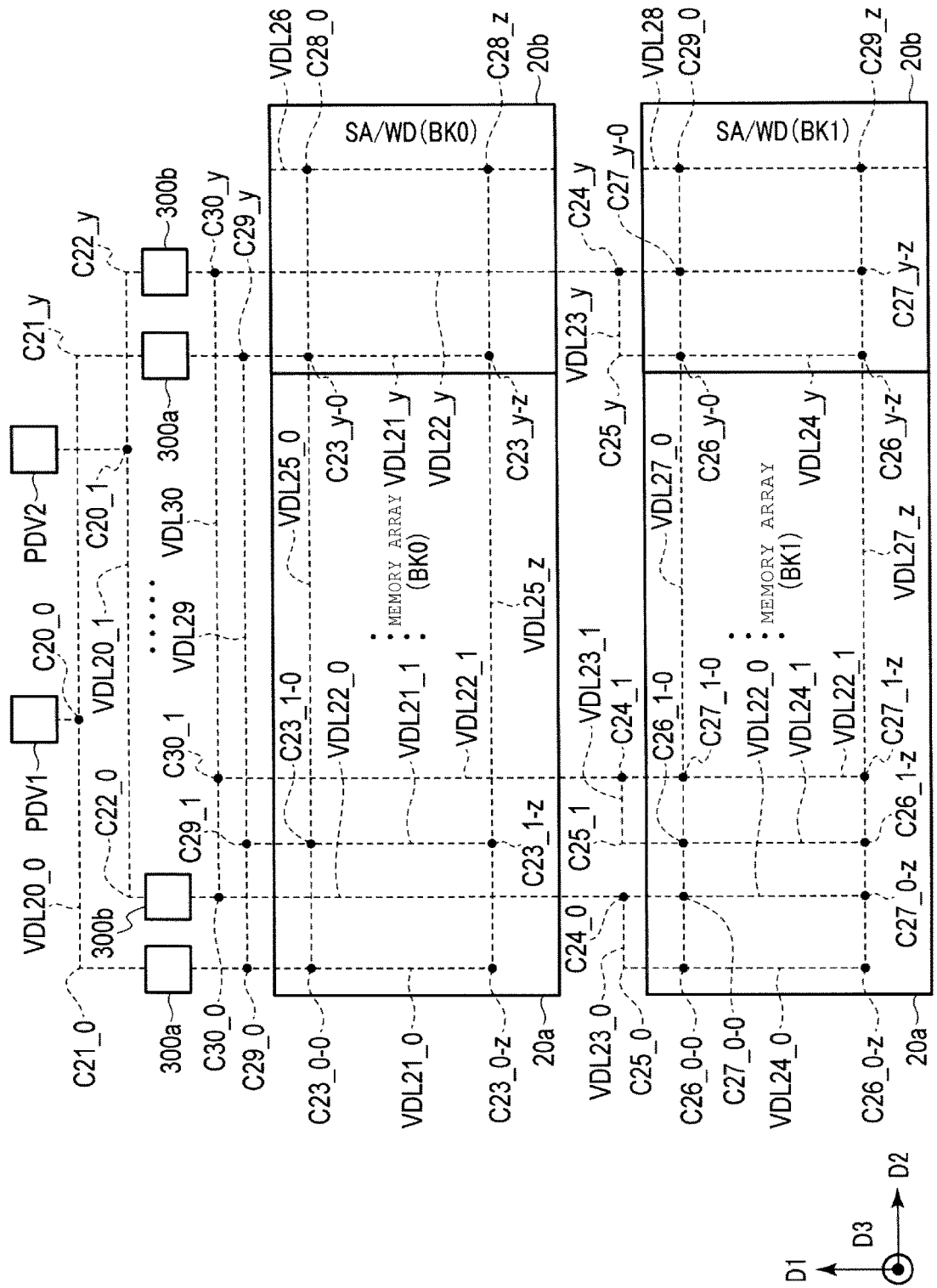
FIG. 27 is a layout diagram illustrating wiring of power source lines of a semiconductor memory device according to a modification example 5 of the second embodiment.

A layout illustrated in FIG. 27 may be employed. In FIG. 26, a single power source wiring VDL21 is connected to a single power supply circuit 300a. However, as illustrated in FIG. 27, a plurality of power source wirings VDL21 may be connected to a single power supply circuit 300a. Similarly, as illustrated in FIG. 27, a plurality of power source wirings VDL22 may be connected to a single power supply circuit 300b.

3 Third Embodiment

Description will be made on a third embodiment. In the third embodiment, a controller will be described. The basic operations of the semiconductor memory device according to the third embodiment are the same as those of the semiconductor memory device according to the first embodiment described above. Accordingly, description of the first embodiment that also applies to the second embodiment and matters that are capable of being easily analogized from the description of the first embodiment above will be omitted.

3-1 Controller

A controller of the semiconductor memory device according to the third embodiment will be described using FIG. 28.

Here, description will be made on the controller 16 that cuts a current path of a power source between the inside (e.g., semiconductor memory device) and the outside (e.g., memory controller), performs an operation up to a proper time point without using the power source voltage from the outside, and properly ends the operation at the time of instantaneous stopping of the memory controller.

Figure 28:
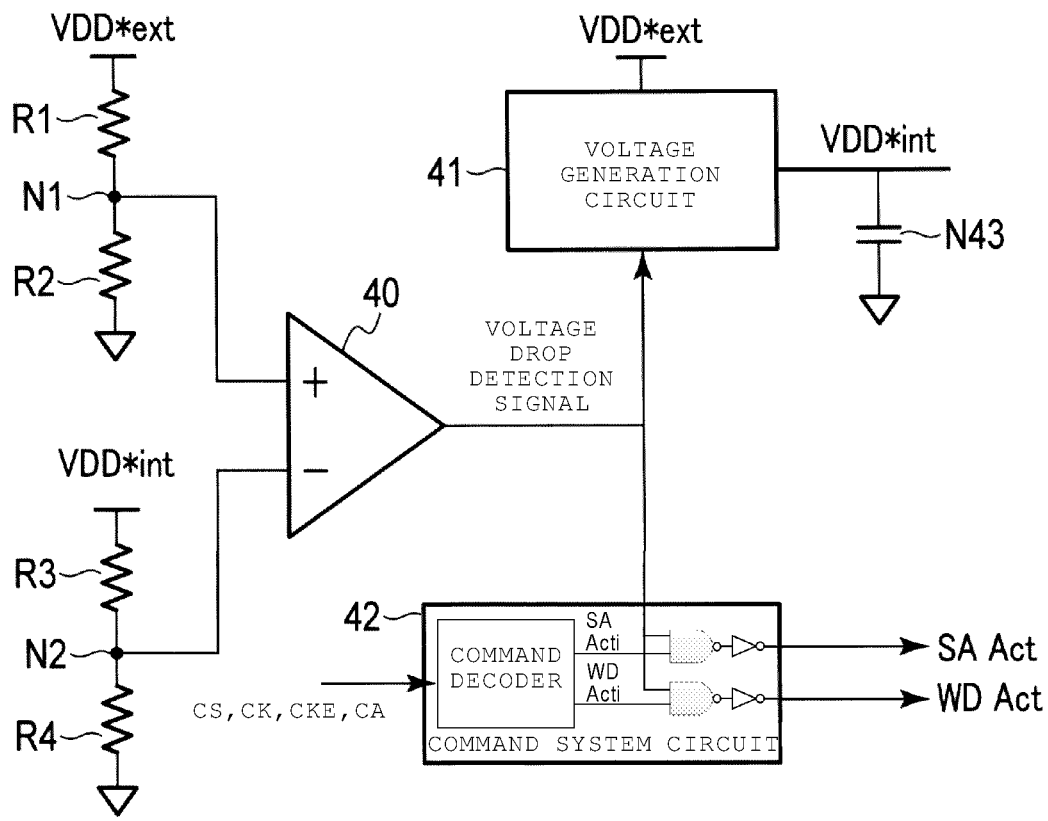
FIG. 28 is a block diagram illustrating a controller of a semiconductor memory device according to a third embodiment.

In FIG. 28, a portion of the controller 16 is illustrated. As illustrated in FIG. 28, the controller 16 includes a voltage drop detector 40, a voltage generation circuit 41, a command system circuit 42, and stabilizing capacitor 43.

In a case where it is determined that "internal voltage VDD*int<external voltage VDD*ext", the voltage drop detector 40 determines that the external voltage has not dropped. In contrast, in a case where it is determined that "external voltage VDD*ext<internal voltage VDD*int", the voltage drop detector 40 determines that the external voltage has dropped. In a case where it is determined that the external voltage has dropped, the voltage drop detector 40 supplies a voltage drop detection signal of "H" level to the voltage generation circuit 41 and the command system circuit 42. The internal voltage VDD*int is a voltage across the stabilizing capacitor 43. The external voltage VDD*ext is a voltage supplied from the memory controller 2. The external voltage VDD*ext is input to a non-inversion input terminal of the voltage drop detector 40 through a resistive element R1 and a node N1. The internal voltage VDD*int is input to an inversion input terminal of the voltage drop detector 40 through a resistive element R3 and a node N2.

The voltage generation circuit 41 generates the internal voltage VDD*int based on the external voltage VDD*ext. When the voltage drop detection signal of "H" level is received from the voltage drop detector 40, the voltage generation circuit 41 blocks a current path through which the external voltage VDD*ext is received. With this, the voltage generation circuit 41 is able to prevent the internal voltage VDD*int from flowing back to a power source pad which supplies the external voltage VDD*ext.

The stabilizing capacitor 43 is sized such that it holds a sufficient amount of charge to allow, for example, a single read (which includes first read operation, write operation, second read operation, determination operation) to be performed even when the external voltage VDD*ext is not supplied.

The command system circuit 42 generates a signal for causing the sense circuit 200 or a write driver to operate. When the voltage drop detection signal of "H" level is received from the voltage drop detector 40, the command system circuit 42 operates the semiconductor memory device 1 until the operation successfully completes. The command system circuit 42 operates so as block a command from being received until the operation successfully completes.

3-2 Operation 3-2-1 Normal Operation

Figure 29:
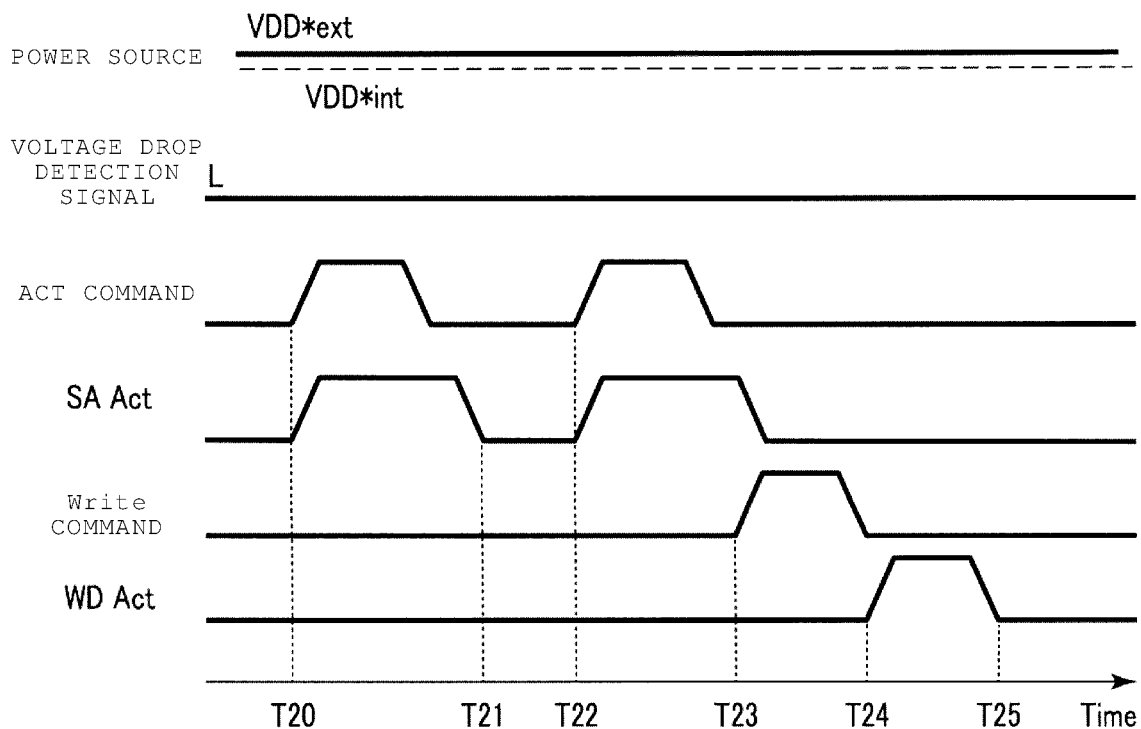
FIG. 29 is a waveform diagram illustrating waveforms of a read operation carried out normally in the semiconductor memory device according to the third embodiment.

A normal operation of the controller of the semiconductor memory device according to the third embodiment will be described using FIG. 29. In FIG. 29, the external voltage VDD*ext, the internal voltage VDD*int, an activate command (ACT) and a write command (Write) supplied from the memory controller 2, a voltage drop detection signal, a signal SA Act for causing the sense circuit 200 to operate, and a signal WD Act for causing the write driver to operate are illustrated. Description will be made on a case where the external voltage VDD*ext does not drop.

When the activate command is received from the memory controller 2, the controller 16 makes the signal SA Act go to the "H" level and operates the sense circuit 200 (time T20 to time T21). During the period of time T20 to time T21, when a read command is received from the memory controller 2, the controller 16 performs the first read operation.

Subsequently, when the activate command is received from the memory controller 2, the controller 16 makes the signal SA Act go to the "H" level and operates the sense circuit 200 (time T22 to time T23). Thereafter, when a write command is received from the memory controller 2, the controller 16 makes the signal WD Act go to the "H" level and operates the write driver (time T23 to time T25) to perform the write of "0".

Thereafter, the controller 16 performs the second read operation and then the determination operation to end the read.

3-2-2 Operation at the Time of Instantaneous Stopping

Figure 30:
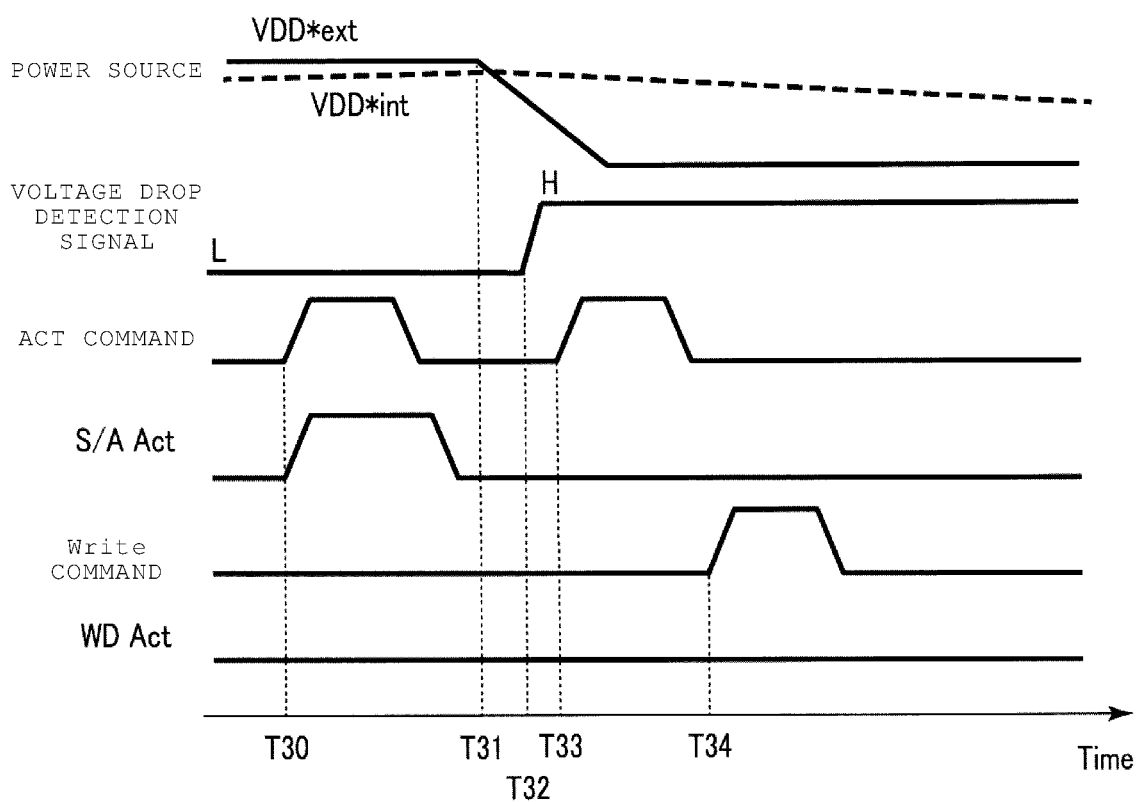
FIG. 30 is a waveform diagram illustrating waveforms of a read operation subject to instantaneous stopping in the semiconductor memory device according to the third embodiment.

An operation at the time of instantaneous stopping of the controller of the semiconductor memory device according to the third embodiment will be described using FIG. 30.

When the activate command is received from the memory controller 2, the controller 16 makes the signal SA Act go to the "H" level and operates the sense circuit 200 (time T30 to time T31). During the period of time T30 to time T31, when a read command is received from the memory controller 2, the controller 16 performs the first read operation.

At time T31, instantaneous stopping occurs and the external voltage VDD*ext drops. With this, at time T32, the voltage drop detector 40 detects drop of the external voltage VDD*ext and makes the voltage drop detection signal go to the "H" level. When the voltage drop detection signal of "H" level is received from the voltage drop detector 40, the command system circuit 42 operates the semiconductor memory device 1 until the operation successfully completes. At the time point of time T32, an operation to be performed next is the write operation of "0". The write operation of "0" is an operation to overwrite data of the memory cell MC and destroy data stored in the memory cell. For that reason, when the write operation of "0" is performed under the condition that the external voltage VDD*ext is not supplied to the semiconductor memory device 1 and the internal voltage VDD*int cannot be generated, there is a risk that data stored originally in the memory cell is lost. For that reason, the command system circuit 42 blocks the command from being received from the memory controller 2. With this, the controller 16 is able to prevent breakage of data stored in the memory cell. Here, although not illustrated, for example, when the external voltage VDD*ext drops after the write operation of "0", the command system circuit 42 controls such that a data write back operation is performed. With this, the controller 16 is able to prevent breakage of data stored in the memory cell.

3-3 Effect

According to the embodiment described above, the controller is configured to determine instantaneous stopping of the memory controller, cut the current path between the semiconductor memory device and the memory controller, and properly end the operation without using the power source voltage from the memory controller.

For that reason, it is possible to prevent breakage of data even in the semiconductor memory device for performing the read operation of the self-reference method.

4 Fourth Embodiment

Description will be made on a fourth embodiment. In the fourth embodiment, a write driver will be described. The basic operations of the semiconductor memory device according to the fourth embodiment are the same as those of the semiconductor memory device according to the first to third embodiments described above. Accordingly, description of the first to third embodiments that also applies to the second embodiment and matters that are capable of being easily analogized from the description of the first to third embodiments will be omitted.

4-1 Configuration 4-1-1 Sense Amplifier/Write Driver

The sense amplifier/write driver 20b of the semiconductor memory device according to the fourth embodiment will be described using FIG. 31.

Figure 31:
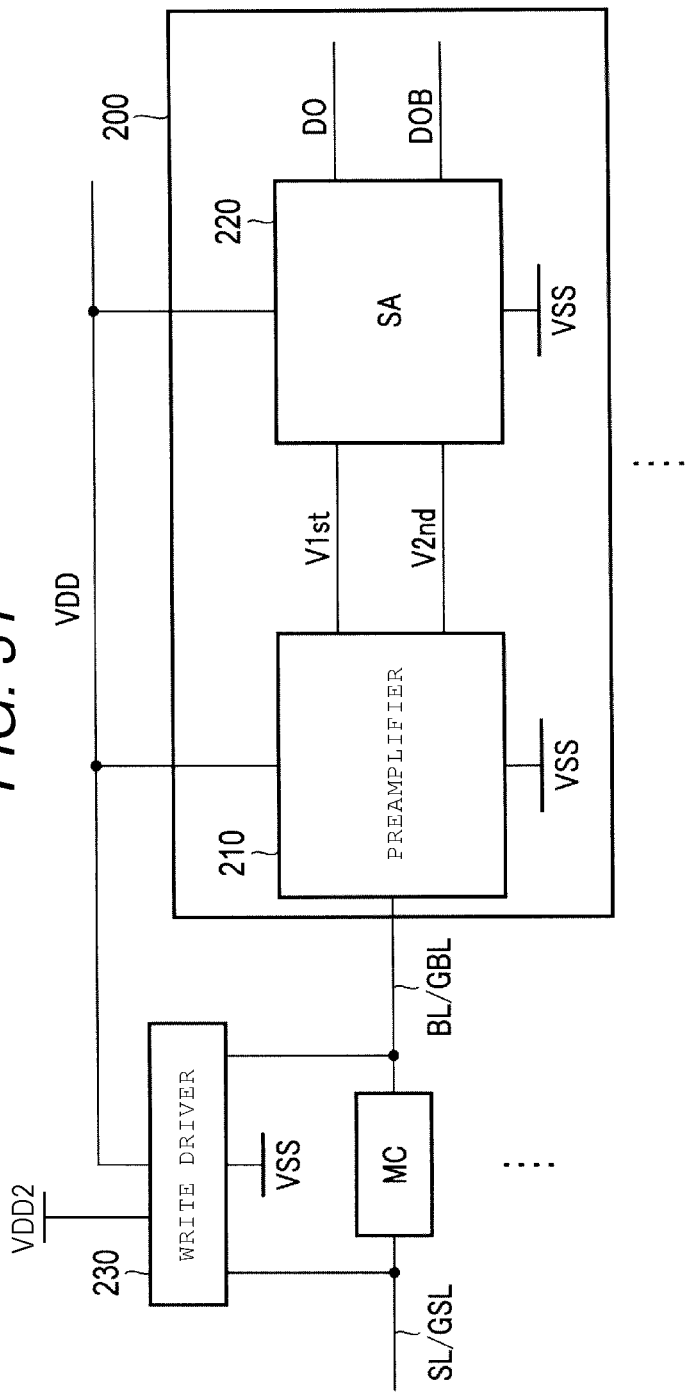
FIG. 31 is a block diagram illustrating a sense amplifier/write driver of a semiconductor memory device according to a fourth embodiment.

As illustrated in FIG. 31, the sense amplifier/write driver 20b includes the sense circuit 200 and the write driver 230 for each group of the global bit line and the global source line. The write driver 230 is connected to the global bit line and the global source line, and two power source voltages including the same voltage as the power source voltage VDD to be supplied to the pre-amplifier 210 and the sense amplifier 220 and power source voltage VDD2, are supplied to the write driver 230.

4-1-2 Memory Array and Write Driver

The memory array 20a described in the first embodiment will be described in more detail.

Figure 32:
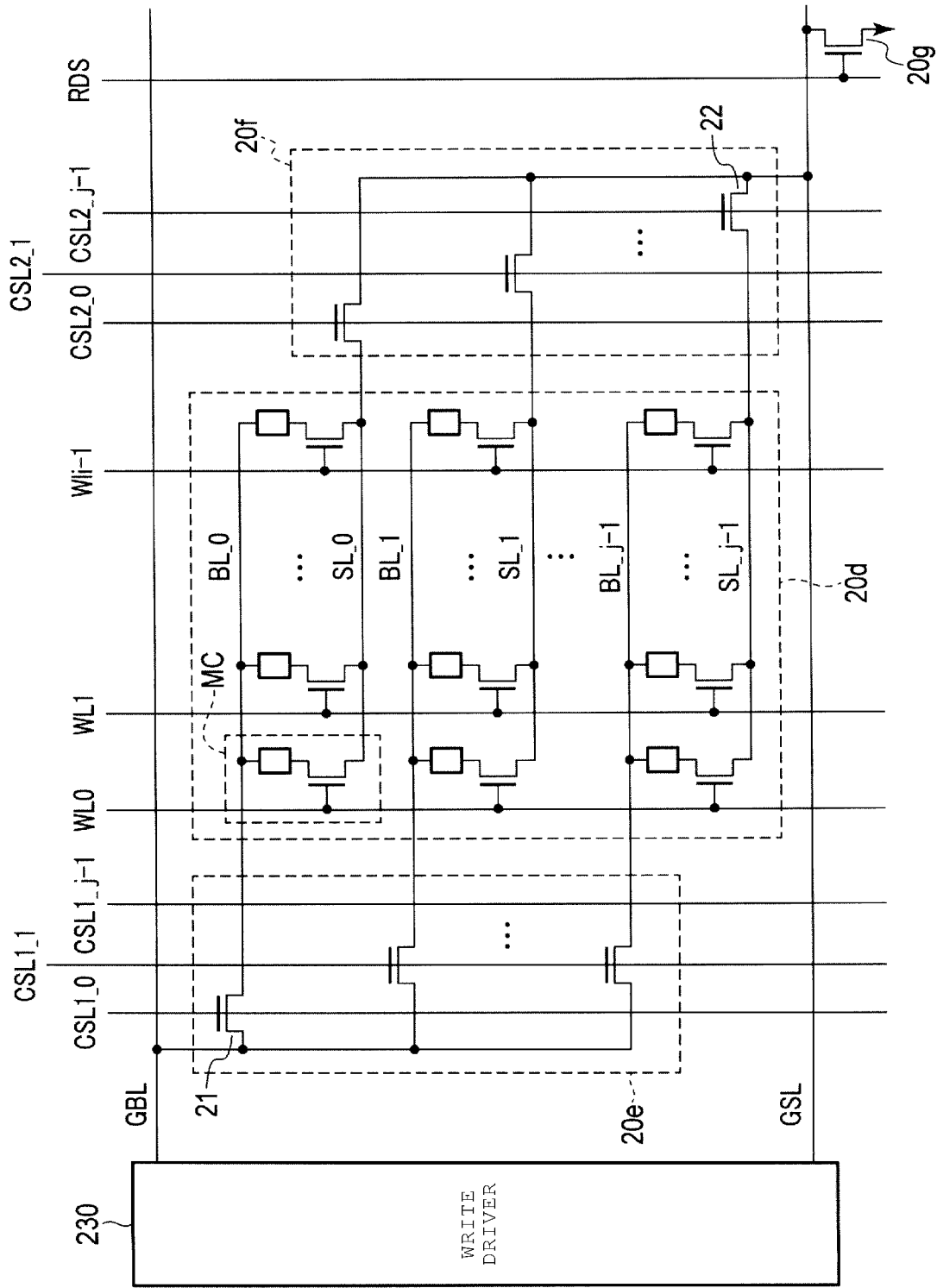
FIG. 32 is a circuit diagram illustrating a relationship between a memory array and a write driver of the semiconductor memory device according to the fourth embodiment.

As illustrated in FIG. 32, the memory array 20a includes a plurality of sub-memory areas (not illustrated). The sub-memory area includes a memory cell array 20d, a first column selection circuit 20e, a second column selection circuit 20f, and a read current sink 20g. Here, for simplicity, a group of the memory cell array 20d, the first column selection circuit 20e, the second column selection circuit 20f, and the read current sink 20g will be described.

Figure 2:
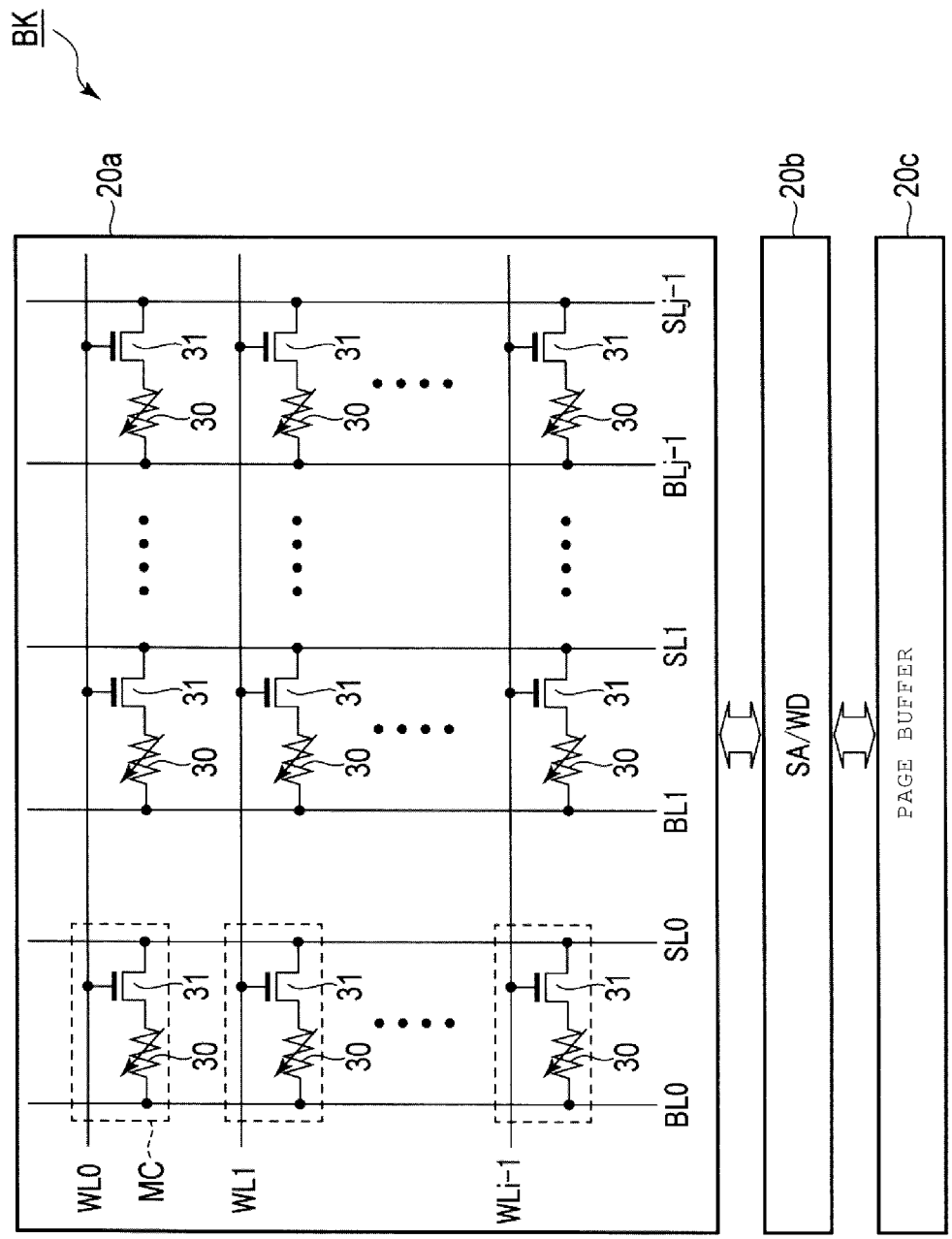
FIG. 2 is a block diagram illustrating a bank of the semiconductor memory device according to the first embodiment.

The configuration of the memory cell array 20d is the same as the memory array 20a described using FIG. 2 and thus, description thereof will be omitted.

The first column selection circuit 20e is connected to the memory cell array 20d through a plurality of bit lines BL_0 to BL_j−1. The bit line BL is selected based on first column selection signals CSL1_0 to CSL1_j−1 received from the column decoder 12. In the following description where the first column selection signals CSL1_0 to CSL1_j−1 are not distinguished from one another, the first column selection signal is simply referred to as CSL1.

The first column selection circuit 20e includes a transistor 21 of which one end is connected to each bit line BL. The other end of the transistor 21 is connected to the global bit line GBL and each of the column selection signals CSL1_0 to CSL1_j−1 is connected to a gate electrode thereof.

The second column selection circuit 20f is connected to the memory cell array 20d through a plurality of source line SL_0 to SL_j−1. The source line SL is selected based on second column selection signal CSL2_0 to CSL2_j−1 received from the column decoder 12. In the following description where the second column selection signal CSL2_0 to CSL2_j−1 are not distinguished from one another, the second column selection signal is simply referred to as CSL2.

The second column selection circuit 20f includes a transistor 22 of which one end is connected to each source line SL. The other end of the transistor 22 is connected to the global source line GSL and each of the column selection signals CSL2_0 to CSL2_j−1 is connected to a gate electrode thereof.

The read current sink 20g is connected to the second column selection circuit 20f through the global source line GSL. The read current sink 20g drives a voltage of any source line SL to VSS based on a control signal RDS received from the controller 16 and the column decoder 12.

The write driver 230 is connected to the first column selection circuit 20e through the global bit line GBL. The write driver 230 is connected to the second column selection circuit 20f through the global source line GSL. The write driver 230 causes the current to flow in the memory cell MC connected to the selected word line WL based on the control signal received from the controller 16 and write data received through the IO circuit 17 and allows data to be written.

4-1-3 Write Driver

The write driver 230 of the semiconductor memory device according to the fourth embodiment will be described using FIG. 33.

Figure 33:
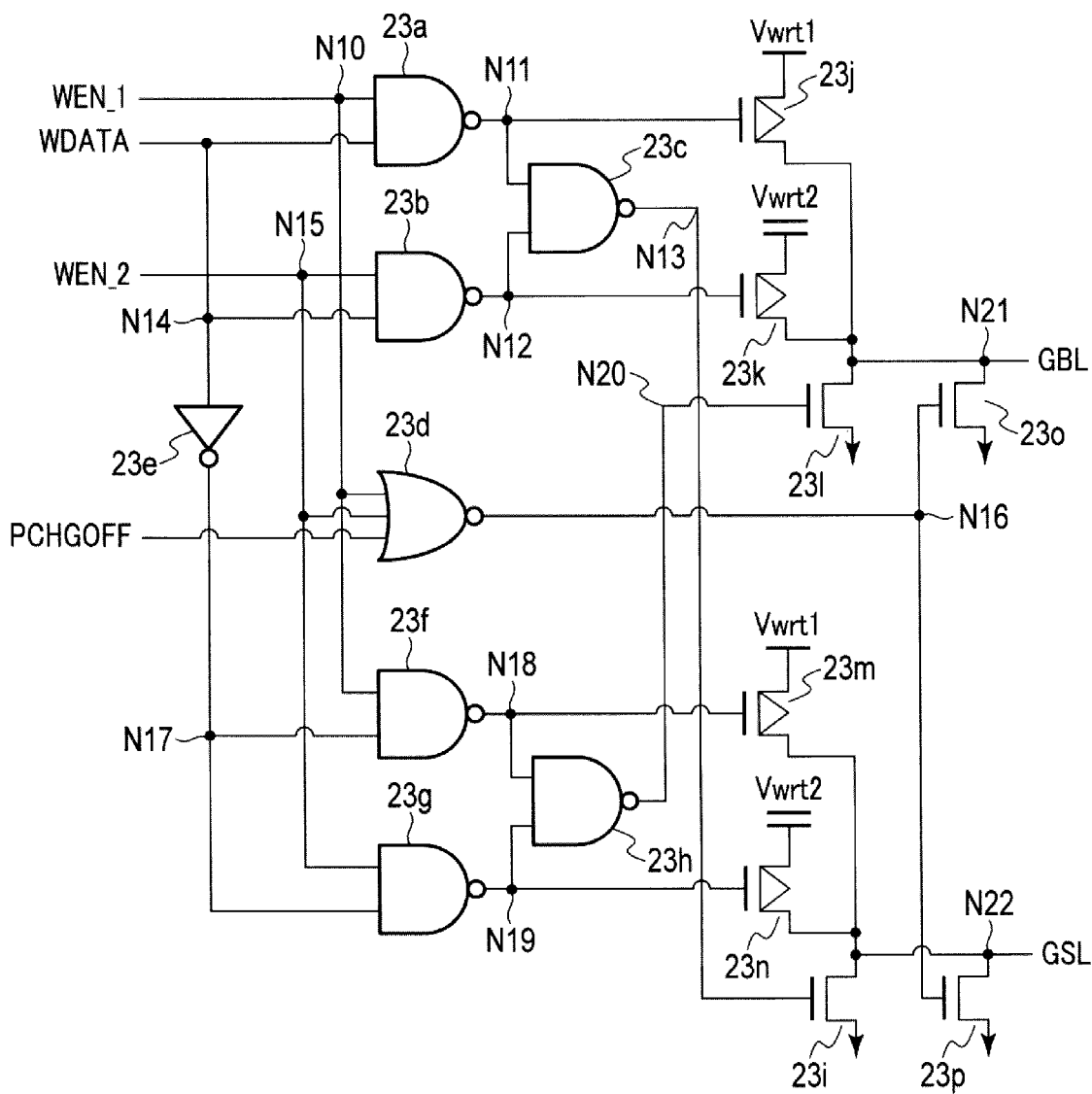
FIG. 33 is a circuit diagram illustrating the write driver of the semiconductor memory device according to the fourth embodiment.

As illustrated in FIG. 33, the write driver 230 includes NAND operation circuits 23a, 23b, 23c, 23f, 23g, and 23h, a NOR operation circuit 23d, an inverter 23e, PMOS transistors 23j, 23k, 23m, and 23n, NMOS transistors 23i, 23l, 23o, and 23p.

The NAND operation circuit 23a receives a signal WEN_1 (which is a write enable signal) through a first input terminal, receives a signal WDATA (which contains write data) through a second input terminal, and outputs a NAND operation result of the signal WEN_1 and the signal WDATA to a node N11. The signal WEN_1 is supplied from the controller 16. The signal WDATA is supplied from the IO circuit 17.

The NAND operation circuit 23b receives a signal WEN_2 (which is a write enable signal) through a first input terminal and receives the signal WDATA through a second input terminal, and outputs a NAND operation result of the signal WEN_2 and the signal WDATA to a node N12. The signal WEN_2 is supplied from the controller 16.

The NAND operation circuit 23c receives an output signal of the NAND operation circuit 23a through a first input terminal, receives an output signal of the NAND operation circuit 23b through a second input terminal, and outputs a NAND operation result of the received signals to a node N13.

The NOR operation circuit 23d receives the signal WEN_1 through a first input terminal, receives the signal WEN_2 through a second input terminal, receives a PCHGOFF (which is a pre-charge off signal) through a third input terminal, and outputs a NOR operation result of the signal WEN_1, the signal WEN_2, and the signal PCHGOFF to a node N16.

The inverter 23e outputs a signal BWDATA obtained by inverting the signal WDATA to a node N17.

The NAND operation circuit 23f receives a signal WEN_1 through a first input terminal, receives the signal BWDATA through a second input terminal, and outputs a NAND operation result of the signal WEN_1 and the signal BWDATA to a node N18.

The NAND operation circuit 23g receives the signal WEN_2 through a first input terminal and receives the signal BWDATA through a second input terminal, and outputs a NAND operation result of the signal WEN_2 and the signal BWDATA to a node N19.

The NAND operation circuit 23h receives an output signal of the NAND operation circuit 23f through a first input terminal, receives an output signal of the NAND operation circuit 23g through a second input terminal, and outputs a NAND operation result of the received signals to a node N20.

The PMOS transistor 23j supplies a voltage Vwrt1 to a node N21 (which is a node of global bit line GBL) based on the output signal of the NAND operation circuit 23a. The voltage Vwrt1 corresponds to the voltage VDD used in the sense circuit 200 and may also be applied in the power source wiring layout described in the first embodiment or the second embodiment. The PMOS transistor 23j is used as a transistor for charging the global bit line GBL.

The PMOS transistor 23k supplies a voltage Vwrt2 to the node N21 based on the output signal of the NAND operation circuit 23b. The voltage Vwrt2 is, for example, a voltage dedicated to the write driver 230 and is depicted in FIG. 31 as VDD2. The voltage Vwrt2 is a voltage of which impedance from the power source pad is higher than the voltage Vwrt1. Here, a level of the voltage value between the voltage Vwrt1 and the voltage Vwrt2 is not defined. However, effect to be described later can be obtained irrespective of a magnitude relationship of a voltage value between the voltage Vwrt1 and the voltage Vwrt2.

The NMOS transistor 23l discharges the node N21 based on the output signal of the NAND operation circuit 23h.

The NMOS transistor 23o discharges the node N21 based on the output signal of the NOR operation circuit 23d.

The PMOS transistor 23m supplies a voltage Vwrt1 to a node N22 (which is a node of global source line GSL) based on the output signal of the NAND operation circuit 23f. The PMOS transistor 23m is used as a transistor for charging the global source line GSL.

The PMOS transistor 23n supplies a voltage Vwrt2 to the node N22 based on the output signal of the NAND operation circuit 23g.

The NMOS transistor 23i discharges the node N22 based on the output signal of the NAND operation circuit 23c.

The NMOS transistor 23p discharges the node N22 based on the output signal of the NOR operation circuit 23d.

4-2 Operation

Next, description will be made on waveforms at the time of write operation of the semiconductor memory device according to the fourth embodiment using FIG. 34. Here, a write operation to be described in this section does not correspond to a write operation to be performed at the time of the read operation described above, but correspond to a general write operation. The write operation may also correspond to the write operation to be performed at the time of the read operation. Description will be made by using a case where voltages of bit lines BL and source lines SL are set as the VSS in a period during which a write operation to and a read operation with respect to a cell are not performed.

[time T40] to [time T41]

The row decoder 14 makes a voltage of the word line WL go to a "L" level. The column decoder 13 makes the voltages of the signals CSL1 and CSL2 go to the "L" level. The controller 16 makes the voltages of the signals WEN1 and WEN2 go to the "L" level and makes the signal PCHGOFF (not illustrated) go to the "L" level.

Here, operations of the write driver 230 will be described using FIG. 33.

The NAND operation circuit 23*a* supplies the signal of "H" level based on received signals. Similarly, the NAND operation circuit 23*b* supplies the signal of "H" level based on received signals. The NAND operation circuit 23*c* supplies the signal of "H" level based on received signals. The NOR operation circuit 23*d* supplies the signal of "H" level based on received signals. The NAND operation circuit 23*f* supplies the signal of "H" level based on received signals. Similarly, the NAND operation circuit 23*g* supplies the signal of "H" level based on received signals. The NAND operation circuit 23*h* supplies the signal of "L" level based on received signals.

With this, the PMOS transistors 23*j*, 23*k*, 23*m*, and 23*n* and the NMOS transistors 23*i* and 23*l* enter the OFF state and the NMOS transistors 23*o* and 23*p* enter the ON state. As a result, the global bit line GBL and the global source line GSL are discharged.

[time T41] to [time T42]

The row decoder 14 makes a voltage of the selected word line WL go to a "H" level according to a row address. The column decoder 13 makes the voltages of the selected signal CSL1 and selected signal CSL2 go to the "H" level according to a column address.

[time T42] to [time T43]

The controller 16 makes a voltage of the signal WEN1 go to the "H" level. At this time point, the signal WDATA is also input. In a case where it is intended to write data of "1" into the memory cell MC, the signal WDATA becomes "H" level. In a case where it is intended to write data of "0" into the memory cell MC, the signal WDATA becomes "L" level.

Here, the operation of the write driver 230 in a case where the signal WDATA is the "H" level (a case of WDATA=1) will be described.

As illustrated in FIG. 33, the NAND operation circuit 23*a* supplies the signal of "L" level based on received signals. The NAND operation circuit 23*b* supplies the signal of "H" level based on received signals. The NAND operation circuit 23*c* supplies the signal of "H" level based on received signals. The NOR operation circuit 23*d* supplies the signal of "L" level based on received signals. The NAND operation circuit 23*f* supplies the signal of "H" level based on received signals. Similarly, the NAND operation circuit 23*g* supplies the signal of "H" level based on received signals. The NAND operation circuit 23*h* supplies the signal of "L" level based on received signals.

With this, the PMOS transistor 23*j* and the NMOS transistor 23*i* enter the ON state. As a result, the voltage Vwrt1 is applied to the global bit line GBL and the global source line GSL is discharged.

Figure 34:
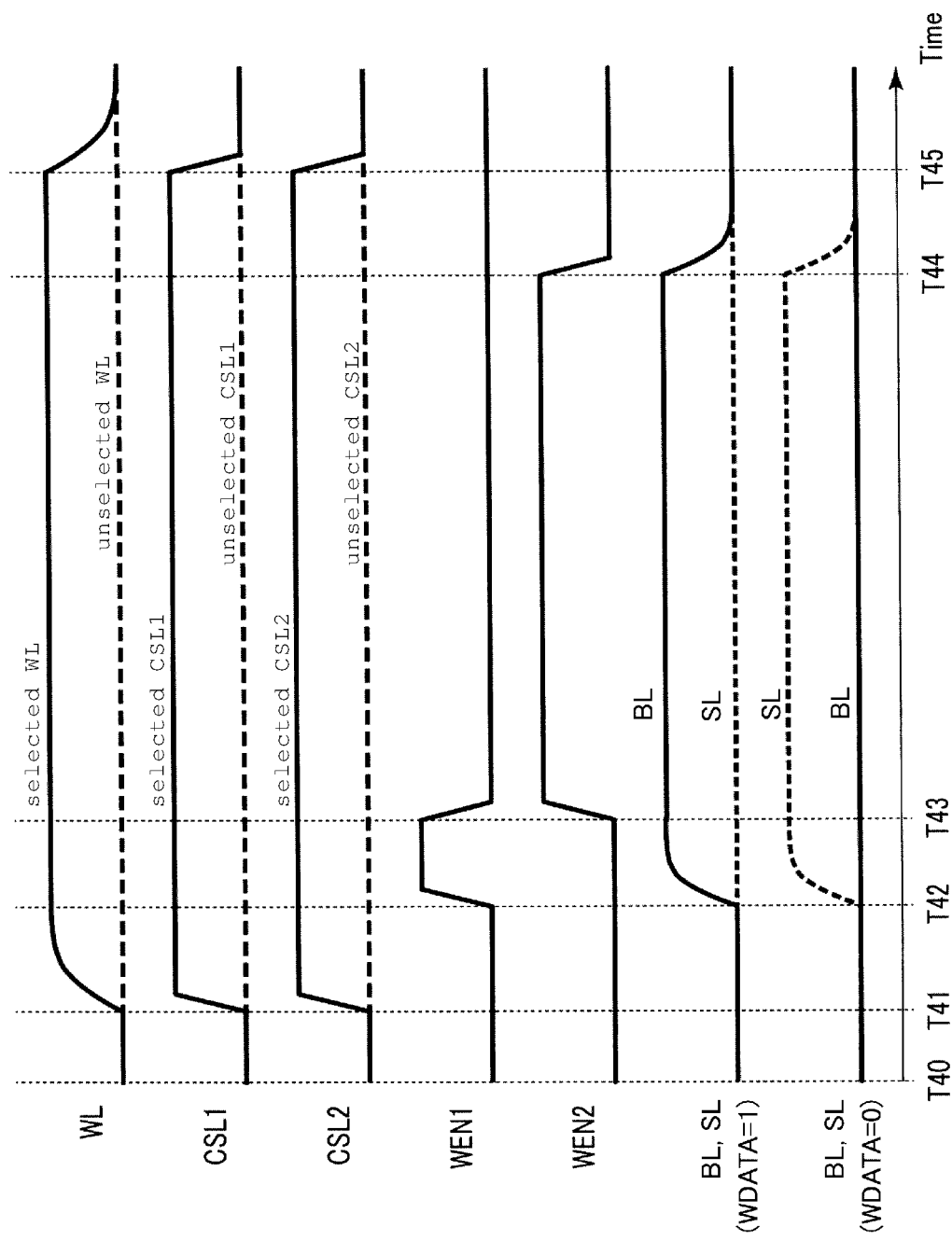
FIG. 34 is a waveform diagram illustrating waveforms in a write operation of the semiconductor memory device according to the fourth embodiment.

With this, as illustrated in FIG. 34, the selected bit line BL is charged to the "H" level and the source line SL becomes the "L" level.

The voltage Vwrt1 is a voltage of which impedance from the power source pad is lower than that of the voltage Vwrt2 and thus, the selected bit line BL is charged at a high speed.

The operation of the write driver 230 in a case where the signal WDATA is the "L" level (a case of WDATA=0) will be described.

As illustrated in FIG. 33, the NAND operation circuit 23*a* supplies the signal of "H" level based on received signals. The NAND operation circuit 23*b* supplies the signal of "H" level based on received signals. The NAND operation circuit 23*c* supplies the signal of "L" level based on received signals. The NOR operation circuit 23*d* supplies the signal of "L" level based on received signals. The NAND operation circuit 23*f* supplies the signal of "L" level based on received signals. The NAND operation circuit 23*g* supplies the signal of "H" level based on received signals. The NAND operation circuit 23*h* supplies the signal of "H" level based on received signals.

With this, the PMOS transistor 23*m* and the NMOS transistor 23*l* enter the ON state. As a result, the voltage Vwrt1 is applied to the global source line GSL and the global bit line GBL is discharged.

With this, as illustrated in FIG. 34, the selected source line SL is charged to the "H" level and the bit line BL becomes the "L" level.

The voltage Vwrt1 is a voltage of which impedance from the power source pad is lower than that of the voltage Vwrt2 and thus, the selected source line SL is charged at a high speed.

[time T43] to [time T44]

The controller 16 makes the voltage of the signal WEN1 go to the "L" level and makes the voltage of the signal WEN2 go to the "H" level.

Here, the operation of the write driver 230 in the case where the signal WDATA is the "H" level (a case of WDATA=1) will be described.

As illustrated in FIG. 33, the NAND operation circuit 23*a* supplies the signal of "H" level based on received signals. The NAND operation circuit 23*b* supplies the signal of "L" level based on received signals. The NAND operation circuit 23*c* supplies the signal of "H" level based on received signals. The NOR operation circuit 23*d* supplies the signal of "L" level based on received signals. The NAND operation circuit 23*f* supplies the signal of "H" level based on received signals. Similarly, the NAND operation circuit 23*g* supplies the signal of "H" level based on received signals. The NAND operation circuit 23*h* supplies the signal of "L" level based on received signals.

With this, the PMOS transistor 23*k* and the NMOS transistor 23*i* enter the ON state. As a result, the voltage Vwrt2 is applied to the global bit line GBL and the global source line GSL is discharged.

With this, as illustrated in FIG. 34, the selected bit line BL maintains the "H" level and the source line SL becomes the "L" level.

The voltage Vwrt2 is a voltage of which impedance from the power source pad is higher than the voltage Vwrt1 but the selected bit line BL is already charged at time T42 to time T43. For that reason, even when it is switched to a voltage of which impedance from the power source pad is high at time T43 to time T44, the voltage drop accompanying charging of the global source line GSL and source line SL does not occur. Accordingly, the write operation to the memory cell is not influenced.

The operation of the write driver 230 in the case where (the case of WDATA=0) the signal WDATA is the "L" level will be described.

As illustrated in FIG. 33, the NAND operation circuit 23a supplies the signal of "H" level based on received signals. The NAND operation circuit 23b supplies the signal of "H" level based on received signals. The NAND operation circuit 23c supplies the signal of "L" level based on received signals. The NOR operation circuit 23d supplies the signal of "L" level based on received signals. The NAND operation circuit 23f supplies the signal of "H" level based on received signals. The NAND operation circuit 23g supplies the signal of "L" level based on received signals. The NAND operation circuit 23h supplies the signal of "H" level based on received signals.

With this, the PMOS transistor 23n and the NMOS transistor 23l enter the ON state. As a result, the voltage Vwrt2 is applied to the global source line GSL and the global bit line GBL is discharged.

With this, as illustrated in FIG. 34, the selected bit source line SL maintains the "H" level and the bit line BL becomes the "L" level.

The voltage Vwrt2 is the voltage of which impedance from the power source pad is higher than the voltage Vwrt1 but the selected source line SL already charged during time T42 to time T43. For that reason, even when it is switched to a voltage of which impedance from the power source pad is high during time T43 to time 144, the voltage drop accompanying charging of the global source line GSL and the source line SL does not occur. Accordingly, the write operation to the memory cell is not influenced.

[time T44] to [time T45]

The controller 16 makes the voltage of the signal WEN2 go to the "L" level to end the write operation. The NOR operation circuit 23d supplies the signal of "L" level based on the received signals. With this, the NMOS transistors 23o and 23p enter the ON state. As a result, the global bit line GBL and the global source line GSL are discharged.

4-3 Effect

4-3-1 Outline

According to embodiment described above, the global bit line GBL or the global source line GSL is charged by a first power source of which impedance from the first power source pad is relatively low in a first period during which the global bit line GBL or the global source line GSL is charged. After the global bit line GBL or the global source line GSL is charged and in the write operation period, the voltage of the global bit line GBL or the global source line GSL is maintained at a second power source of which impedance from the first power source pad is higher than the first power source. With this, it is possible to properly perform the write operation.

4-3-2 Comparative Example

Here, a comparative example will be described in order to make it easy to understand effect of the embodiment described above.

4-3-2-1 Write Driver

The write driver 230 of a semiconductor memory device according to a comparative example of the fourth embodiment will be described using FIG. 35.

Figure 35:
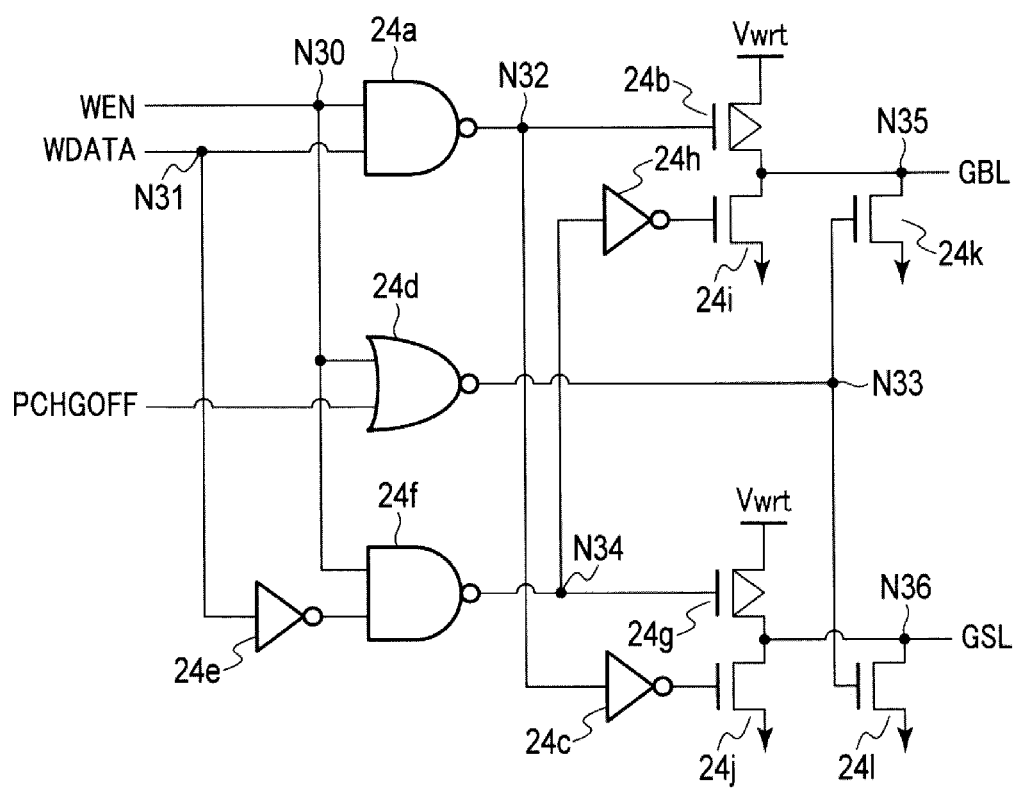
FIG. 35 is a circuit diagram illustrating a write driver of a semiconductor memory device according to a comparative example of the fourth embodiment.

As illustrated in FIG. 35, the write driver 230 includes NAND operation circuits 24a and 24f, a NOR operation circuit 24d, inverters 24c, 24e, and 24h, PMOS transistors 24b and 24g, and NMOS transistors 24i, 24j, 24k, and 24l.

The NAND operation circuit 24a receives a signal WEN (which is a write enable signal) through a first input terminal, receives a signal WDATA through a second input terminal, and outputs a NAND operation result of the signal WEN and the signal WDATA to a node N32.

The inverter 24c outputs a signal obtained by inverting the output signal of the NAND operation circuit 24a.

The NOR operation circuit 24d receives the signal WEN through a first input terminal, receives a PCHGOFF through a second input terminal, and outputs a NOR operation result of the signal WEN and the signal PCHGOFF a node N33.

The inverter 24e outputs a signal BWDATA obtained by inverting the signal WDATA.

The NAND operation circuit 24f receives the signal WEN through a first input terminal, receives the signal BWDATA through a second input terminal, and outputs a NAND operation result of the signal WEN and the signal BWDATA to a node N34.

The inverter 24h outputs a signal obtained by inverting the output signal of the NAND operation circuit 24f.

The PMOS transistor 24b supplies a voltage Vwrt to a node N35 (which is a node of global bit line GBL) based on the output signal of the NAND operation circuit 24a. The voltage Vwrt corresponds to the voltage Vwrt2 of the embodiment described above.

The NMOS transistor 24i discharges the node N35 based on the output signal of the inverter 24h.

The NMOS transistor 24k discharges the node N35 based on the output signal of the NOR operation circuit 24d.

The PMOS transistor 24g supplies the voltage Vwrt to a node N36 (which is a node of global source line GSL) based on the output signal of the NAND operation circuit 24f.

The NMOS transistor 24j discharges the node N36 based on the output signal of the inverter 24c.

The NMOS transistor 24l discharges the node N36 based on the output signal of the NOR operation circuit 24d.

4-3-2-2 Operation

Figure 36:
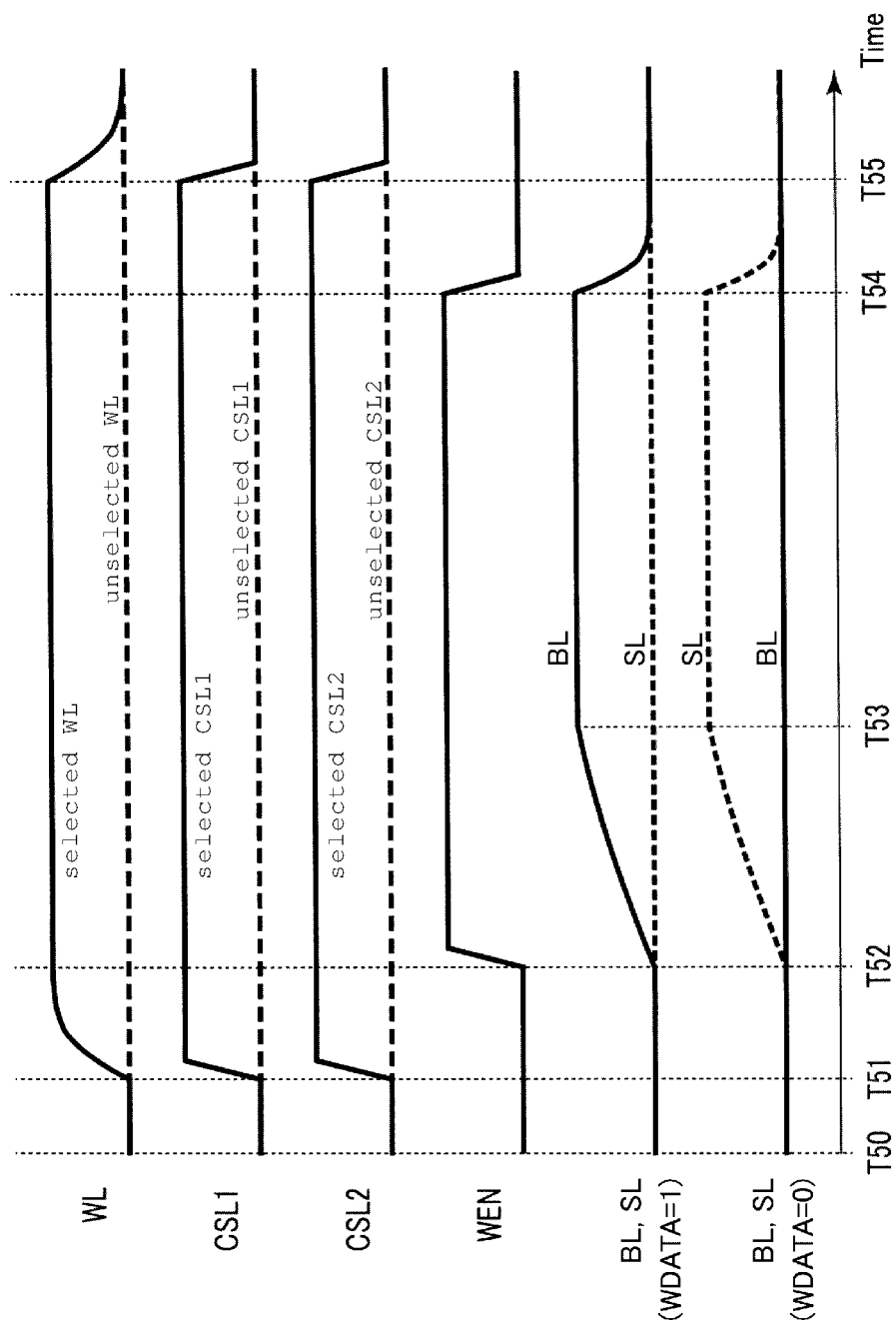
FIG. 36 is a waveform diagram illustrating waveforms in a write operation of the semiconductor memory device according to the comparative example of the fourth embodiment.

Here, description will be made on waveforms in (=at the time of) a write operation of the semiconductor memory device according to the fourth embodiment using FIG. 36. Description will be made by using a case where voltages of bit lines BL and source lines SL are set as the VSS in a period during which a write operation with respect to a cell and a read operation are not performed.

[time T50] to [time T51]

The row decoder 14 makes a voltage of the word line WL go to a "L" level. The column decoder 13 makes the voltages of the signals CSL1 and CSL2 go to the "L" level. The controller 16 makes the voltage of the signals WEN go to the "L" level and makes the signal PCHGOFF (not illustrated) go to the "L" level.

Here, operations of the write driver 230 will be described using FIG. 35.

The NAND operation circuit 24a supplies the signal of "H" level based on the received signals. The NOR operation circuit 24d supplies the signal of "H" level based on the received signals. The NAND operation circuit 24f supplies the signal of "H" level based on the received signals.

With this, the NMOS transistors 24i and 24j enter the OFF state and the NMOS transistors 24k and 24l enter the ON state. As a result, the global bit line GBL and the global source line GSL are discharged.

[time T51] to [time T52]

The row decoder 14 makes a voltage of the selected word line WL go to a "H" level according to a row address. The column decoder 13 makes the voltages of the selected signal CSL1 and selected signal CSL2 go to the "H" level according to a column address.

[time T52] to [time T53]

The controller 16 makes a voltage of the signal WEN go to the "H" level. At this time point, the signal WDATA is also input.

Here, the operation of the write driver 230 in a case where the signal WDATA is the "H" level (a case of WDATA=1) will be described.

As illustrated in FIG. 35, the NAND operation circuit 24a supplies the signal of "L" level based on the received signals. The NOR operation circuit 24d supplies the signal of "L" level based on the received signals. The NAND operation circuit 24f supplies the signal of "H" level based on the received signals.

With this, the PMOS transistor 24b and the NMOS transistor 24j enter the ON state. As a result, the voltage Vwrt is applied to the global bit line GBL and the global source line GSL is discharged.

A wiring length of the global bit line GBL is long and the capacitance thereof is large. For that reason, in a case where the global bit line GBL is charged with the voltage Vwrt having the same impedance from the power source pad as that of the voltage Vwrt2 described above, there is a possibility of a voltage drop of the voltage Vwrt due to the current peak. As a result, as illustrated in FIG. 36, there is a possibility that a charging time of the global bit line GBL becomes long. In this case, there is a possibility that an effective writing time to the memory cell MC is reduced and defective writing is caused.

The operation of the write driver 230 in a case where the signal WDATA is the "L" level (a case of WDATA=0) will be described.

As illustrated in FIG. 35, the NAND operation circuit 24a supplies the signal of "H" level based on the received signals. The NOR operation circuit 24d supplies the signal of "L" level based on the received signals. The NAND operation circuit 24f supplies the signal of "L" level based on the received signals.

With this, the PMOS transistor 24g and the NMOS transistor 24i enter the ON state. As a result, the voltage Vwrt is applied to the global source line GSL and the global bit line GBL is discharged.

Also, in a case where the signal WDATA is the "L" level, the same problem as that described above is likely to occur.

4-3-3 Summary

According to the embodiment described above, the global bit line GBL or the global source line GSL is charged using the voltage of which impedance from the power source pad is low in the first period during which the global bit line GBL or the global source line GSL is charged. The power source of which impedance from the power source pad is low is not influenced by the voltage drop due to the peak of a charging current described above, in the first period. For that reason, it is possible to charge the global bit line GBL or the global source line GSL at a high speed. With this, it is possible to suppress the increase of the ratio of defective writing caused by the voltage drop. Furthermore, as described in the first to third embodiments, the power source noise is minimally propagated between different banks. For that reason, it is possible to suppress operational malfunction due to the power source noise of another bank.

4-4 Modification Example 4-4-1 Write Driver

The write driver 230 of the semiconductor memory device according to the modification example of the fourth embodiment will be described using FIG. 37.

Figure 37:
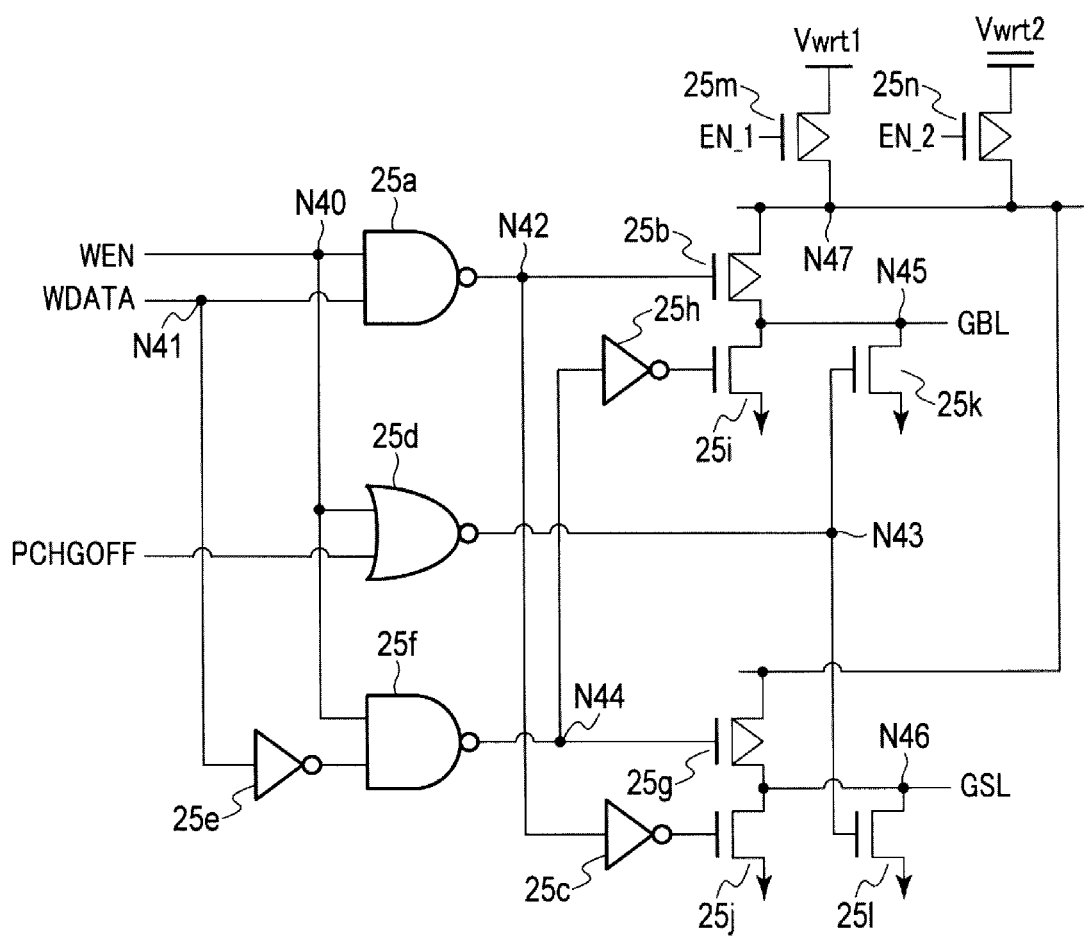
FIG. 37 is a circuit diagram illustrating a write driver of a semiconductor memory device according to a modification example of the fourth embodiment.

As illustrated in FIG. 37, the write driver 230 includes NAND operation circuits 25a, and 25f, a NOR operation circuit 25d, inverters 25c, 25e, and 25h, PMOS transistors 25b, 25g, 25m, and 25n, and NMOS transistors 25i, 25j, 25k, and 25l.

The NAND operation circuit 25a receives a signal WEN through a first input terminal, receives a signal WDATA through a second input terminal, and outputs a NAND operation result of the signal WEN and the signal WDATA to a node N42. The signal WEN is supplied from the controller 16.

The inverter 25c outputs a signal obtained by inverting the output signal of the NAND operation circuit 25a.

The NOR operation circuit 25d receives the signal WEN through a first input terminal, receives a PCHGOFF through a second input terminal, and outputs a NOR operation result of the signal WEN and the signal PCHGOFF to a node N43.

The inverter 25e outputs a signal BWDATA obtained by inverting the signal WDATA.

The NAND operation circuit 25f receives the signal WEN through a first input terminal, receives the signal BWDATA through a second input terminal, and outputs a NAND operation result of the signal WEN and the signal BWDATA to a node N44.

The inverter 25h outputs a signal obtained by inverting the output signal of the NAND operation circuit 25f.

The PMOS transistor 25m supplies a voltage Vwrt1 to a node N47 based on a signal EN_1.

The PMOS transistor 25n supplies a voltage Vwrt2 to a node N47 based on a signal EN_2.

The PMOS transistor 25b supplies the voltage Vwrt1 or Vwrt2 to a node N45 (which is a node of global bit line GBL) based on the output signal of the NAND operation circuit 25a.

The NMOS transistor 25i discharges the node N45 based on the output signal of the inverter 25h.

The NMOS transistor 25k discharges the node N45 based on the output signal of the NOR operation circuit 25d.

The PMOS transistor 25g supplies the voltage Vwrt1 or Vwrt2 to a node N46 (which is a node of global source line GSL) based on the output signal of the NAND operation circuit 25f.

The NMOS transistor 25j discharges the node N46 based on the output signal of the inverter 25c.

The NMOS transistor 25l discharges the node N46 based on the output signal of the NOR operation circuit 25d.

4-4-2 Operation

Figure 38:
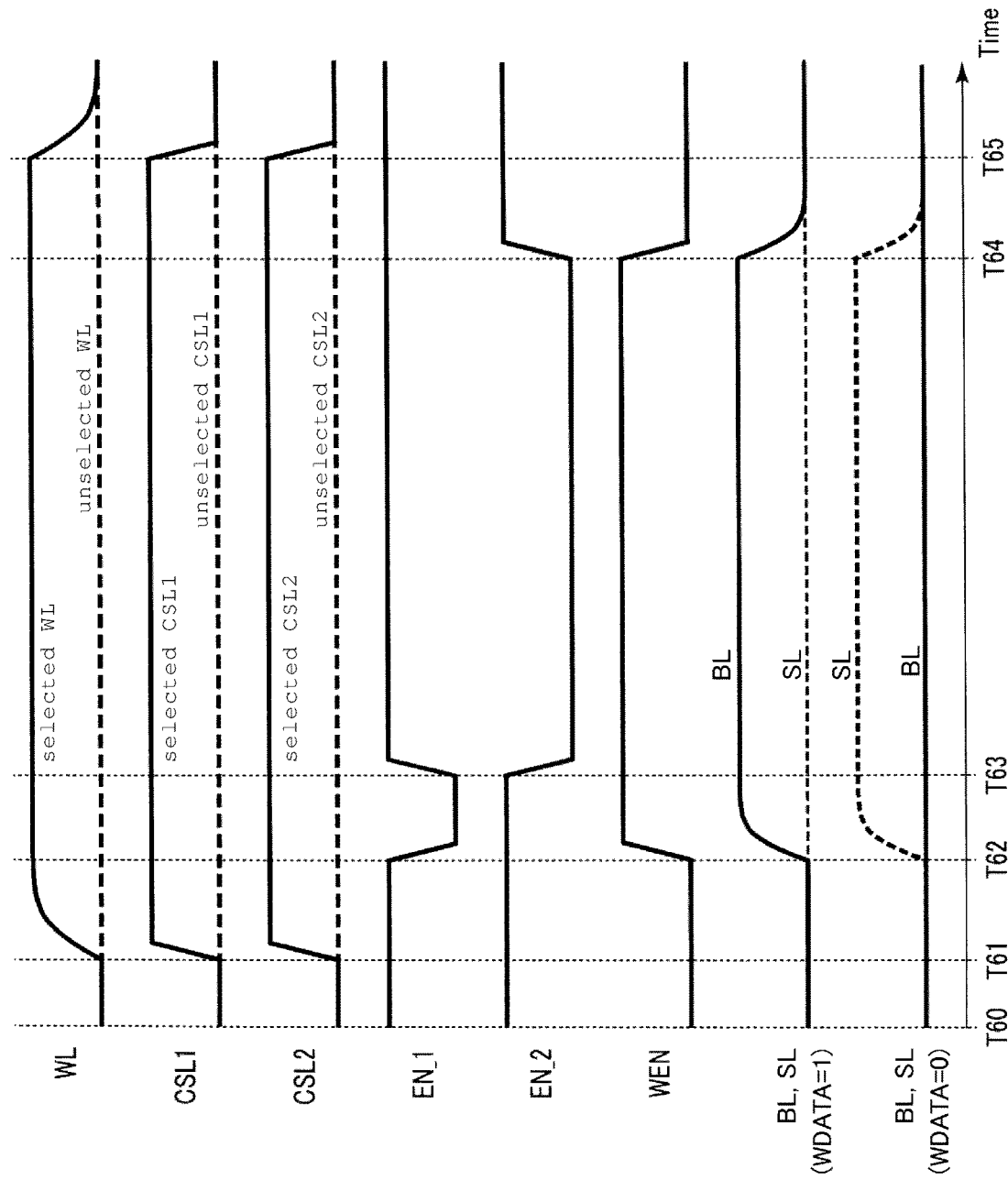
FIG. 38 is a waveform diagram illustrating waveforms in a write operation of the semiconductor memory device according to the modification example of the fourth embodiment.

Here, description will be made on waveforms in at the time of a write operation of the semiconductor memory device according to the modification example of the fourth embodiment using FIG. 38.

[time T60] to [time T61]

The row decoder 14 makes a voltage of the word line WL go to a "L" level. The column decoder 13 makes the voltages of the signals CSL1 and CSL2 go to the "L" level. The controller 16 makes the voltage of the signals WEN and the PCHGOFF (not illustrated) go to the "L" level and makes the signals EN_1 and EN_2 go to the "H" level.

Here, the operation of the write driver 230 will be described using FIG. 37. Description will be made by using a case where voltages of bit lines BL and source lines SL are set as the VSS in a period during which a write operation to a cell and a read operation are not performed.

The NAND operation circuit 25a supplies the signal of "H" level based on the received signals. The NOR operation circuit 25d supplies the signal of "H" level based on the received signals. The NAND operation circuit 25f supplies the signal of "H" level based on the received signals.

With this, the PMOS transistors 25b, 25g, 25m, and 25n and the NMOS transistors 25i and 25j enter the OFF state and the NMOS transistors 25k and 25l enter the ON state. As a result, the global bit line GBL and the global source line GSL are discharged.

[time T61] to [time T62]

The row decoder 14 makes a voltage of the selected word line WL go to a "H" level according to a row address. The column decoder 13 makes the voltages of the selected signal CSL1 and selected signal CSL2 go to the "H" level according to a column address.

[time T62] to [time T63]

The controller 16 makes the voltage of the signal WEN1 go to the "H" level, and makes the signal EN_1 go to the "L" level. At this time point, the signal WDATA is also input.

Here, the operation of the write driver 230 in a case where the signal WDATA is the "H" level (a case of WDATA=1) will be described.

As illustrated in FIG. 37, the NAND operation circuit 25a supplies the signal of "L" level based on the received signals. The NOR operation circuit 25d supplies the signal of "L" level based on the received signals. The NAND operation circuit 25f supplies the signal of "H" level based on the received signals.

With this, the PMOS transistors 25b and 25m and the NMOS transistor 25j enter the ON state. As a result, the voltage Vwrt1 is applied to the global bit line GBL and the global source line GSL is discharged.

With this, the global bit line GBL is charged at a high speed, similarly as in the first embodiment.

Furthermore, the operation of the write driver 230 in a case where the signal WDATA is the "L" level (a case of WDATA=0) will be described.

As illustrated in FIG. 37, the NAND operation circuit 25a supplies the signal of "H" level based on the received signals. The NOR operation circuit 25d supplies the signal of "L" level based on the received signals. The NAND operation circuit 25f supplies the signal of "L" level based on the received signals.

With this, the PMOS transistors 25g and 25m and the NMOS transistor 25i enter the ON state. As a result, the voltage Vwrt1 is applied to the global source line GSL and the global bit line GBL is discharged.

With this, the global source line GSL is charged at a high speed, similarly as in the first embodiment.

[time T62] to [time T63]

The controller 16 makes the signal EN_1 go to the "H" level and makes the signal EN_2 go to the "L" level.

Here, the operation of the write driver 230 in a case where the signal WDATA is the "H" level (a case of WDATA=1) will be described.

As illustrated in FIG. 37, the NAND operation circuit 25a supplies the signal of "L" level based on the received signals. The NOR operation circuit 25d supplies the signal of "L" level based on the received signals. The NAND operation circuit 25f supplies the signal of "H" level based on the received signals.

With this, the PMOS transistors 25b and 25n and the NMOS transistor 25j enter the ON state. As a result, the voltage Vwrt2 is applied to the global bit line GBL and the global source line GSL is discharged.

With this, the voltage of the global bit line GBL is maintained, similarly as in the first embodiment.

Furthermore, the operation of the write driver 230 in a case where the signal WDATA is the "L" level (a case of WDATA=0) will be described.

As illustrated in FIG. 37, the NAND operation circuit 25a supplies the signal of "H" level based on the received signals. The NOR operation circuit 25d supplies the signal of "L" level based on the received signals. The NAND operation circuit 25f supplies the signal of "L" level based on the received signals.

With this, the PMOS transistors 25g and 25n and the NMOS transistor 25i enter the ON state. As a result, the voltage Vwrt2 is applied to the global source line GSL and the global bit line GBL is discharged.

With this, the voltage of the global source line GSL is maintained, similarly as in the first embodiment.

4-4-3 Effect

Figure 39:
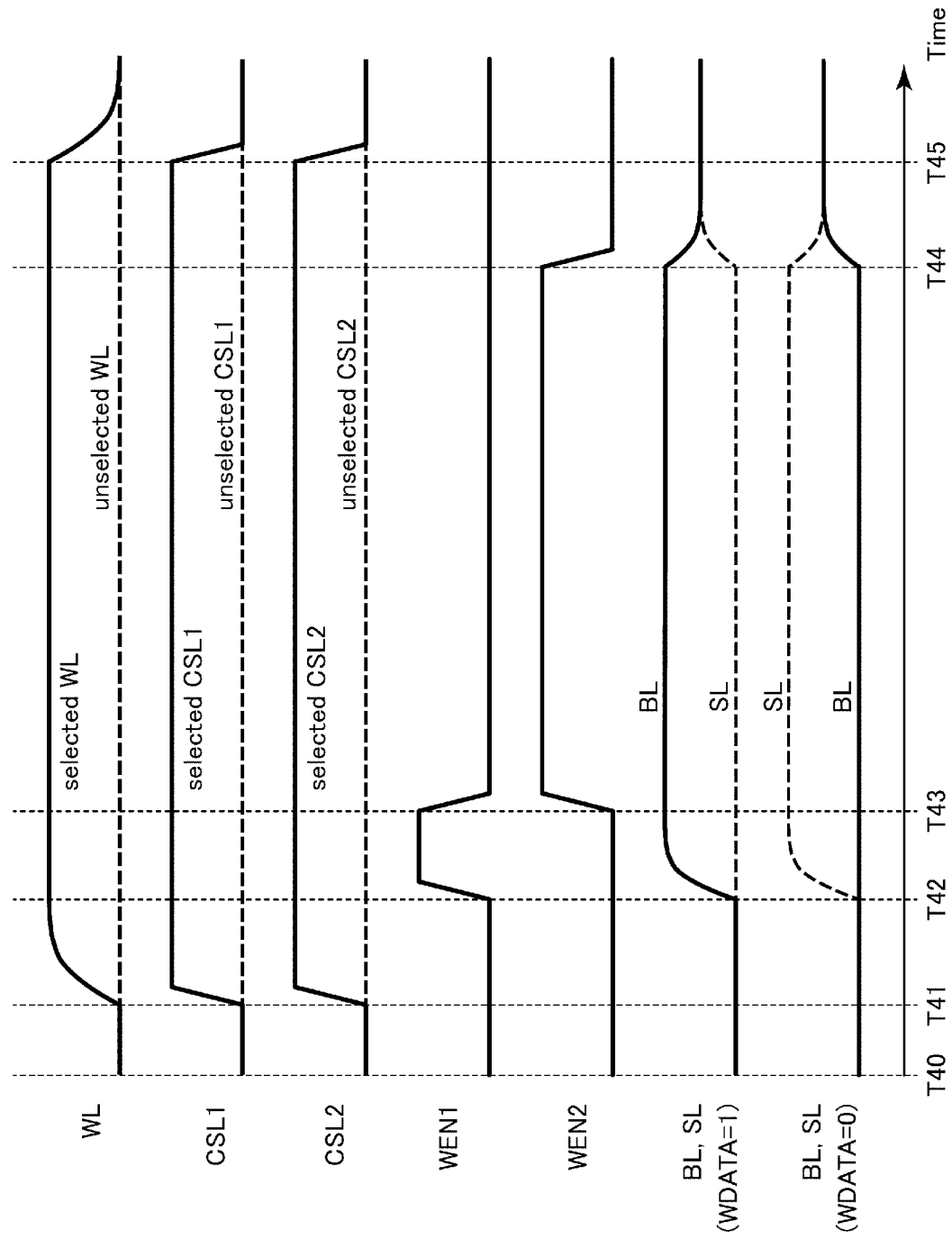
FIG. 39 is a waveform diagram illustrating waveforms in a case where voltages of bit lines BL and source lines SL related to the fourth embodiment are caused to be in a floating state in a period during which a write operation and a read operation are not performed.
Figure 40:
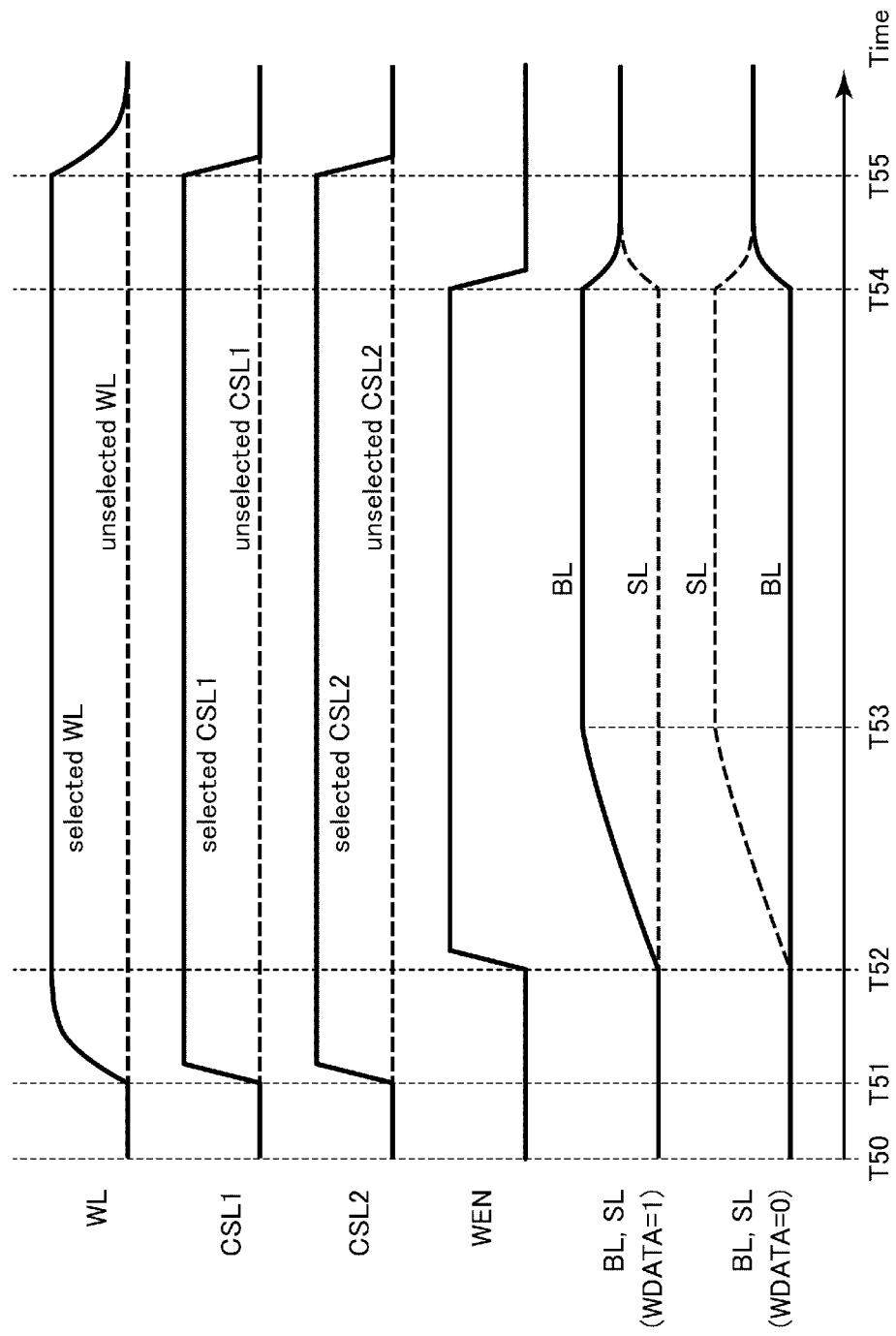
FIG. 40 is another waveform diagram illustrating waveforms in a case where voltages of bit lines BL and source lines SL related to the fourth embodiment are caused to be in a floating state in a period during which a write operation and a read operation are not performed.
Figure 41:
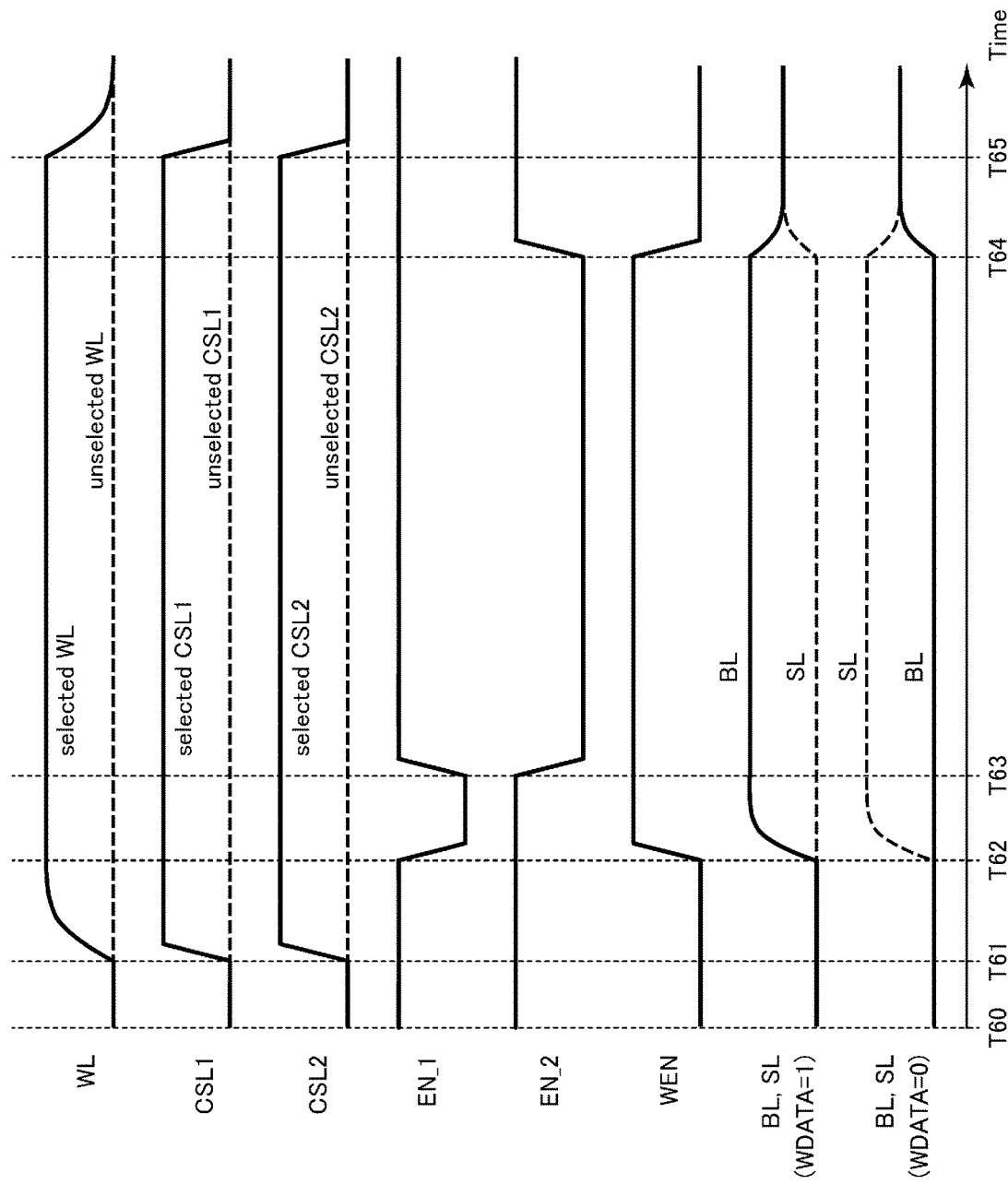
FIG. 41 is another waveform diagram illustrating waveforms in a case where voltages of bit lines BL and source lines SL related to the fourth embodiment are caused to be in a floating state in a period during which a write operation and a read operation are not performed.

As described above, in the write driver illustrated in FIG. 37, the same effect as that of the fourth embodiment can also be obtained. In the embodiment described above, although description is made by using a case where voltages of bit lines BL and source lines SL are set as the VSS in a period during which the write operation and the read operation with respect to the cell are not performed, the same effect can also be obtained in a case where the voltages of bit lines BL and source lines SL are in a floating state. In a case where the voltages of bit lines BL and source lines SL are caused to be in a floating state, for example, the waveform diagrams corresponding to FIG. 34 of the fourth embodiment are represented by FIG. 39. That is, as illustrated in FIG. 39, after time T44, the voltages of the bit line BL and the source line SL of WDATA="1" approach each other and maintain a value of a voltage level, which is between the voltage levels of the bit line BL and the source line SL, between time T43 and time T44. Also, after time T44, the voltages of the bit line BL and the source line SL of WDATA="0" approach each other and maintain a value of a voltage level, which is between the voltage levels of the bit line BL and the source line SL, between time T43 and time T44. Similarly, also in FIG. 36 of the comparative example of the fourth embodiment, in a case where the voltages of bit lines BL and source lines SL are caused to be in a floating state, as illustrated in FIG. 40, after time T54, the voltages of the bit line BL and the source line SL of WDATA="1" approach each other and maintain a value of a voltage level, which is between the voltage levels of the bit line BL and the source line SL, between time T53 and time T54. Also, after time T54, the voltages of the bit line BL and the source line SL of WDATA="0" approach each other and maintain a value of a voltage level, which is between the voltage levels of the bit line BL and the source line SL. Similarly, also in FIG. 38 of the comparative example of the fourth embodiment, in a case where the voltages of bit lines BL and source lines SL are caused to float, as illustrated in FIG. 41, after time T64, the voltages of the bit line BL and the source line SL of WDATA="1" approach each other and maintain a value of a voltage level, which is between the voltage levels of the bit line BL and the source line SL, between time T63 and time 164. Also, after time T64, the voltages of the bit line BL and the source line SL of WDATA="0" approach each other and maintain a value of a voltage level, which is between the voltage levels of the bit line BL and the source line SL, between time T63 and time 164.

5 Others

A term during which connection is made in respective embodiments described above includes a state in which connected elements are indirectly connected by interposing any other element therebetween, for example, a transistor or a resistor.

Here, although the MRAM that stores data using the magnetoresistive effect element (magnetic tunnel junction (MTJ) element) as a resistance change element is described by way of an example, but the exemplary embodiment is not limited thereto.

For example, the exemplary embodiment can be applied to the semiconductor memory device having an element which stores data using resistance change, like a resistance change type memory, for example, ReRAM or PCRAM, which is similar to the MRAM.

The exemplary embodiment can be applied to the semiconductor memory device having an element which stores data by resistance change according to application of a current or a voltage or reading stored data by converting a resistance difference according to resistance change into a current difference or a voltage difference, irrespective of a volatile memory or a non-volatile memory.

In the respective embodiments described above, for convenience, a bit line pair is referred to as the bit line BL and source line SL, but is not limited thereto, and may also be referred to as, for example, the first bit line and second bit line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory array including a plurality of memory cells;
   a word line connected to the plurality of memory cells;
   a plurality of bit lines respectively connected to first ends of each of the memory cells;
   a plurality of source lines respectively connected to second ends of the memory cells;
   a global bit line selectively connectable to each of the bit lines;
   a global source line selectively connectable to each of the source lines;
   a sense circuit connected to the global bit line and configured to determine data stored in the plurality of memory cells;
   a write driver configured to apply voltages to the global bit line and the global source line during a write operation, the write driver including:
      a first transistor having a first end connected to a first power supply voltage and a second end connected to the global bit line,
      a second transistor having a first end connected to a second power supply voltage and a second end connected to the global bit line,
      a third transistor having a first end connected to the first power supply voltage and a second end connected to the global source line, and
      a fourth transistor having a first end connected to the second power supply voltage and a second end connected to the global source line.

2. The semiconductor memory device according to claim 1, wherein,
   in a write operation to write a first data, after a first voltage has been applied to the word line, the first transistor is turned on during a first period to charge the global bit line with the first voltage, and then first transistor is turned off and the second transistor is turned on to control a voltage level of the global bit line during a second period subsequent to the first period, and
   in a write operation to write a second data, a logical value of which is opposite to that of the first data, after the first voltage has been applied to the word line, the third transistor is turned on during a third period to charge the global source line with the first voltage, and then the third transistor is turned off and the fourth transistor is turned on to control a voltage level of the global source line during a fourth period subsequent to the third period.

3. The semiconductor memory device according to claim 1, wherein the second power supply voltage is supplied from a power source with an impedance greater than that of the first power supply voltage.

4. The semiconductor memory device according to claim 1, further comprising:
   a power source pad;
   a metal layer;
   first and second banks each including a memory array, a sense circuit and a write driver, the second bank being farther from the power source pad in a first direction than is the first bank;
   first power supply lines in the metal layer and spaced from each other in a second direction crossing the first direction, the first power supply lines each extending in the first direction across the memory array of the first bank to connect the power source pad to the first bank, the first power supply lines not reaching the second bank;
   second power supply lines in the metal layer and spaced from each other in the second direction, the second power supply lines each extending in the first direction across the first bank to reach the second bank and connect the power source pad to the second bank, the second power supply lines being at positions in the metal layer that are offset in the second direction from positions of the first power supply lines; and
   third power supply lines in the metal layer and spaced from each other in the second direction, the third power supply lines extending in the first direction across the first bank to reach the second bank, the third power supply lines being electrically connected to the second power supply lines and the second bank, positions of the third power supply lines being offset in the second direction from the positions of the second power supply lines, the third power supply lines being respectively aligned with the positions of the first power supply lines in the second direction, wherein
   the first power supply voltage is supplied to the write driver in the first bank from the power source pad via one of the first power supply lines, and supplied to the write driver in the second bank from the power source pad via one of the second power supply lines and one of the third power supply lines.

5. The semiconductor memory device according to claim 4, wherein the total number of the first power supply lines in the metal layer is less than a summed total of the number of the second power supply lines in the metal layer and the number of third power supply lines in the metal layer.

6. The semiconductor memory device according to claim 4, wherein
the first power supply lines are above the first bank in a third direction orthogonal to a plane of the metal layer,
the second power supply lines are above the first bank and the second bank in the third direction, and
the third power supply lines are above the second bank in the third direction but not above the first bank.

7. The semiconductor memory device according to claim 4, further comprising:
a first power supply circuit between the power source pad and the first power supply lines; and
a second power supply circuit between the power source pad and the second power supply lines.

8. The semiconductor memory device according to claim 4, further comprising:
a plurality of first power supply circuits, each of which is between the power source pad and a respective one of the first power supply lines; and
a plurality of second power supply circuits, each of which is between the power source pad and a respective one of the second power supply lines.

9. The semiconductor memory device according to claim 1, further comprising:
a first power source pad;
a second power source pad;
a metal layer including first power supply lines, second power supply lines, and third power supply lines;
first and second banks each including a memory array, a sense circuit and a write driver, the second bank being farther from the first and second power source pads in a first direction than is the first bank, wherein
the metal layer is above first and second banks in a second direction orthogonal to a plane of the metal layer,
the first power supply lines are connected to the first power source pad and supply power to the first bank but not to the second bank,
the second power supply lines are connected to the second power source pad, pass above the first bank and the second bank, and supply power to the second bank but not to the first bank, and
the third power supply lines are above the second bank but not the first bank and are electrically connected to the second power source pad by the second power supply lines, and supply power to the second bank but not the first bank,
the first power supply voltage is supplied to the write driver in the first bank from the first power source pad via one of the first power supply lines and supplied to the write driver in the second bank from the second power source pad via one of the second power supply lines and one of the third power supply lines.

10. The semiconductor memory device according to claim 9, wherein the total number of the first power supply lines in the metal layer is less than a summed total of the number of second power supply lines in the metal layer and the number of third power supply lines in the metal layer.

11. The semiconductor memory device according to claim 9, wherein
the first power supply lines are above the first bank in the second direction but not the second bank, and
the second power supply lines are above both the first and second banks in the second direction.

12. The semiconductor memory device according to claim 9, wherein
the first bank is between the first power source pad and the second bank along the first direction, and
the first, second, and third power supply lines extend in the first direction.

13. The semiconductor memory device according to claim 9, further comprising:
a first power supply circuit between the first power source pad and the first power supply lines; and
a second power supply circuit between the second power source pad and the second power supply lines.

14. The semiconductor memory device according to claim 9, further comprising:
a plurality of first power supply circuits, each of which is between the first power source pad and a respective one of the first power supply lines; and
a plurality of second power supply circuits, each of which is between the second power source pad and a respective one of the second power supply lines.

15. The semiconductor memory device according to claim 1, further comprising:
a power source pad;
first and second banks each including a memory array, a sense circuit, and a write driver, the first and second banks arranged along a first direction, the second bank being farther from the power source pad in the first direction than is the first bank;
a first metal layer above the first and second banks;
a first power supply line in the first metal layer above the first bank and electrically connecting the power source pad and the first bank;
a second power supply line in the first metal layer above the first and second banks, a first portion of the second power supply line above the first bank being parallel to the first power supply line, the second power supply line electrically connecting the power source pad and the second bank; and
a third power supply line in the first metal layer above the second bank, a second portion of the second power supply line above the second bank being parallel to the third power supply line, the third power supply line electrically connecting the power source pad and the second bank via the second power supply line, wherein
the first power supply voltage is supplied to the write driver in the first bank from the power source pad via the first power supply line and supplied to the write driver in the second bank from the power source pad via the second power supply line and the third power supply line.

16. The semiconductor memory device according to claim 15, wherein the total number of the first power supply lines in the first metal layer is less than a summed total of the number of second power supply lines in the first metal layer and the number of third power supply lines in the first metal layer.

17. The semiconductor memory device according to claim 15, wherein the first bank is between the power source pad and the second bank in the first direction.

18. The semiconductor memory device according to claim 15, further comprising:
a first power supply circuit between the power source pad and the first power supply line; and
a second power supply circuit between the power source pad and the second power supply line.

19. The semiconductor memory device according to claim 15, wherein
the first power supply line extends in a second direction that is perpendicular to the first direction and are connected to the first bank via fourth power supply lines that extend in the first direction in a second metal layer, the second power supply line extends in the second direction and are connected to the second bank by fifth power supply lines that extend in the first direction in the second metal layer, and the third power supply line is connected to the second bank via the fifth power supply lines.

20. The semiconductor memory device according to claim 19, wherein second metal layer is above the first metal layer.

* * * * *